US009291754B2

(12) United States Patent
Masuyama et al.

(10) Patent No.: US 9,291,754 B2
(45) Date of Patent: Mar. 22, 2016

(54) METHOD FOR PRODUCING MOLD FOR MINUTE PATTERN TRANSFER, METHOD FOR PRODUCING DIFFRACTION GRATING USING THE SAME, AND METHOD FOR PRODUCING ORGANIC EL ELEMENT INCLUDING THE DIFFRACTION GRATING

(71) Applicants: JX NIPPON OIL & ENERGY CORPORATION, Tokyo (JP); TOKYO INSTITUTE OF TECHNOLOGY, Tokyo (JP)

(72) Inventors: Satoshi Masuyama, Yokohama (JP); Madoka Takahashi, Tokyo (JP); Suzushi Nishimura, Yokohama (JP); Maki Fukuda, Yokohama (JP); Takashi Seki, Yokohama (JP)

(73) Assignees: JX NIPPON OIL & ENERGY CORPORATION, Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 142 days.

(21) Appl. No.: 13/938,597

(22) Filed: Jul. 10, 2013

(65) Prior Publication Data
US 2013/0299796 A1    Nov. 14, 2013

Related U.S. Application Data

(63) Continuation of application No. PCT/JP2012/050564, filed on Jan. 13, 2012.

(30) Foreign Application Priority Data

Jan. 14, 2011    (JP) .................................. 2011-006487

(51) Int. Cl.
*G02B 5/18*    (2006.01)
*B29C 33/38*    (2006.01)
(Continued)

(52) U.S. Cl.
CPC .......... *G02B 5/1852* (2013.01); *B29C 33/3857* (2013.01); *B29C 33/424* (2013.01);
(Continued)

(58) Field of Classification Search
CPC . H01L 51/0545; H01L 51/0036; B82Y 10/00
See application file for complete search history.

(56) References Cited

U.S. PATENT DOCUMENTS

2007/0065683 A1    3/2007    Sonoda et al.
2009/0233236 A1*   9/2009    Black et al. ................... 430/311
(Continued)

FOREIGN PATENT DOCUMENTS

CN    101205054 A    6/2008
EP    2 455 786 A1   5/2012
(Continued)

OTHER PUBLICATIONS

Office Action issued in Japanese Patent Application No. 2012-552766 mailed on Jul. 1, 2014 (with translation).
(Continued)

*Primary Examiner* — Mohammad Islam
*Assistant Examiner* — Charles R Peters
(74) *Attorney, Agent, or Firm* — Oliff PLC

(57) ABSTRACT

A method for producing a mold includes: applying a block copolymer solution made of first and second polymers on a base member; performing a first annealing process at a temperature higher than Tg of the block copolymer after drying the coating film; forming a concavity and convexity structure on the base member by removing the second polymer by an etching process; performing a second annealing process of the concavity and convexity structure at a temperature higher than Tg of the first polymer; forming a seed layer on the structure; laminating or stacking a metal layer on the seed layer by an electroforming; and peeling off the metal layer from the base member. The second annealing process enables satisfactory transfer of a concavity and convexity structure on the base member onto the metal layer.

17 Claims, 33 Drawing Sheets

(51) Int. Cl.
- *B29C 33/42* (2006.01)
- *B82Y 30/00* (2011.01)
- *B82Y 40/00* (2011.01)
- *C25D 1/10* (2006.01)
- *H01L 51/56* (2006.01)
- *B81C 1/00* (2006.01)
- *B82Y 20/00* (2011.01)
- *G03F 7/00* (2006.01)
- *B82Y 10/00* (2011.01)
- *H01L 51/52* (2006.01)

(52) U.S. Cl.
CPC ............ *B81C1/00031* (2013.01); *B82Y 10/00* (2013.01); *B82Y 20/00* (2013.01); *B82Y 30/00* (2013.01); *B82Y 40/00* (2013.01); *C25D 1/10* (2013.01); *G02B 5/1809* (2013.01); *G02B 5/1847* (2013.01); *G03F 7/0002* (2013.01); *H01L 51/52* (2013.01); *H01L 51/56* (2013.01); *B81C 2201/0149* (2013.01); *H01L 51/5275* (2013.01)

(56) References Cited

U.S. PATENT DOCUMENTS

2010/0236620 A1* 9/2010 Nakanishi et al. ............ 136/256
2012/0132897 A1* 5/2012 Seki et al. ........................ 257/40

FOREIGN PATENT DOCUMENTS

| JP | A-2001-250692 | 9/2001 | |
| JP | A-2003-157976 | 5/2003 | |
| JP | A-2007-087463 | 4/2007 | |
| JP | A-2009-129501 | 6/2009 | |
| JP | A-2009-260330 | 11/2009 | |
| JP | A-2010-17865 | 1/2010 | |
| JP | A-2010-52288 | 3/2010 | |
| WO | WO/2011/007878 * | 1/2011 | ............ 257/40 |
| WO | WO 2011/007878 A1 | 1/2011 | |

OTHER PUBLICATIONS

International Search Report issued in International Patent Application No. PCT/JP2012/050564 dated Mar. 27, 2012.

Jan. 28, 2015 Office Action issued in Canadian Application No. 2,824,148.

Dec. 24, 2014 Office Action issued in Japanese Application No. 2012-552766.

Office Action issued in Korean Patent Application No. 10-2013-7019967 dated Jun. 26, 2014 (with translation).

May 12, 2015 Search Report issued in European Application No. 12733862.2.

* cited by examiner

METHOD FOR PRODUCING MOLD FOR MINUTE PATTERN TRANSFER, METHOD FOR PRODUCING DIFFRACTION GRATING USING THE SAME, AND METHOD FOR PRODUCING ORGANIC EL ELEMENT INCLUDING THE DIFFRACTION GRATING

CROSS REFERENCE TO RELATED APPLICATION

This application is a continuation application of International Patent Application No. PCT/JP2012/050564 filed on Jan. 13, 2012 claiming the benefit of priority of Japanese Patent Application No. 2011-6487 filed on Jan. 14, 2011. The contents of International Patent Application No. PCT/JP2012/050564 and Japanese Patent Application No. 2011-6487 are incorporated herein by reference in their entities.

BACKGROUND OF THE INVENTION

1. Field of the Invention

The present invention relates to a method for producing a mold for minute or fine pattern transfer used for nanoimprint and the like, a method for producing a diffraction grating using the same, and a method for producing an organic EL element an organic EL element (Organic Electro-Luminescence element or organic light emitting diode) including the diffraction grating as well as the mold for the minute pattern transfer, the diffraction grating, and the organic EL element, those of which are obtained by using the methods described above.

2. Description of the Related Art

There has been known a lithography method as a method for forming a minute pattern such as a semiconductor integrated circuit. The resolution of the pattern formed by the lithography method is dependent on the wavelength of a light source and/or the numerical aperture of an optical system, and a light source having shorter wavelength is expected in order to meet demand for miniaturized devices in recent years. However, the light source having the short wavelength is expensive, development thereof is not easy, and development of an optical material transmitting such a short-wavelength light is also needed. Further, manufacture of a large-area pattern by a conventional lithography method requires a large-size optical element, thereby having difficulties in technical and economic aspects. Thus, a novel method for forming a desired pattern having a large area has been considered.

There has been known a nanoimprint method as the method for forming the minute pattern without using a conventional lithography apparatus. The nanoimprint method is a technique such that a pattern of an order of nanometer can be transferred by sandwiching resin between a mold and a substrate. The nanoimprint method basically includes four steps of: i) application of a resin layer; ii) press of the mold; iii) pattern transfer; and iv) mold-releasing. The nanoimprint method is excellent in that processing on a nanoscale can be realized by the simple process as described above. Further, an apparatus used in the nanoimprint method is simple or easy, is capable of performing a large-area processing, and promises a high throughput. Thus, the nanoimprint method is expected to come into practical use in many fields such as a storage medium, an optical member, and a biochip, in addition to a semiconductor device.

However, even in the nanoimprint method, a mold for transferring a pattern having a line width of tens of nanometers basically requires that the pattern of a resist (resist pattern) on a silicon substrate is exposed and then is developed with using the lithography apparatus. A current seed layer made of metal is formed on the resist pattern to perform electroforming of the mold with using the obtained resist pattern. However, in a case that definition of the pattern is not more than 100 nm, coatability or coverage of the current seed layer formed on the resist pattern by a sputtering is decreased, and the film thickness of the current seed layer obtained varies among the upper portion, the sidewall, and the bottom portion (substrate exposed portion in a concave portion of the pattern, that is a trench) of the resist pattern. Especially, a problem arises such that formation of the current seed layer preferentially proceeds at the upper portion of the resist pattern to cause a narrowing of a trench opening. Thus, in a case that a hole or trench and a ridge are formed on the substrate by using a resist layer, there is a problem such that metal is less likely to be deposited on the bottom portion of the hole or trench during the formation of the current seed layer; and overhang is caused at the upper portion of the ridge of the resist layer. In a case that the electroforming process of a stacked body is performed by using such a current seed layer, an electroformed layer is joined to the upper part of the hole or trench due to the overhang and a void is left inside the trench. As a result, the mold obtained by the electroforming has a problem such that the mold has low mechanical strength and therefore defects such as deformation of the mold and pattern defect are caused.

In order to solve the problem(s) as described above, Japanese Patent Application Laid-open No. 2010-017865 discloses a method for manufacturing a mold for nanoimprint including the steps of: forming a resist layer which includes a concavity and convexity pattern on a substrate having a conductive surface and then exposing the conductive surface at a concave portion of the concavity and convexity pattern of the resist layer; performing electroforming on the conductive surface exposed at the concave portion of the concavity and convexity pattern of the resist layer and then forming an electroformed layer having a film thickness greater than that of the resist layer; and removing the substrate having the conductive surface and the resist layer. According to this method, it is possible to grow the electroformed layer in one direction, that is, in an upward direction from the conductive surface of the bottom portion of the resist pattern, without using the current seed layer, and thus it is considered that no void exists inside the mold for nanoimprint. However, even this method has still been forced to depend on the lithography method to make the mold used for the nanoimprint method.

The inventors of the present invention disclose, in International Application No. PCT/JP2010/62110, a method for obtaining a mold having a minute and irregular concavity and convexity pattern formed therein by applying a block copolymer solution including a block copolymer and a solvent, satisfying a predetermined condition, onto a base member; and performing drying to form a micro phase separation structure of the block copolymer. According to this method, it is possible to obtain the mold used for the nanoimprint and the like by using a self-organizing phenomenon of the block copolymer without using the lithography method. A mixture of a silicone-based polymer and a curing agent is dripped onto the obtained mold and then cured to obtain the transferred pattern. Then, a glass substrate to which a curable resin has been applied is pressed against the transferred pattern and the curable resin is cured by irradiation with ultraviolet rays. In this way, a diffraction grating in which a transferred pattern is duplicated is manufactured. It has been confirmed that an organic EL element obtained by stacking a transparent electrode, an organic layer, and a metal electrode on the diffraction grating has sufficiently high light emission efficiency, sufficiently high level of external extraction efficiency, sufficiently low wavelength-dependence of light emission, sufficiently low directivity of light emission, and sufficiently high power efficiency.

It is desired to take the method for producing the diffraction grating achieved in International Application No. PCT/JP2010/62110 by the inventor(s) of the present invention one step further, so as to improve the method to be suitable for mass production of a product including the organic EL element and the like.

In view of the above, an object of the present invention is to provide a method for producing a mold for minute pattern transfer, which is suitable for production of an optical component such as a diffraction grating used for general products including an organic EL element and the like, a method for producing a diffraction grating using the obtained mold, and a method for producing an organic EL element using such diffraction grating. Another object of the present invention is to provide the mold for the minute pattern transfer, the diffraction grating, and the organic EL element, using the producing methods as described above.

SUMMARY OF THE INVENTION

According to the present invention, there is provided a method for producing a mold for minute or fine pattern transfer, including: a step of applying a block copolymer solution made of at least a first polymer (segment) and a second polymer (segment) on a surface of a base member; a step of drying a coating film on the base member; a first heating step for heating the coating film after the drying at a temperature higher than a glass transition temperature of a block copolymer of the block copolymer solution; an etching step for etching the coating film after the first heating step to remove the second polymer so that a concavity and convexity structure is formed on the base member; a second heating step for heating the concavity and convexity structure at a temperature higher than a glass transition temperature of the first polymer (segment); a step of forming a seed layer on the concavity and convexity structure after the second heating step; a step of laminating or stacking a metal layer on the seed layer by an electroforming; and a step of peeling off the base member having the concavity and convexity structure from the metal layer and the seed layer.

In the method for producing the mold according to the present invention, a micro phase separation structure of the block copolymer may be generated during the drying step or the first heating step, and the micro phase separation structure preferably has a lamellar form.

In the method for producing the mold according to the present invention, the concavity and convexity structure may be heated, for 10 minutes to 100 hours, at a temperature ranging from the glass transition temperature of the first polymer to a temperature higher than the glass transition temperature of the first polymer by 70 degrees Celsius during the second heating step. Further, the concavity and convexity structure can be deformed to have a chevron-shaped structure during the second heating step.

In the method for producing the mold according to the present invention, a number average molecular weight (Mn) of the block copolymer is preferably 500,000 or more and a molecular weight distribution (Mw/Mn) of the block copolymer is preferably 1.5 or less. Further, a volume ratio between the first polymer and the second polymer in the block copolymer is preferably 3:7 to 7:3 and a difference between solubility parameters of the first and second polymers is preferably 0.1 to 10 $(cal/cm^3)^{1/2}$ for forming the micro phase separation structure.

In the method for producing the mold according to the present invention, the first polymer forming the block copolymer is preferably polystyrene and the second polymer forming the block copolymer is preferably polymethyl methacrylate. In the block copolymer solution, polyalkylene oxide may be contained as a different homopolymer.

In the method for producing the mold according to the present invention, the seed layer may be formed by one of a non-electrolytic plating method, a sputtering method, and a vapor deposition method. Further, the method for producing the mold according to the present invention may include cleaning the mold obtained by peeling off the base member having the concavity and convexity structure from the metal layer and the seed layer; and performing a mold-release treatment on a surface of the mold.

According to the second aspect of the present invention, there are provided a method for producing a diffraction grating, including: pressing the mold obtained by the method for producing the mold to a transparent substrate to which a curable resin has been applied; curing the curable resin; and detaching the mold from the transparent substrate to obtain a structure having a concavity and convexity structure on the transparent substrate.

In the method for producing a diffraction grating according to the present invention, the structure may be the diffraction grating.

Further, the method for producing a diffraction grating according to the present invention may include: pressing the structure to a substrate to which a sol-gel material has been applied; curing the sol-gel material; and detaching the structure from the substrate to obtain the diffraction grating having a concavity and convexity structure made of the sol-gel material.

According to the third aspect of the present invention, there is provided a method for producing an organic EL element, wherein a transparent electrode, an organic layer, and a metal electrode are stacked in this order on the concavity and convexity structure of the diffraction grating produced by the method for producing the diffraction grating, thereby producing the organic EL element.

According to the fourth aspect of the present invention, there is provided the mold for minute pattern transfer produced by the producing method as defined in the first aspect.

According to the fifth aspect of the present invention, there is provided the diffraction grating produced by the producing method as defined in the second aspect. A cross-section shape of the concavity and convexity structure of the surface of the diffraction grating preferably has a chevron shape. Further, in a case that a Fourier-transformed image is obtained by performing a two-dimensional fast Fourier-transform processing on an concavity and convexity analysis image obtained by an analyzing a planar shape of the concavity and convexity structure with an atomic force microscope, it is preferable that the Fourier-transformed image shows an annular pattern substantially centered at an origin at which an absolute value of wavenumber is 0 $\mu m^{-1}$ and that the annular or circular pattern is present within a region where the absolute value of wavenumber is 10 $\mu m^{-1}$, especially within a range of from 1.25 to 5 $\mu m^{-1}$. A kurtosis of the cross-section shape of the concavity and convexity structure of the diffraction grating is preferably −1.2 or more, especially preferably −1.2 to 1.2. An average pitch of the cross-section of the concavity and convexity structure of the diffraction grating is preferably 10 to 600 nm.

According to the sixth aspect of the present invention, there is provided an organic EL element produced by the producing method as defined in the third aspect.

According to a method for producing a mold of the present invention, by performing a second heating process to a block copolymer after an etching, a cross-section of a concavity and convexity structure of the block copolymer has a smooth chevron shape. Accordingly, the concavity and convexity structure of the block copolymer can be completely covered with a seed layer having a uniform film thickness and it is possible to manufacture an electroformed mold having high mechanical strength without causing a pattern defect or the like. With respect to surface texture of a metal layer of the obtained mold, since concavities and convexities are distributed substantially uniformly, residue of resin on the side of the mold is suppressed when the block copolymer and a base member are peeled off from the mold, and thus contamination of the mold is reduced and peeling property of the mold is improved. Accordingly, it is possible to obtain the mold having the high mechanical strength without causing the pattern defect. Cleaning of the mold is also performed easily. Even when the molecular weight of the block copolymer is increased, it is possible to reliably form the mold having a desired concavity and convexity pattern. By performing the second heating step after the etching, it is possible to remove impurities including, for example, a solvent remained in the step before the second heating step such as the etching. By using a method for producing a diffraction grating according to the present invention, it is possible to produce, with relative ease, the diffraction grating which diffracts light in a visible region with low directivity and without wavelength-dependence.

DESCRIPTION OF THE PREFERRED EMBODIMENTS

Hereinbelow, preferred embodiments of the present invention will be described in detail with reference to the drawings.

Figure 2A:
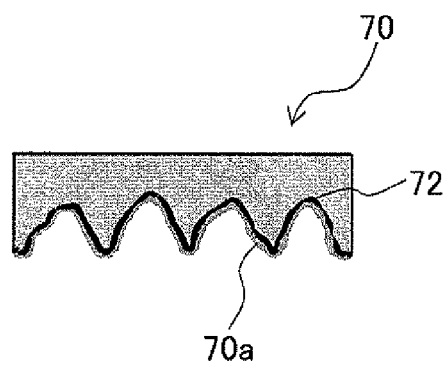
FIGS. 2A-2E are schematic illustration showing each step for producing a diffraction grating using the mold obtained by the method for producing the mold of the present invention.
Figure 2D:
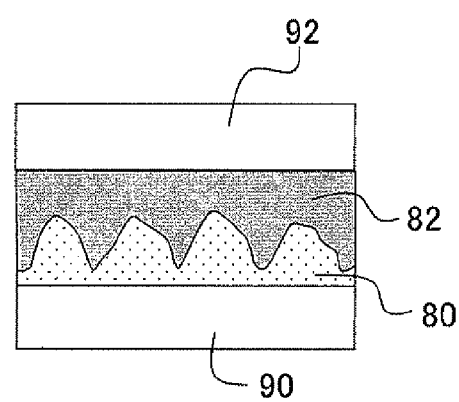
Figure 2B:
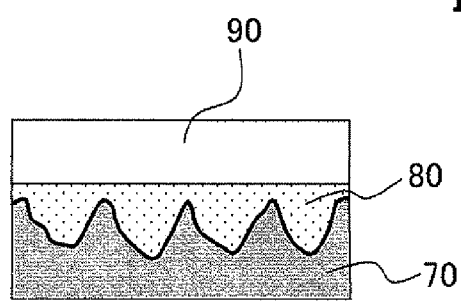
Figure 2E:
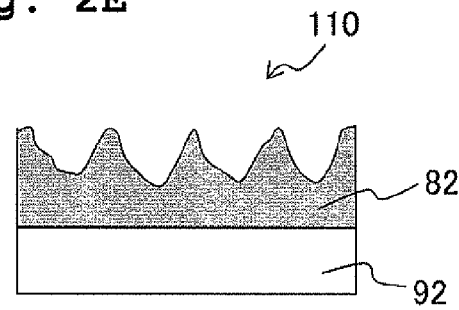
Figure 2C:
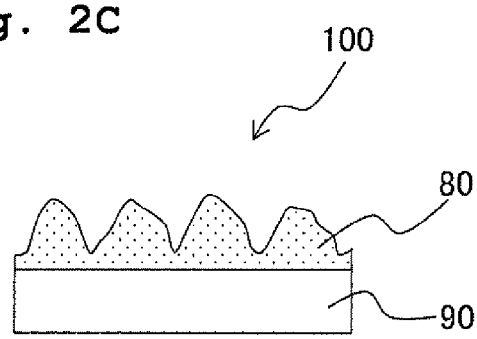
Figure 3:
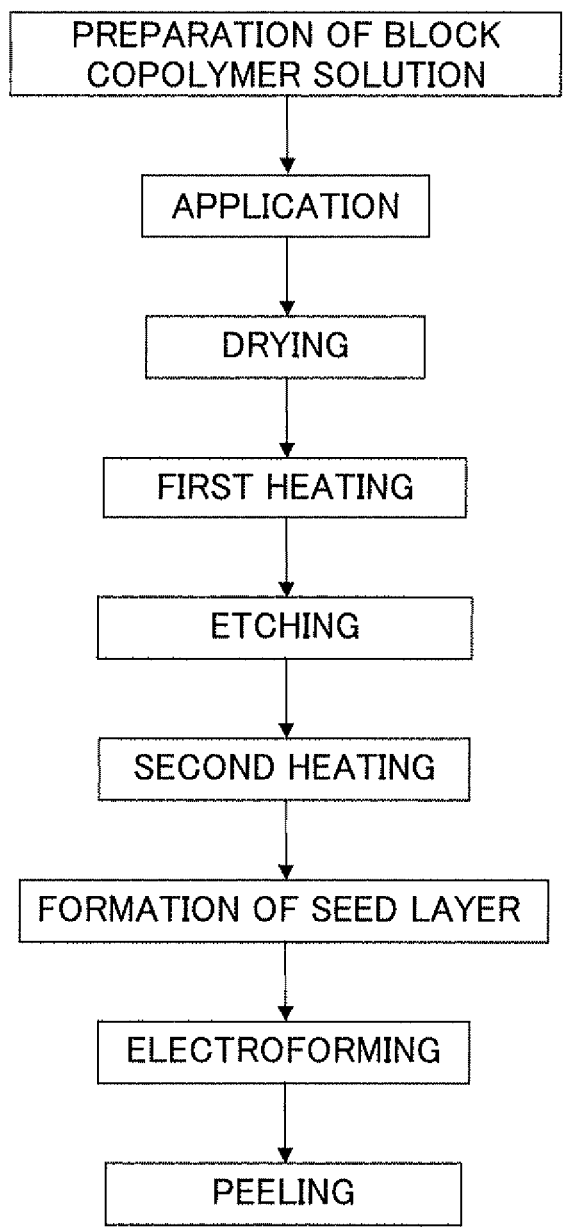
FIG. 3 is a flowchart showing each step for the method for producing the mold of the present invention.

At first, an explanation will be made about a method for producing a mold suitable for producing a diffraction grating used for an organic EL element and the like. As shown in the flowchart of FIG. 3, the method for producing the mold mainly includes a step (processing) of preparing a block copolymer solution, a step for applying the block copolymer solution, a drying step, a first heating step, an etching step, a second heating step, a seed layer forming step, an electroforming step, and a releasing or peeling step. Hereinafter, an explanation will be made about each step and each subsequent step of the method for producing the mold with reference to schematic illustrations of FIGS. 1 and 2 as appropriate.

<Preparation Step of Block Copolymer Solution>

The block copolymer used for the present invention includes at least a first polymer segment made of a first homopolymer and a second polymer segment made of a second homopolymer different from the first homopolymer. The second homopolymer desirably has a solubility parameter which is higher than a solubility parameter of the first homopolymer by 0.1 to 10 $(cal/cm^3)^{1/2}$. In a case that the difference between the solubility parameters of the first and second homopolymers is less than 0.1 $(cal/cm^3)^{1/2}$, it is difficult to form a regular micro phase separation structure of the block copolymer. In a case that the difference exceeds 10 $(cal/cm^3)^{1/2}$, it is difficult to prepare a uniform solution of the block copolymer.

Examples of monomers serving as raw materials of homopolymers usable as the first homopolymer and second homopolymer include styrene, methylstyrene, propylstyrene, butylstyrene, hexylstyrene, octylstyrene, methoxystyrene, ethylene, propylene, butene, hexene, acrylonitrile, acrylamide, methyl methacrylate, ethyl methacrylate, propyl methacrylate, butyl methacrylate, hexyl methacrylate, octyl methacrylate, methyl acrylate, ethyl acrylate, propyl acrylate, butyl acrylate, hexyl acrylate, octyl acrylate, methacrylic acid, acrylic acid, hydroxyethyl methacrylate, hydroxyethyl acrylate, ethylene oxide, propylene oxide, dimethylsiloxane, lactic acid, vinylpyridine, hydroxystyrene, styrenesulfonate, isoprene, butadiene, ε-caprolactone, isopropylacrylamide, vinyl chloride, ethylene terephthalate, tetrafluoroethylene, and vinyl alcohol. Of these monomers, styrene, methyl methacrylate, ethylene oxide, butadiene, isoprene, vinylpyridine, and lactic acid are preferably used from the viewpoints that the formation of phase separation easily occurs, and that the concavities and convexities are easily formed by an etching.

In addition, examples of a combination of the first homopolymer and the second homopolymer include combinations of two selected from the group consisting of a styrene-based polymer (more preferably polystyrene), polyalkyl methacrylate (more preferably polymethyl methacrylate), polyethylene oxide, polybutadiene, polyisoprene, polyvinylpyridine, and polylactic acid. Of these combinations, a combination of the styrene-based polymer and polyalkyl methacrylate, a combination of the styrene-based polymer and polyethylene oxide, a combination of the styrene-based polymer and polyisoprene, a combination of the styrene-based polymer and polybutadiene are more preferable, and the combination of the styrene-based polymer and polymethyl methacrylate, the combination of the styrene-based polymer and polyisoprene, the combination of the styrene-based polymer and polybutadiene are particularly preferable, from the viewpoint that the depths of the concavities and convexities formed in the block copolymer can be further increased by preferentially removing one of the homopolymers by the etching process. A combination of polystyrene (PS) and polymethyl methacrylate (PMMA) is further preferable.

The number average molecular weight (Mn) of the block copolymer is preferably 500,000 or more, and is more preferably 1,000,000 or more, and particularly preferably 1,000,000 to 5,000,000. In a case that the number average molecular weight is less than 500,000, the average pitch of the concavities and convexities formed by the micro phase separation structure of the block copolymer is so small that the average pitch of the concavities and convexities of the obtained diffraction grating becomes insufficient. Especially, in a case of the diffraction grating used for the organic EL element, since the diffraction grating needs to diffract illumination light over a range of wavelength of a visible region, the average pitch is desirably 100 to 600 nm, and thus the number average molecular weight (Mn) of the block copolymer is preferably 500,000 or more. Further, according to experiments conducted by the inventors of the present invention, it has been appreciated that, in a case that the number average molecular weight (Mn) of the block copolymer is 500,000 or more, a desired concavity and convexity pattern can not be obtained by an electroforming, unless the second heating step is performed after the etching step, as it will be described later.

The molecular weight distribution (Mw/Mn) of the block copolymer is preferably 1.5 or less, and is more preferably 1.0 to 1.35. In a case that the molecular weight distribution exceeds 1.5, it is difficult to form the regular micro phase separation structure of the block copolymer.

Note that the number average molecular weight (Mn) and the weight average molecular weight (Mw) of the block copolymer are values measured by gel permeation chromatography (GPC) and converted to molecular weights of standard polystyrene.

In the block copolymer, a volume ratio between the first polymer segment and the second polymer segment (the first polymer segment: the second polymer segment) is desirably 3:7 to 7:3 in order to create a lamellar structure by self-organization or assembly, and is more preferably 4:6 to 6:4. In a case that the volume ratio is out of the above-described range, a concavity and convexity pattern owing to the lamellar structure is difficult to form.

The block copolymer solution used in the present invention is prepared by dissolving the block copolymer in a solvent. Examples of the solvent include aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycol ethers such as ethylene glycol dimethyl ether, diethylene glycol dimethyl ether, triglyme, propylene glycol monomethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; and mixture solvents thereof. A percentage content of the block copolymer in the block copolymer solution is preferably 0.1 to 15% by mass, and more preferably 03 to 5% by mass, relative to 100% by mass of the block copolymer solution.

In addition, the block copolymer solution may further include a different homopolymer (a homopolymer other than the first homopolymer and the second homopolymer in the block copolymer contained in the solution: for example, when the combination of the first homopolymer and the second homopolymer in the block copolymer is the combination of polystyrene and polymethyl methacrylate, the different homopolymer may be any kind of homopolymer other than polystyrene and polymethyl methacrylate), a surfactant, an ionic compound, an anti-foaming agent, a leveling agent, and the like.

By containing the different homopolymer, the micro phase separation structure of the block copolymer can be improved. For example, polyalkylene oxide can be used to increase the depths of the concavities and convexities formed by the micro phase separation structure. As the polyalkylene oxide, polyethylene oxide or polypropylene oxide is more preferable, and polyethylene oxide is particularly preferable. In addition, as the polyethylene oxide, one represented by the following formula is preferable:

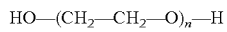

$$HO-(CH_2-CH_2-O)_n-H$$

[in the formula, n represents an integer of 10 to 5000 (more preferably an integer of 50 to 1000, and further preferably an integer of 50 to 500)]. In a case that the value of n is less than the lower limit, the molecular weight is so low that the effect obtained by containing the different homopolymer becomes insufficient, because the polyethylene oxide is lost due to volatilization, vaporization, or the like during a heating process at a high-temperature. In a ease that the value exceeds the upper limit, the molecular weight is so high that the molecular mobility is low. Hence, the speed of the phase separation is lowered, and the formation of the micro phase separation structure is adversely affected.

In addition, the number average molecular weight (Mn) of the different homopolymer is preferably 460 to 220,000, and is more preferably 2,200 to 46,000. In a case that the number average molecular weight is less than the lower limit, the molecular weight is so low that the effect obtained by containing the different homopolymer becomes insufficient, because the different homopolymer is lost due to volatilization, vaporization, or the like during the heating process at the high-temperature. In a case that the number average molecular weight exceeds the upper limit, the molecular weight is so high that the molecular mobility is low. Hence, the speed of the phase separation is lowered, and the formation of the micro phase separation structure is adversely affected.

The molecular weight distribution (Mw/Mn) of the different homopolymer is preferably 1.5 or less, and more preferably 1.0 to 1.3. In a case that the molecular weight distribution exceeds the upper limit, uniformity of the shape of the micro phase separation is less likely to be maintained. Note that the number average molecular weight (Mn) and the weight average molecular weight (Mw) are values measured by gel permeation chromatography (GPC) and converted to molecular weights of standard polystyrene.

In addition, when the different homopolymer is used in the present invention, it is preferable that the combination of the first homopolymer and the second homopolymer in the block copolymer be the combination of polystyrene and polymethyl methacrylate (polystyrene-polymethyl methacrylate), and that the different homopolymer be a polyalkylene oxide. By using a polystyrene-polymethyl methacrylate block copolymer and polyalkylene oxide in combination as described above, the orientation in the vertical direction is further improved, thereby making it possible to further increase the depths of the concavities and convexities on the surface, and to shorten the heating process time during the manufacture.

In a case that the different homopolymer is used, the content thereof is preferably 100 parts by mass or less, and more preferably 5 parts by mass to 100 parts by mass, relative to 100 parts by mass of the block copolymer. In a case that the content of the different homopolymer is less than the lower limit, the effect obtained by containing the different homopolymer becomes insufficient.

In a case that the surfactant is used, the content thereof is preferably 10 parts by mass or less relative to 100 parts by mass of the block copolymer. Moreover, in a case that the ionic compound is used, the content thereof is preferably 10 parts by mass or less relative to 100 parts by mass of the block copolymer.

In a case that the block copolymer solution contains the different homopolymer, the total percentage content of the block copolymer and the different homopolymer is preferably 0.1 to 15% by mass, and more preferably 0.3 to 5% by mass, in the block copolymer solution. In a case that the total percentage content is less than the lower limit, it is difficult to uniformly apply the solution to attain a film thickness sufficient to obtain a necessary film thickness. In a case that the total percentage content exceeds the upper limit, it is relatively difficult to prepare a solution in which the block copolymer and the different homopolymer are uniformly dissolved in the solvent.

<Application Step of Block Copolymer Solution>

Figure 1A:
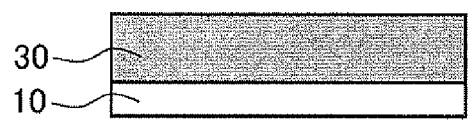
FIGS. 1A-1H are schematic illustration showing each step of a method for producing a mold of the present invention.

According to the method for producing the mold of the present invention, as shown in FIG. 1A, the block copolymer solution prepared as described above is applied on a base member 10 to form a thin film 30. The base member 10 is not especially limited, and is exemplified, for example, by substrates of resins such as polyimide, polyphenylene sulfide (PPS), polyphenylene oxide, polyether ketone, polyethylene naphthalate, polyethylene terephthalate, polyarylate, triacetyl cellulose, and polycycloolefin; inorganic substrates such as glass, octadecyldimethyl chlorosilane (ODS) treated glass, octadecyl trichlorosilane (OTS) treated glass, organo silicate treated glass, and silicon substrates; and substrates of metals such as aluminum, iron, and copper. In addition, the base member 10 may be subjected to surface treatments such as an orientation treatment. By performing treatment on the surface of the substrate such as the glass with ODS, organo silicate or the like, the micro phase separation structure such as the lamellar structure, a cylinder structure, and a globular or spherical structure is more likely to be arranged perpendicular to the surface in a heating step as will be described later on. The reason thereof is that domain of each block forming the block copolymer is more likely to be perpendicularly-oriented by decreasing the difference in interface energy between each block copolymer component and the surface of the substrate.

The method for applying the block copolymer solution is not particularly limited, and, for example, a spin coating method, a spray coating method, a dip coating method, a dropping method, a gravure printing method, a screen printing method, a relief printing method, a die coating method, a curtain coating method, or an ink-jet method can be employed as the method.

The thickness of the thin film 30 of the block copolymer is preferably within a range which allows the thickness of a dried coating film, as will be described later, to be 10 to 3000 nm, and more preferably within a range which allows the thickness of the dried coating film to be 50 to 500 nm.

<Drying Step>

After the block copolymer solution is applied on the base member 10 to form the thin film 30, the thin film 30 on the base member 10 is dried. The drying can be performed in the ambient atmosphere. The temperature for drying the thin film 30 is not particularly limited, provided that the solvent can be removed from the thin film 30. For example, the temperature is preferably 30 degrees Celsius to 200 degrees Celsius, and more preferably 40 degrees Celsius to 100 degrees Celsius. It is noted that concavities and convexities are found, in some cases, on the surface of the thin film 30 when the formation of the micro phase separation structure of the block copolymer is started during the drying step.

<First Heating Step>

Figure 1B:
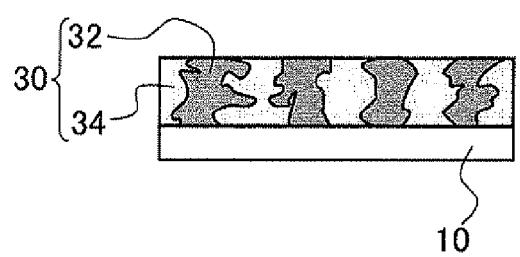

After the drying step, the thin film 30 is heated at a temperature of not less than a glass transition temperature (Tg) of the block copolymer (first heating step or annealing process). The heating step promotes the self-organization or assembly of the block copolymer, and the micro phase separation of the block copolymer into portions of a first polymer segment 32 and second polymer segment 34 occurs as shown in FIG. 1B. In a case that the heating temperature is less than the glass transition temperature of the block copolymer, the molecular mobility of the polymer is so low that the self-organization or assembly of the block copolymer does not make progress adequately and thus the micro phase separation structure can not be formed enough or the heating time required for sufficiently generating the micro phase separation structure is long. In addition, the upper limit of the heating temperature is not particularly limited, unless the block copolymer is pyrolyzed at the temperature. The first heating step can be performed in the ambient atmosphere using an oven or the like. The drying step and the heating step can be performed continuously by gradually increasing the heating temperature. Accordingly, the drying step is included in the heating step.

<Etching Step>

Figure 1C:
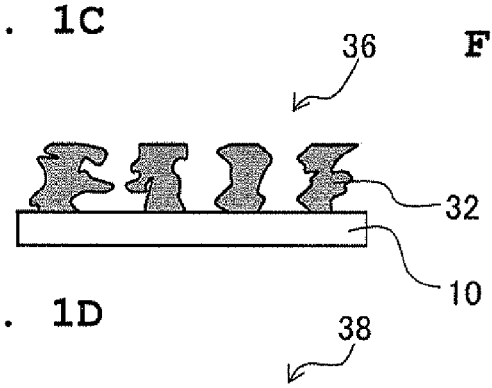

After the first heating step, the etching process of the thin film 30 is performed. Since the molecular structure of the first polymer segment 32 is different from the molecular structure of the second polymer segment 34, etchability of the first polymer segment 32 is also different from that of the second polymer segment 34. Therefore, by performing the etching process depending on each type of the polymer segments, that is, depending on each type of homopolymer, it is possible to selectively remove one of the polymer segments (second polymer segment 34) forming the block copolymer. A remarkable concavity and convexity structure appears on the coating film by removing each second polymer segment 34 from the micro phase separation structure in the etching process, as shown in FIG. 1C schematically. As the etching process, an etching method using, for example, a reactive ion etching method, an ozone oxidation method, a hydrolysis method, a metal ion staining method, an ultraviolet-ray etching method, or the like can be employed. Moreover, as the etching process, a method may be employed in which covalent bonds in the block copolymer are cleaved by treating the covalent bonds with at least one selected from the group consisting of acids, bases, and reducing agents, and then the coating film in which the micro phase separation structure is formed is cleaned with a solvent which dissolves only one of the polymer segments, or the like, thereby removing only the one of the polymer segments, while keeping the micro phase separation structure. In the embodiment(s) which will be described later, the ultraviolet-ray etching is used in view of operability and the like.

<Second Heating Step>

The second heating process or the annealing process is performed to a concavity and convexity structure 36 of the thin film 30 obtained by the etching step. The heating temperature in the second heating process is desirably not less than the glass transition temperature of the first polymer segment 32 remaining after the etching, that is, not less than the glass transition temperature of the first homopolymer. For example, the heating temperature in the second heating process is desirably not less than the glass transition temperature of the first homopolymer and not more than a temperature higher than the glass transition temperature of the first homopolymer by 70 degrees Celsius. In a case that the heating temperature is less than the glass transition temperature of the first homopolymer, it is not possible to obtain a desired concavity and convexity structure (that is, a smooth chevron structure) after the electroforming, or a long time is required to perform the heating. In a case that the heating temperature is much higher than the glass transition temperature of the first homopolymer, the first polymer segment 32 is melted and/or the shape of the first polymer segment 32 is collapsed severely. Thus, it is not preferable. In view of the above, the heating is desirably performed within a range from the glass transition temperature to the temperature higher than the glass transition temperature by about 70 degrees Celsius. Similar to the first heating process, the second heating process can be performed in the ambient atmosphere using the oven or the like.

According to experiments of the inventors of the present invention, it has been found out that a desired transfer pattern can not be obtained in case that the concavity and convexity structure 36 of the coating film obtained by the etching step is used as a master (master block) to transfer the concavity and convexity structure to a metallic mold by the electroforming which will be described later. Especially, this problem becomes conspicuous as the molecular weight of the block copolymer is higher. As described above, the molecular weight of the block copolymer is deeply linked with the micro phase separation structure, and thus the pitch of the diffraction grating obtained therefrom. Therefore, in a case that the diffraction grating is used for a purpose such as the organic EL element, a distribution of the pitch is required to be such that diffraction occurs in a wavelength region such as the visible region including a wavelength range which is wide and includes relatively long wavelength. In order to realize this, even when a block copolymer having a relatively high molecular weight is used, it is necessary to reliably obtain, by the electroforming, a concavity and convexity structure having the desired pitch distribution. In the present invention, by performing the heating process for the concavity and convexity structure obtained by the etching, a metallic mold, in which the concavity and convexity structure is also reflected enough, is successfully obtained in the subsequent electroforming step.

The reason thereof is considered by the inventors as follows. As shown in FIG. 1C conceptually, the concavity and convexity structure 36 after the etching is considered to have a complicated cross-section structure, in which the side surfaces of grooves defined by the concavity and convexity structure are coarse and the concavities and convexities (including the overhang) are generated in a direction perpendicular to a thickness direction. The following three problems are arisen by the complicated cross-section structure.

i) In the complicated cross-section structure, a portion at which a seed layer for the electroforming is not attached is generated, and thereby making it difficult to uniformly accumulate the metal layer by the electroforming. As a result, it is considered that the obtained mold has low mechanical strength and that defects such as deformation of the mold and pattern defect are caused.

ii) In the electroforming (electroplating), a thickness of plating varies depending on shapes of respective parts of an object to be subjected to the plating. In particular, a plated metal is more likely to be attracted to convex portions and projecting or prominent corners of the object, and is less likely to be attracted to concave portions and hollow portions of the object. Also for these reasons, it is difficult to obtain an electroformed film having a uniform film thickness on the complicated concave and convex cross-section structure after the etching.

iii) Even when the complicated cross-section structure as described above can be transferred to the mold by the electroforming, in a case that the concavity and convexity shape is tried to be transferred by pressing the mold against a curable resin, the curable resin enters gaps in the complicated cross-section structure of the mold. Hence, the mold can not be released from the cured resin, or the pattern defect occurs by fracture of the portion of the mold having the low strength. Conventionally, the transfer has been repeated using polydimethylsiloxane (PDMS) to prevent the above problem.

Figure 1D:
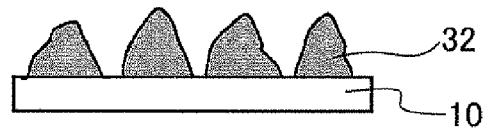
Figure 5A:
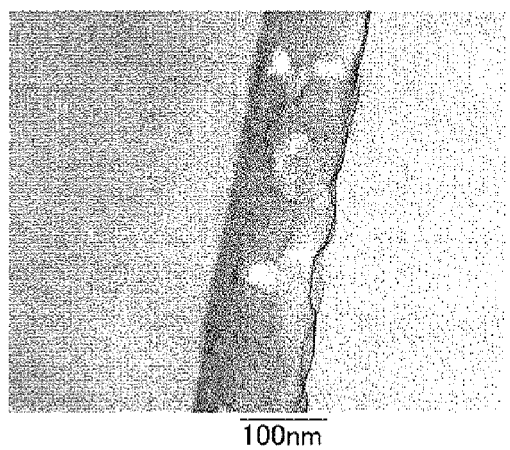
FIG. 5A is a transmission electron micrograph of a cross-section of a coating film after a first annealing process obtained in Example 1.
Figure 5B:
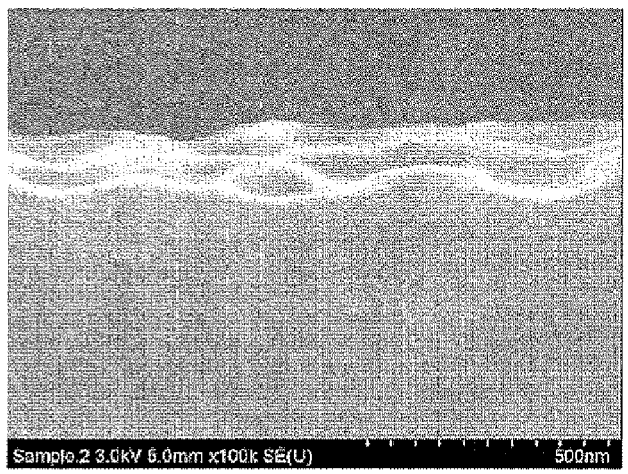
FIG. 5B is a scanning electron micrograph of a cross-section of a nickel mold from which a polymer component has been removed in Example 1.
Figure 14A:
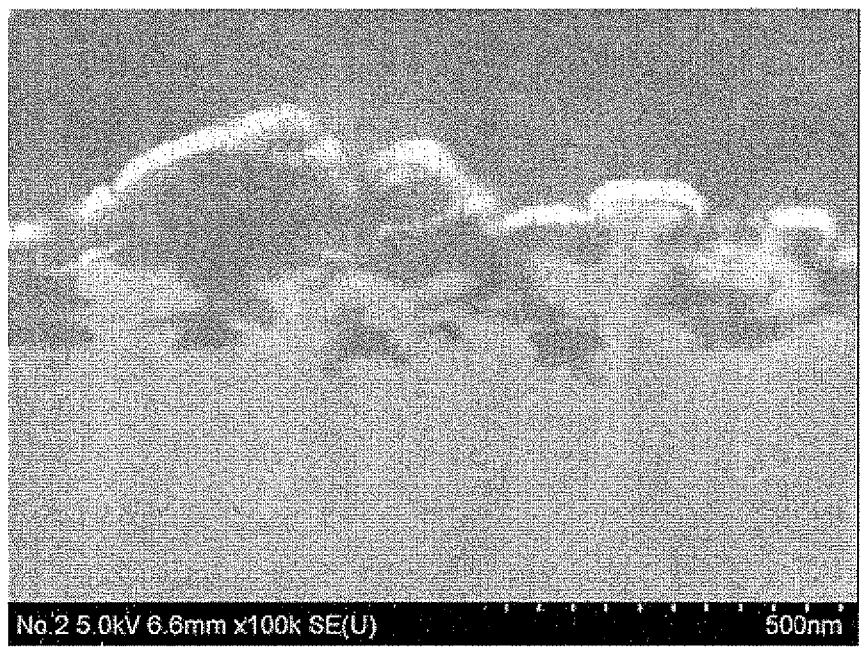
FIG. 14A is a scanning electron micrograph of a cross-section of a nickel mold obtained in Comparative Example 1.
Figure 14B:
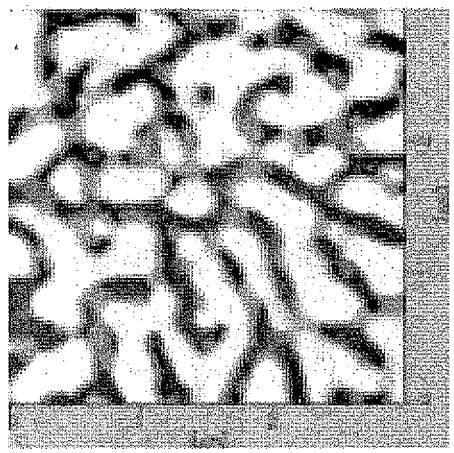
FIG. 14B is a photograph showing an analysis image, in which a result of analysis conducted on a concave and convex surface of a block copolymer from which PMMA has been selectively removed by the etching process in Comparative Example 1 by use of the scanning probe microscope is displayed on a display.

In the present invention, the first polymer segment 32 constructing the side surfaces of the grooves is subjected to the annealing process by heating the concavity and convexity structure after the etching. Thereby, as shown in FIG. 1D conceptually, each cross-section shape defined by the first polymer segment 32 is formed of a relatively smooth and sloped surface to have a shape of chevron narrowing upward from the base member (referred to as "chevron-shaped structure" in this invention). The overhang does not appear in such chevron-shaped structure, and the chevron-shaped structure is duplicated into the inverted pattern in a metal layer accumulated on the first polymer segment 32, thereby the metal layer can be released easily. It has become clear that the three problems can be solved by such effects of the second heating step as described above. FIG. 5B is a micrograph, taken by a scanning electron microscope (SEM), showing the cross-section structure of the mold, which is formed, by Ni-electroforming using the concavity and convexity structure obtained by the heating process after the etching process of the block copolymer, in Example 1 which will be described later. The concavities and convexities are smooth, each convex portion has the gentle chevron shape, and no overhang is observed. On the other hand, FIG. 14B is a SEM micrograph showing the cross-section structure of the mold, which is formed by the Ni-electroforming (nickel electroforming) using the concavity and convexity structure obtained without the second heating process after the etching process of the block copolymer, in Comparative Example 1 which will be described later. It has been appreciated that Ni portions corresponding to white portions in FIG. 14B form grooves each having a complicated shape including an overhang structure; and that the resins (black portions in FIG. 14B) are penetrated or entered into the grooves.

The base member 10, which has a chevron-shaped structure 38 obtained in the second heating step, is used as a master for transfer in subsequent steps. The average pitch of the concavities and convexities representing the chevron-shaped structure 38 is preferably within a range from 100 to 600 nm, and more preferably 200 to 600 nm. In a case that the average pitch of the concavities and convexities is less than the lower limit, the pitches are so small relative to wavelengths of the visible light that required diffraction of the visible light is less likely to occur by using the diffraction grating obtained by use of such a master. In a case that the average pitch exceeds the upper limit, the diffraction angle of the diffraction grating obtained by use of such a master is so low that functions as the diffraction grating can not be fulfilled sufficiently. Note that the average pitch of the concavities and convexities refers to an average value of pitches of the concavities and convexities obtained when pitches of the concavities and convexities on the surface of the cured resin layer (distances between adjacent concave portions or between adjacent convex portions) are measured. In addition, a value which can be calculated as follows is employed as such average value of the pitches of the concavities and convexities. A concavity and convexity analysis image is obtained by measuring the shape of the concavities and convexities on the surface by use of a scanning probe microscope (for example, one manufactured by SII Nano Technology Inc., under the product name of "E-sweep", or the like), then the distances between randomly selected adjacent convex portions or the distances between randomly selected adjacent concave portions are measured at 100 points or more in the concavity and convexity analysis image, and then an average of these distances is determined as the average value of the pitches of concavities and convexities.

In addition, the average height of the concavities and convexities representing the chevron-shaped structure 38 is preferably within a range from 5 to 200 nm, more preferably within a range from 20 to 200 nm, and further preferably within a range from 50 to 150 nm. In a case that the average height of the concavities and convexities is less than the lower limit, the height is so small relative to the wavelengths of the visible light that the diffraction is insufficient. In a case that the average height exceeds the upper limit, the following tendency is found. When the obtained diffraction grating is used as an optical element on the light extraction port side of the organic EL element, the element tends to be easily destructed and the life thereof tends to be shortened because of heat generation which occurs when the electric field distribution in the EL layer becomes non-uniform, and hence electric fields concentrate on a certain position or area. Note that the average height of the concavities and convexities refers to an average value of the heights of the concavities and convexities obtained when heights of the concavities and convexities (the distances between concave portions and convex portions in the depth direction) on the surface of the cured resin layer are measured. In addition, a value calculated as follows is employed as the average value of the heights of the concavities and convexities. That is, a concavity and convexity analysis image is obtained by measuring the shape of the concavities and convexities on the surface by use of the scanning probe microscope (for example, one manufactured by SII NanoTechnology Inc., under the product name of "E-sweep", or the like), then the distances between randomly selected concave portions and convex portions in the depth direction are measured at 100 points or more in the concavity and convexity analysis image, and then the average of the distances is determined as the average value of heights of concavities and convexities.

<Seed Layer Forming Step and Electroforming Step>

Figure 1E:
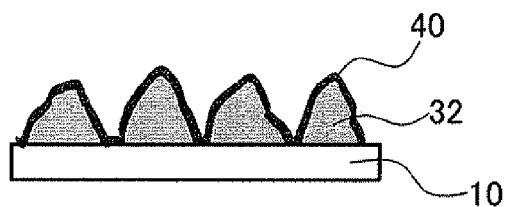
Figure 1F:
Figure 1G:
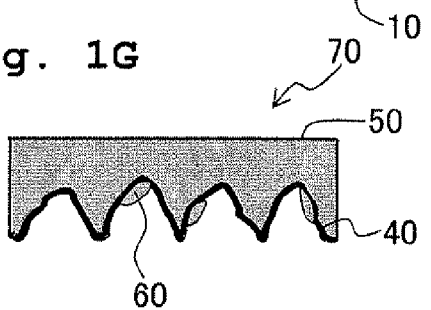
Figure 1H:
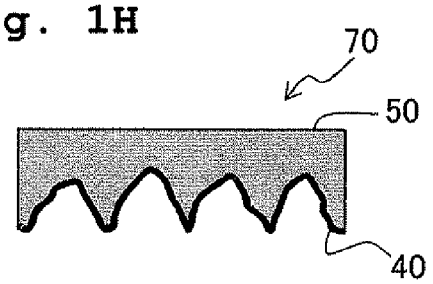

As shown in FIG. 1E, a seed layer 40 functioning as an electroconductive layer for a subsequent electroforming process is formed on the surface of the chevron-shaped structure 38 of the master obtained as described above. The seed layer 40 can be formed by non-electrolytic plating, sputtering, or vapor deposition. The thickness of the seed layer 40 is preferably not less than 10 nm and more preferably not less than 100 nm to uniformalize current density during the subsequent electroforming process, and thereby making the thickness of the metal layer accumulated by the subsequent electroforming process to be constant. As a material of the seed layer, it is possible to use, for example, nickel, copper, gold, silver, platinum, titanium, cobalt, tin, zinc, chrome, gold-cobalt alloy, gold-nickel alloy, boron-nickel alloy, solder, copper-nickel-chromium alloy, tin-nickel alloy, nickel-palladium alloy, nickel-cobalt-phosphorus alloy, or alloy thereof. It is considered that the relatively smooth chevron-shaped structure as shown in FIG. 1D is more likely to be attached to by the seed layer completely and with a uniform thickness, compared with the complicated cross-section structure as shown in FIG. 1C.

Subsequently, the metal layer is accumulated on the seed layer 40 by the electroforming (electroplating). The entire thickness of a metal layer 50 including the thickness of the seed layer 40 can be, for example, 10 to 3000 μm. As a material of the metal layer 50 accumulated by the electroforming, it is possible to use any of metal species as described above which can be used as the seed layer 40. In view of wear resistance as the mold and peeling property, nickel is preferable. In this case, nickel is also preferably used for the seed layer 40. The current density during the electroforming may be, for example, 0.03 to 10 A/cm$^2$ for suppressing bridge to form a uniform metal layer and in view of shortening of an electroforming time. Considering ease of the subsequent processes such as pressing to the resin layer, peeling, and cleaning, the formed metal layer 50 desirably has appropriate hardness and thickness. A diamond like carbon (DLC) process or a Cr plating processing treatment can be performed on the surface of the metal layer in order to improve the hardness of the metal layer formed by the electroforming. Alternatively, the hardness of the surface may be improved by further performing the heating process of the metal layer.

<Peeling Step>

The metal layer 50 including the seed layer obtained as described above is peeled off from the base member having the concavity and convexity structure to obtain a mold as a father die. As a peeling method, the metal layer 50 may be peeled off physically, or the first homopolymer and the remained block copolymer may be dissolved to be removed by using an organic solvent dissolving them, such as toluene, tetrahydrofuran (THF), and chloroform.

<Cleaning Step>

In a case that the mold is peeled off from the base member 10 having the chevron-shaped structure 38 as above-described, a part of the polymer 60, like the first polymer segment, remains in the mold in some cases as shown in FIG. 10. In such a case, each part 60 remained in the mold can be removed by a cleaning. As a cleaning method, a wet cleaning or a dry cleaning can be used. As the wet cleaning, the remained parts can be removed by performing the cleaning with the organic solvent such as toluene and tetrahydrofuran, the surfactant, or an alkaline solution. In a case that the organic solvent is used, an ultrasonic cleaning may be carried out. Alternatively, the remained parts may be removed by performing an electrolytic cleaning. As the dry cleaning, the remained parts can be removed by an asking using ultraviolet rays and/or plasma. The wet cleaning and the dry cleaning may be used in combination. After the cleaning as described above, a rinse process with pure water or purified water may be performed, and then ozone irradiation may be carried out after a drying. Accordingly, a mold 70 having a desired concavity and convexity structure is obtained.

Next, an explanation will be made about a method for producing the diffraction grating used for the organic EL element and the like using the obtained mold 70 with reference to FIG. 2A to FIG. 2E.

<Mold-Release Treatment Step>

In a case that the concavity and convexity structure is transferred to the resin using the mold 70, a mold-release treatment of the mold 70 may be performed to improve the mold releasability from the resin. As the mold-release treatment, a manner to decrease surface energy is commonly used, and the mold-release treatment is not particularly limited and includes, for example, a method in which a concave and convex surface 70a of the mold 70 is coated with a mold-release agent such as a fluorine-based material and a silicon resin as shown in FIG. 2A, a method in which the surface is subjected to a treatment using a fluorine-based silane coupling agent, and a method in which a film of a diamond like carbon is formed on the surface.

<Step for Transferring Mold to Resin Layer>

By using the obtained mold 70, a mother die is produced by transferring the concavity and convexity structure (pattern) of the mold to a layer formed of an organic material such as resin or an inorganic material such as a sol-gel material. In the following description, an explanation will be made by citing a resin layer 80 as a layer to which the concavity and convexity pattern is transferred, as an example. In the method of the transfer process, for example, the curable resin is applied on a transparent supporting substrate 90, and then the resin layer 80 is cured while pressing the concavity and convexity structure of the mold 70 against the resin layer 80, as shown in FIG. 2B. The transparent supporting substrate 90 is exemplified, for example, by base members made of a transparent inorganic substance such as glass; base members made of a resin such as polyethylene terephthalate (PET), polyethylene terenaphthalate (PEN), polycarbonate (PC), cycloolefin polymer (COP), polymethyl methacrylate (PMMA), or polystyrene (PS); stacked base members having a gas barrier layer made of an inorganic substance such as SiN, $SiO_2$, SiC, $SiO_xN_y$, $TiO_2$, or $Al_2O_3$ formed on the surface of the base member made of any of the above-described resins; and stacked base members having base members made of any of the above-described resins and gas barrier layers made of any of the above-described inorganic substances stacked alternately on each other. In addition, the thickness of the transparent supporting substrate may be within a range from 1 to 500 μm.

Examples of the curable resin include epoxy resin, acrylic resin, urethane resin, melamine resin, urea resin, polyester resin, phenol resin, and cross-linking type liquid crystal resin. The thickness of the cured resin is preferably within a range from 0.5 to 500 μm. In a case that the thickness is less than the lower limit, heights of the concavities and convexities formed on the surface of the cured resin layer are more likely to be insufficient. In a case that the thickness exceeds the upper limit, an effect of volume change of the resin which occurs during upon curing is likely to be so large that the formation of the shape of the concavities and convexities tends to be insufficient.

As a method for applying the curable resin, it is possible to adopt various coating methods such as a spin coating method, a spray coating method, a dip coating method, a dropping method, a gravure printing method, a screen printing method, a relief printing method, a die coating method, a curtain coating method, an ink-jet method, and a sputtering method. Moreover, the condition for curing the curable resin varies depending on the kind of the resin used. For example, a curing temperature is preferably within a range from room temperature to 250 degrees Celsius, and a curing time is preferably within a range from 0.5 minutes to 3 hours. Alternatively, a method may be employed in which the curable resin is cured by irradiation with energy rays such as ultraviolet rays or electron beams. In such a case, the amount of the irradiation is preferably within a range from 20 mJ/cm$^2$ to 5 J/cm$^2$.

Subsequently, the mold 70 is detached from the cured rein layer 80 in a cured state. A method for detaching the mold 70 is not limited to a mechanical peeling method, and can adopt any known method. Then, as shown in FIG. 2C, it is possible to obtain a resin film structure 100 in which the cured rein layer 80 having the concavities and convexities is formed on the transparent supporting substrate 90. The resin film structure 100 may be used, as it is, as the diffraction grating. Alternatively, as will be described later on, the resin film structure 100 is further used as the mold to make a diffraction grating made of the organic material such as the resin or a structure made of the inorganic material such as the sol-gel material, and the structure made of the organic material or the structure made of the inorganic material can be used as the diffraction grating.

The method for producing the mold of the present invention can be used not only in production of the diffraction grating provided on the light extraction port side of the organic EL element but also in production of an optical component having a minute or fine pattern used for various devices. For example, the method for producing the mold of the present invention can be used to produce a wire grid polarizer, an antireflection film, or an optical element for providing a light confinement effect in a solar cell by being placed on the photoelectric conversion surface side of the solar cell.

As described above, the resin film structure 100 having a desired pattern can be obtained. In a case that the inverted pattern of the resin film structure 100 is used as the diffraction grating, the resin film structure 100 obtained through the transfer process of the mold as described above is used as the mother die; a curable resin layer 82 is applied on another transparent supporting substrate 92 as shown in FIG. 2D; and the curable resin layer 82 is cured while pressing the resin film structure 100 against the curable resin layer 82, similar to a case in which the resin film structure 100 is formed, Subsequently, the resin film structure 100 is peeled off from the curable resin layer 82 in a cured state. Accordingly, a replica 110 as another resin film structure as shown in FIG. 2E can be obtained. Further, it is allowable to produce a replica having the inverted pattern of the replica 110 by performing the above transfer step using the replica 110 as a master and/or to produce a sub-replica by repeating the above transfer step again using the replica having the inverted pattern as the master.

Next, an explanation will be made about a method for manufacturing a structure having concavities and convexities made of the sol-gel material (hereinafter referred to as "sol-gel structure" as appropriate) by further using the obtained resin film structure 100 as the master. A method for forming a substrate having a concavity and convexity pattern using the sol-gel material mainly includes: a solution preparation step for preparing a sol solution; an application step for applying the prepared sol solution on the substrate; a drying step for drying the coating film of the sol solution applied on the substrate; a pressing step for pressing a mold with a transfer pattern; a pre-sintering step during which the coating film to which the mold is pressed is subjected to the pre-sintering; a peeling step for peeling off the mold from the coating film; and a main sintering step during which the coating film is subjected to the main sintering. Hereinbelow, an explanation will be made about each of the steps sequentially, <Sol-Gel Solution Preparation Step>

At first, a sol-gel solution is prepared to form a coating film to which a pattern is transferred by a sol-gel method. For example, in a case that silica is synthesized by the sol-gel method on the substrate, the sol solution of metal alkoxide (silica precursor) is prepared. The silica precursor is exemplified by metal alkoxides including, for example, tetraalkoxide monomers such as tetramethoxysilane (TMOS), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers such as methyl trimethoxysilane, ethyl trimethoxysilane, propyl trimethoxysilane, isopropyl trimethoxysilane, phenyl trimethoxysilane, methyl triethoxysilane, ethyl triethoxysilane, propyl triethoxysilane, isopropyl triethoxysilane, phenyl triethoxysilane, methyl tripropoxysilane, ethyl tripropoxysilane, propyl tripropoxysilane, isopropyl tripropoxysilane, phenyl tripropoxysilane, methyl triisopropoxysilane, ethyl triisopropoxysilane, propyl triisopropoxysilane, isopropyl triisopropoxysilane, phenyl triisopropoxysilane; a polymer obtained by polymerizing the above monomers in small amounts; and a composite material characterized in that functional group and/or polymer is introduced into a part of the material. Further, the silica precursor is exemplified, for example, by metal acetylacetonate, metal carboxylate, oxychloride, chloride, and mixtures thereof. The silica precursor, however, is not limited thereto. Examples of metal species include, in addition to Si, Ti, Sn, Al, Zn, Zr, In, and mixtures thereof, but are not limited thereto. It is also possible to use any appropriate mixture of precursors of the above oxidized metals.

In a case that a mixture of TEOS and MTES is used, the mixture ratio thereof can be 1:1, for example, in a molar ratio. The sol solution produces amorphous silica by performing hydrolysis and polycondensation reaction. An acid such as hydrochloric acid or an alkali such as ammonia is added in order to adjust pH of the solution as a synthesis condition. The pH is preferably not more than 4 or not less than 10. Water may be added to perform the hydrolysis. An amount of water to be added can be 1.5 times or more with respect to metal alkoxide species in the molar ratio.

Examples of the solvent include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; water; and mixture solvents thereof. Especially, ethanol and isopropyl alcohol are preferable. Further, a mixture of water and ethanol and a mixture of water and isopropyl alcohol are also preferable.

As an additive, it is possible to use, for example, polyethylene glycol, polyethylene oxide, hydroxypropylcellulose, and polyvinyl alcohol for viscosity adjustment; alkanolamine such as triethanolamine as a solution stabilizer; β-diketone such as acetylacetone; β-ketoester; formamid; dimethylformamide; and dioxane.

The sol solution prepared as described above is applied on the substrate. As the substrate, substrates made of inorganic materials such as glass, silica glass, and silicon substrates or substrates of resins such as polyethylene terephthalate (PET), polyethylene terenaphthalate (PEN), polycarbonate (PC), cycloolefin polymer (COP), polymethyl methacrylate (PMMA), polystyrene (PS), polyimide (PI), and polyarylate may be used. The substrate may be transparent or opaque. In a case that a substrate having a concavity and convexity pattern obtained from the substrate is used for production of the organic EL element as will be described later, the substrate desirably has resistance to heat and ultraviolet (UV) light etc. In view of this, the substrates made of the inorganic materials such as the glass, the silica glass, and the silicon substrates are more preferable. It is allowable to perform a surface treatment or provide an easy-adhesion layer on the substrate in order to improve adhesion property and to provide a gas barrier layer in order to keep out moisture and/or gas such as oxygen. As a method for applying the sol solution, it is possible to use any application method such as a bar coating method, a spin coating method, a spray coating method, a dip coating method, a die coating method, and an ink-jet method. Among the methods as described above, the bar coating method, the die coating method, and the spin coating method are preferable, because the sol solution can be uniformly applied on the substrate having a relatively large area and the application can be quickly completed prior to gelation of the sol solution. It is noted that, since a desired concavity and convexity pattern by a sol-gel material layer is formed in subsequent steps, the surface of the substrate (including the surface treatment or the easy-adhesion layer in case that the surface treatment or the easy-adhesion layer is present) may be flat, and the substrate itself does not have the desired concavity and convexity pattern.

After the application step; the substrate is kept in the atmosphere or under reduced pressure to evaporate the solution in the applied coating film (hereinafter referred to also as "sol-gel material layer" as appropriate). Subsequently, the resin film structure 100 (mold) is pressed against the coating film. In this situation, the resin film structure 100 may be pressed by using a pressing roll. A period of time during which the mold and the coating film are brought in contact with each other in a roll process is shorter than that in a pressing system, and thus there are advantages such that it is possible to prevent deformation of pattern due to difference among coefficients of thermal expansion of the mold, the substrate, a stage on which the substrate is provided, and the like; it is possible to prevent generation of bubbles of gas in the pattern due to bumping of the solvent in the gel solution or to prevent trace or mark of gas from being left; it is possible to reduce transfer pressure and peeling force due to line contact with the substrate (coating film), and thereby making it possible to deal with a larger substrate readily; no bubble is included during the pressing; and the like. Further, the heating may be performed while pressing the resin film structure 100.

After the resin film structure 100 as the mold is pressed against the coating film (sol-gel material layer), the coating film may be subjected to the pre-sintering. The pre-sintering promotes gelation of the coating film to solidify the pattern, and thereby the pattern is less likely to be collapsed during the peeling. In a case that the pre-sintering is performed, the heating is preferably performed at a temperature from 40 degrees Celsius to 150 degrees Celsius in the atmosphere. It is not indispensable to perform the pre-sintering.

The resin film structure 100 is peeled off from the coating film (sol-gel material layer) after the pressing step or the pre-sintering step. In a case that the roll is used during the pressing, the peeling force may be smaller than that in a case that a plate-shaped mold is used, and it is possible to easily peel off the mold from the coating film without remaining the coating film in the mold.

After the resin film structure 100 is peeled off from the coating film (sol-gel material layer) on the substrate, the coating film is subjected to the main sintering. Hydroxyl group and the like contained in silica (amorphous silica) forming the coating film is desorbed or eliminated by the main sintering to further strengthen the coating film. The main sintering may be performed at a temperature from 200 degrees Celsius to 1200 degrees Celsius for about 5 minutes to 6 hours. Accordingly, the coating film is cured, and thereby obtaining a sol-gel structure (diffraction grating) with a concavity and convexity pattern film which corresponds to the concavity and convexity pattern of the resin film structure 100, that is, a sol-gel structure (diffraction grating) in which the sol-gel material layer having the concavity and convexity pattern is directly formed on the flat substrate. In this situation, depending on a sintering temperature and a sintering time, the silica as the sol-gel material layer is amorphous, crystalline, or in a mixture state of the amorphous and the crystalline.

In a case that the replica 110 (or sol-gel structure) is duplicated using the resin film structure 100, or in a case that another replica is duplicated using the obtained replica 110 (or sol-gel structure), a film may be laminated or stacked, on the surface of the resin film structure 100 or the replica 110 (or sol-gel structure) having the concavity and convexity pattern, by a gas phase method such as an evaporation method or a sputtering method. By stacking the film as described above, in a case that transfer etc. is performed with, for example, applying the resin onto the surface of the film, the adhesion between the substrate and the resin (for example, a UV curable resin) can be lowered, so that the master block is more likely to be easily peeled. Examples of the vapor-deposited film include metals such as aluminum, gold, silver, platinum, and nickel; and metal oxides such as aluminum oxide. In addition, the thickness of the vapor-deposited film is preferably 5 to 500 nm. In a case that the thickness is less than the lower limit, a uniform film is difficult to obtain, so that sufficient effect of lowering the adhesion is decreased. In a case that the thickness exceeds the upper limit, the shape of the master block is more likely to be dull. In a case that the cured resin layer of the resin film structure 100 or the replica 110 is made of a UV curable resin, postcure may be conducted as appropriate by, for example, ultraviolet light irradiation, after curing of the resin.

In the steps shown in FIGS. 2B and 2D, the curable resins 80, 82 are applied on the transparent supporting substrates 90, 92, respectively. In addition, it is allowable to use one obtained as follows as the master block. The curable resin is applied directly on the surface of the mold 70 which is the master block or the surface of the cured resin layer 80, and then the cured resin is detached. Alternatively, instead of applying the resin onto the surface of the master block, it is allowable to employ, as the master block, a concavity and convexity film of the cured resin obtained as follows. That is, the master block is pressed onto the coating film of the resin, and the resin is cured.

<Method for Producing Organic EL Element>

Next, an explanation will be made about a method for producing an organic EL element using the resin film obtained as described above or the diffraction grating which is the sol-gel structure. Here, an explanation will be made by taking a method for producing an organic EL element using a diffraction grating made of a resin film 100 as an example, with reference to FIG. 4.

Figure 4:
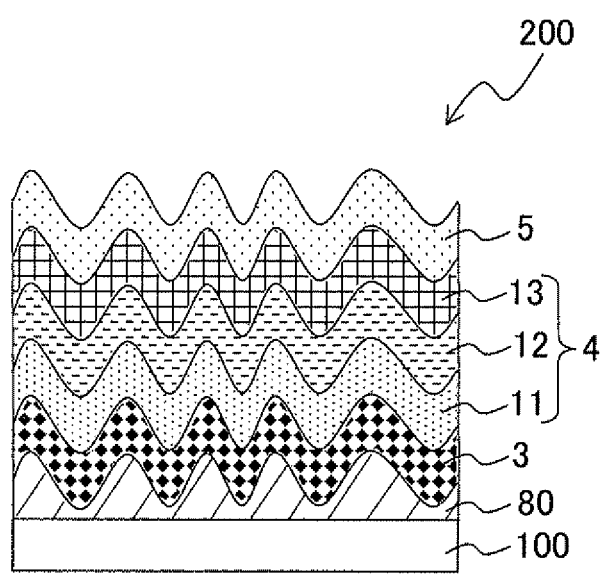
FIG. 4 is a schematic illustration showing a stacked structure of an organic EL element, in which the diffraction grating obtained by the method for producing the diffraction grating of the present invention is used.

At first, as shown in FIG. 4, a transparent electrode denoted by a reference numeral 3 is stacked on a resin layer 80 of the resin film 100 to maintain a concavity and convexity structure formed on the surface of the resin 80. As a material for the transparent electrode 3, for example, indium oxide, zinc oxide, tin oxide, indium-tin oxide (ITO), which is a composite material thereof, gold, platinum, silver, or copper is used. Of these materials, ITO is preferable from the viewpoint of the transparency and the electrical conductivity. The thickness of the transparent electrode 3 is preferably within a range from 20 to 500 nm. In a case that the thickness is less than the lower limit, the electrical conductivity is more likely to be insufficient. In a case that the thickness exceeds the upper limit, there is possibility that the transparency is so insufficient that the emitted EL light cannot be extracted to the outside sufficiently. As a method for stacking the transparent electrode 3, any known method such as a vapor deposition method or a sputtering method can be employed as appropriate. Of these methods, the vapor deposition method is preferably employed from the viewpoint of maintaining the shape of the concavities and convexities formed on the surface of the cured resin layer; and the sputtering method is preferably employed from the viewpoint of improving adhesion property. It is allowable to put a glass substrate on a side opposite to the resin layer 80 of the resin film 100 before the transparent electrode 3 is provided on the resin layer 80.

Next, an organic layer denoted by a reference numeral 4 as shown in FIG. 4 is stacked on the transparent electrode 3 to maintain the shape of the concavities and convexities formed on the surface of the resin 80. The organic layer 4 is not particularly limited, provided that the organic layer 4 is one usable as an organic layer of the organic EL element. As the organic layer 4, any known organic layer can be used as appropriate. The organic layer 4 may be a stacked body of various organic thin films, and, for example, may be a stacked body of an anode buffer layer 1, a hole transporting layer 12, and an electron transporting layer 13 as shown in FIG. 4. Here, examples of materials for the anode buffer layer 11 include copper phthalocyanine, PEDOT, and the like. Examples of materials for the hole transporting layer 12 include derivatives of triphenylamine, triphenyldiamine derivatives (TPD), benzidine, pyrazoline, styrylamine, hydrazone, triphenylmethane, carbazole, and the like. Examples of materials for the electron transporting layer 13 include aluminum-quinolinol complex (Alq), phenanthroline derivatives, oxadiazole derivatives, triazole derivatives, phenylquinoxaline derivatives, silole derivatives, and the like. The organic layer 4 may be, for example, a stacked body of a hole injecting layer made of a triphenylamine derivative or the like, and a light emitting layer made of a fluorescent organic solid such as anthracene, a stacked body of the light emitting layer and an electron injecting layer made of a perylene derivative or the like, or a stacked body of these hole injecting layer, light emitting layer, and electron injecting layer.

The organic layer 4 may be a stacked body of the hole transporting layer, the light emitting layer, and the electron transporting layer as exemplified in Example 22 as will be described later on. In this case, examples of materials of the hole transporting layer include aromatic diamine compounds such as phthalocyanine derivatives, naphthalocyanine derivatives, porphyrin derivatives, N,N'-bis(3-methylphenyl)-(1,1'-biphenyl)-4,4'-diamine (TPD), and 4,4'-bis[N-(naphthyl)-N-phenyl-amino]biphenyl(α-NPD); oxazole; oxadiazole; triazole; imidazole; imidazolone; stilbene derivatives; pyrazoline derivatives; tetrahydroimidazole; polyarylalkane; butadiene; and 4,4',4"-tris(N-(3-methylphenyl)N-phenylamino)triphenylamine (m-MTDATA). The materials of the hole transporting layer, however, are not limited thereto. By providing the light emitting layer, a hole injected from the transparent electrode and electron injected from a metal electrode are recombined to occur light emission. Examples of materials of the light emitting layer include metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, and aluminum-quinolinol complex (Alq3); tri-(p-terphenyl-4-yl) amine; 1-aryl-2,5-di(2-thienyl) pyrrole derivatives; pyran; quinacridone; rubren; distyrylbenzene derivatives; distyryl arylene derivatives; distyryl amine derivatives; and various fluorescent pigments or dyes. Further, it is preferable that light-emitting materials selected from the above compounds are mixed as appropriate and then are used. Furthermore, it is possible to preferably use a material system generating emission of light from a spin multiplet, such as a phosphorescence emitting material generating emission of phosphorescence and a compound including, in a part of the molecules, a constituent portion formed by the above materials. The phosphorescence emitting material preferably includes heavy metal such as iridium. A host material having high carrier mobility may be doped with each of the light-emitting materials as a guest material to generate the light emission using dipole-dipole interaction (Forster mechanism), electron exchange interaction (Dexer mechanism). Examples of materials of the electron transporting layer include heterocyclic tetracarboxylic anhydrides such as nitro-substituted fluorene derivatives, diphenylquinone derivatives, thiopyran dioxide derivatives, and naphthaleneperylene; and metallo-organic complex such as carbodiimide, fluorenylidene methane derivatives, anthraquino dimethane and anthrone derivarives, oxadiazole derivatives, and aluminum-quinolinol complex (Alq3). Further, in the oxadiazole derivatives mentioned above, it is also possible to use, as an electron transporting material, thiadiazole derivatives in which oxygen atoms of oxadiazole rings are substituted by sulfur atoms and quinoxaline derivatives having quinoxaline rings known as electron attractive group. Furthermore, it is also possible to use a polymeric material in which the above materials are introduced into a macromolecular chain or the above materials are made to be a main chain of the macromolecular chain. It is noted that the hole transporting layer or the electron transporting layer may also function as the light-emitting layer. In this case, there are two organic layers between the transparent electrode and the metal electrode which will be described later.

From the viewpoint of facilitating charge injection or hole injection into any organic layer 4, a layer made of a metal fluoride such as lithium fluoride (LiF) or $Li_2O_3$, a highly active alkaline earth metal such as Ca, Ba, or Cs, an organic insulating material, or the like may be provided on the transparent electrode 3 or the organic layer 4. In addition, from the viewpoint of facilitating the hole injection from the transparent electrode, a layer made of triazole derivatives; oxadiazole derivatives; imidazole derivatives; polyarylalkane derivatives; pyrazoline derivatives and pyrazolone derivatives; phenylenediamine derivatives; arylamine derivatives; amino-substituted chalcone derivatives; oxazole derivatives; styrylanthracene derivatives; fluorenon derivatives; hydrazone derivatives; stilbene derivatives; silazane derivatives; aniline copolymer; or a conductive polymer oligomer, in particular, thiophene oligomer, may be provided between the organic layer and the transparent electrode as the hole injecting layer.

In a case that the organic layer 4 is a stacked body formed of the anode buffer layer 11, the hole transporting layer 12, and the electron transporting layer 13, the thicknesses of the anode buffer layer 11, the hole transporting layer 12, and the electron transporting layer 13 are preferably within a range from 1 to 50 nm, a range from 5 to 200 nm, and a range from 5 to 200 nm, respectively, from the viewpoint of maintaining the shape of the concavities and convexities formed on the surface of the cured resin layer. In a case that the organic layer 4 is a stacked body formed of the hole transporting layer, the light-emitting layer, and the electron transporting layer, the thicknesses of the hole transporting layer, the light-emitting layer, and the electron transporting layer are preferably within a range from 1 to 200 nm, a range from 5 to 100 nm, and a range from 5 to 200 nm, respectively. As a method for stacking any organic layer 4, any known method such as a vapor deposition method, a sputtering method, and a die coating method can be employed as appropriate. Of these methods, the vapor deposition method is preferably employed from the viewpoint of maintaining the shape of the concavities and convexities formed on the surface of the resin 80.

Subsequently, as shown in FIG. 4, a metal electrode denoted by a reference numeral 5 is stacked on the organic layer 4 so as to maintain the shape of the concavities and convexities formed on the surface of the resin 80 in the step for forming the organic EL element. Materials of the metal electrode 5 are not particularly limited, and a substance having a small work function can be used as appropriate. Examples of the materials include aluminum, MgAg, MgIn, and AlLi. The thickness of the metal electrode 5 is preferably within a range from 50 to 500 nm. In a case that the thickness is less than the lower limit, the electrical conductivity is more likely to be decreased. In a case that the thickness exceeds the upper limit, there is possibility that the shape of the concavities and convexities is difficult to maintain. Any known method such as a vapor deposition method and a sputtering method can be adopted to stack the metal electrode 5. Of these methods, the vapor deposition method is preferably employed from the viewpoint of maintaining the concavity and convexity structure formed on the surface of the resin 80. Accordingly, an organic EL element 200 having a structure as shown in FIG. 4 can be obtained.

In the method for producing the organic EL element of the present invention, the resin 80 on the base member 10 has the chevron-shaped structure. Thus, each of the transparent electrode 3, the organic layer 4, and the metal electrode 5 is readily stacked to maintain the chevron-shaped structure of the resin 80. Hence, it is possible to sufficiently suppress repetition of multiple reflection of light generated in the organic layer 4 in the element due to total reflection at each interface. Further, it is also possible to re-emit light which has been totally reflected at an interface between the transparent supporting substrate and the air by diffraction effect. Furthermore, since each of the transparent electrode 3, the organic layer 4, and the metal electrode 5 is more likely to have the same structure as the chevron-shaped structure formed on the surface of the resin layer 80, an inter-electrode distance between the transparent electrode 3 and the metal electrode 5 is partially short. For this reason, in comparison with those in which the inter-electrode distance between the transparent electrode 3 and the metal electrode 5 is uniform, an increase in electric field intensity can be expected in application of voltage, and also light emission efficiency of the organic EL element can be improved.

In the diffraction grating produced according to the present invention and the organic EL element including the diffraction grating, the average height of the concavities and convexities formed on the surface (the cured surface of curable resin) of the diffraction grating is preferably within the range from 5 to 200 nm, more preferably within the range from 20 to 200 nm, and further preferably within the range from 50 to 150 nm as described above.

In the diffraction grating produced according to the present invention and the organic EL element including the diffraction grating, the average pitch of the concavities and convexities formed on the surface (the cured surface of curable resin) of the diffraction grating is preferably within the range from 100 to 600 nm, and more preferably within the range from 200 to 600 nm as described above.

In the diffraction grating produced according to the present invention and the organic EL element including the diffraction grating, according to the inventors' knowledge and perceptions, for the cross-section shape of the concavity and convexity structure formed on the surface (the cured surface of curable resin) of the diffraction grating, an average value m and a median M of a depth distribution of the concavities and convexities on the cross-section obtained by a method which will be described later preferably satisfy the following expression:

$$(1.062m - 2.2533) \times 0.95 \leq M \leq (1.062m - 2.2533) \times 1.05$$

In a case that the median (M) and the average value (m) satisfy the above expression, it is considered that generation of leakage current can be suppressed sufficiently when the diffraction grating is used for the organic EL element etc.

In the diffraction grating produced according to the present invention and the organic EL element including the diffraction grating, a kurtosis of the cross-section shape of the concavity and convexity structure formed on the surface (the surface of cured curable resin) of the diffraction grating is preferably −1.2 or more, and more preferably −1.2 to 1.2. In a case that the kurtosis is less than the lower limit, the leakage current is more likely to be generated when the diffraction grating is used for the organic EL element. In a case that the kurtosis exceeds the upper limit, the concavities and convexities on the surface (resin layer) of the diffraction grating are decreased. As a result, it is considered to cause the following situation. That is, not only the diffraction effect cannot be obtained sufficiently, but also the electric field is more likely to be concentrated on the portions of the projections, so that leakage currents are more likely to be generated. The kurtosis and a method for measuring the kurtosis will be described later on.

EXAMPLES

Hereinafter, the present invention will be described in detail by Examples and Comparative Examples. However, the present invention is not limited to Examples below.

At first, an explanation will be made about five block copolymers used in Examples and Comparative examples described below. Regarding any of five block copolymers, polystyrene (hereinafter referred to as "PS" in an abbreviated manner as appropriate) was used as the first polymer segment, and polymethyl methacrylate (hereinafter referred to as "PMMA" in an abbreviated manner as appropriate) was used as the second polymer segment. The volume ratio of the first polymer segment and second polymer segment (the first polymer segment: the second polymer segment) in each block copolymer was calculated on the assumption that the density of polystyrene was 1.05 g/cm$^3$, the density of polymethyl methacrylate was 1.19 g/cm$^3$. The number average molecular weights (Mn) and the weight average molecular weights (Mw) of polymer segments or polymers were measured by using gel permeation chromatography (Model No: "GPC-8020" manufactured by Tosoh Corporation, in which TSK-GEL SuperH1000, SuperH2000, SuperH3000, and SuperH4000 were connected in series). The glass transition temperatures (Tg) of polymer segments were measured by use of a differential scanning calorimeter (manufactured by Perkin-Elmer under the product name of "DSC7"), while the temperature was raised at a rate of temperature rise of 20 degrees Celsius/min over a temperature range from 0 to 200 degrees Celsius. The solubility parameters of polystyrene and polymethyl methacrylate were 9.0 and 9.3, respectively (see Kagaku Binran Ouyou Hen (Handbook of Chemistry, Applied Chemistry), 2nd edition).

Block copolymer 1 (hereinafter referred to as "BCP-1" in an abbreviated manner as appropriate)

A block copolymer of PS and PMMA (manufactured by Polymer Source Inc.)

Mn of PS segment=868,000
Mn of PMMA segment=857,000
Mn of block copolymer=1,725,000
Volume ratio between PS segment and PMMA segment (PS:PMMA)=53:47
Molecular weight distribution (Mw/Mn)=1.30
Tg of PS segment=96 degrees Celsius
Tg of PMMA segment=110 degrees Celsius
Block copolymer 2 (hereinafter referred to as "BCP-2" in an abbreviated manner as appropriate)
A block copolymer of PS and PMMA (manufactured by Polymer Source Inc.)
Mn of PS segment=750,000
Mn of PMMA segment=720,000
Mn of block copolymer=1,470,000
Volume ratio between PS segment and PMMA segment (PS:PMMA)=54:46
Molecular weight distribution (Mw/Mn)=1.21
Tg of PS segment=107 degrees Celsius
Tg of PMMA segment=134 degrees Celsius
Block copolymer 3 (hereinafter referred to as "BCP-3" in an abbreviated manner as appropriate)
A block copolymer of PS and PMMA (manufactured by Polymer Source Inc.)
Mn of PS segment=500,000
Mn of PMMA segment=480,000
Mn of block copolymer=980,000
Volume ratio between PS segment and PMMA segment (PS:PMMA)=54:46
Molecular weight distribution (Mw/Mn)=1.18
Tg of PS segment=107 degrees Celsius
Tg of PMMA segment=134 degrees Celsius
Block copolymer 4 (hereinafter referred to as "BCP-4" in an abbreviated manner as appropriate)
A block copolymer of PS and PMMA (manufactured by Polymer Source Inc.)
Mn of PS segment=270,000
Mn of PMMA segment=289,000
Mn of block copolymer=559,000
Volume ratio between PS segment and PMMA segment (PS:PMMA)=51:49
Molecular weight distribution (Mw/Mn)=1.18
Tg of PS segment=110 degrees Celsius
Tg of PMMA segment=124 degrees Celsius
Block copolymer 5 (hereinafter referred to as "BCP-5" in an abbreviated manner as appropriate)
A block copolymer of PS and PMMA (manufactured by Polymer Source Inc.)
Mn of PS segment=133,000
Mn of PMMA segment=130,000
Mn of block copolymer=263,000
Volume ratio between PS segment and PMMA segment (PS:PMMA)=54:46
Molecular weight distribution (Mw/Mn)=1.15
Tg of PS segment=110 degrees Celsius
Tg of PMMA segment=124 degrees Celsius Example 1

Toluene was added to 150 mg of the block copolymer 1 and 38 mg of Polyethylene Glycol 4000 manufactured by Tokyo Chemical Industry Co., Ltd. (Mw=3000, Mw/Mn=1.10) as polyethylene oxide so that the total amount thereof was 10 g, followed by dissolving them. Then, the solution was filtrated or filtered through a membrane filter having a pore diameter of 0.5 μm to obtain a block copolymer solution. The obtained block copolymer solution was applied, on a polyphenylene sulfide film (TORELINA manufactured by TORAY INDUSTRIRES, INC.) as a base member, in a film thickness of 200 to 250 nm, by a spin coating. The spin coating was performed at a spin speed of 500 rpm for 10 seconds, and then performed at a spin speed of 800 rpm for 30 seconds. The thin film applied by the spin coating was left at a room temperature for 10 minutes until the thin film was dried.

Subsequently, the base member on which the thin film was formed was heated for 5 hours in an oven of 170 degrees Celsius (first annealing process). Concavities and convexities were observed on the surface of the heated thin film, and it was found out that micro phase separation of the block copolymer forming the thin film was caused. The cross-section of the thin film was observed with a transmission electron microscope (TEM) (H-7100FA manufactured by Hitachi, Ltd.). As shown in the micrograph, of FIG. 5A, obtained by the transmission electron microscope, as a result of RuO4 staining, PS portions look black and PMMA portions look white.

The heated thin film as described above was subjected to an etching process as described below to selectively decompose and remove PMMA on the base member, The thin film was irradiated with ultraviolet rays at an irradiation intensity of 30 J/cm$^2$ by use of a high pressure mercury lamp. Then, the thin film was immersed in acetic acid, and was subjected to cleaning with ion-exchanged water, followed by being dried. As a result, there was formed, on the base member, a concavity and convexity pattern clearly deeper than the concavities and convexities which appeared on the surface of the thin film by the heating process.

Next, the base member was subjected to a heating process (second annealing process) for 1 hour in an oven of 140 degrees Celsius so that the concavity and convexity pattern formed by the etching process was deformed to have a chevron-shaped structure (process for forming a shape of chevrons).

About 10 nm of a thin nickel layer was formed as a current seed layer by a sputtering on the surface of the thin film, for which the process for forming the shape of chevrons had been performed. Subsequently, the base member with the thin film was subjected to an electroforming process (maximum current density: 0.05A/cm$^2$) in a nickel sulfamate bath at a temperature of 50 degrees Celsius to precipitate nickel until the thickness of nickel became 250 μm. The base member with the thin film was mechanically peeled off from the nickel electroforming body obtained as described above. Subsequently, the nickel electroforming body was immersed in Chemisol 2303 manufactured by The Japan Cee-Bee Chemical Co., Ltd., followed by being cleaned while being stirred for 2 hours at 50 degrees Celsius. Thereafter, polymer component(s) adhered to a part of the surface of the electroforming body was(were) removed by repeating the following process three times. That is, an acrylic-based UV curable resin was applied on the nickel electroforming body; and the applied acrylic-based UV curable resin was cured; and then the cured resin was peeled off.

The cross-section of the nickel electroforming body from which the polymer component was removed was observed with a scanning electron microscope (FE-SEM: S4800 manufactured by Hitachi, Ltd.). The observation is shown in FIG. 5B (magnifying magnification: 100-thousand times). It was understood from FIG. 5B that concavities and convexities of the nickel electroforming body were smooth and the cross-section of each convex portion had a smooth chevron shape having no overhang.

Subsequently, the nickel electroforming body was immersed in HD-2101TH manufactured by Daikin Chemicals Sales, Co., Ltd, for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which mold-release treatment had been performed was obtained.

Subsequently, a fluorine-based UV curable resin was applied on a PET substrate (COSMOSHINE A-4100 manufactured by Toyobo Co., Ltd.). Then, the fluorine-based UV curable resin was cured by irradiation with ultraviolet rays at 600 mJ/cm$^2$, with the obtained nickel mold being pressed thereto. After curing of the resin, the nickel mold was peeled off from the cured resin. Accordingly, a diffraction grating made of the PET substrate with the resin film to which the surface profile of the nickel mold was transferred was obtained.

Figure 5C:
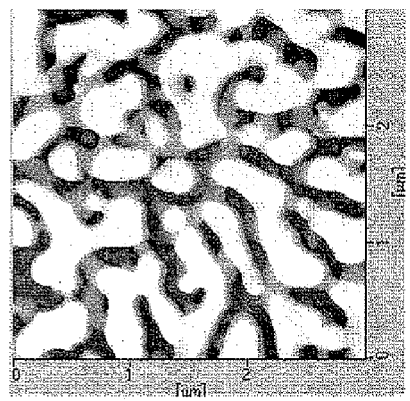
FIG. 5C is a photograph showing an analysis image, in which a result of analysis conducted on a concave and convex surface of a block copolymer from which PMMA has been selectively removed by an etching process in Example 1 by use of a scanning probe microscope is displayed on a display.
Figure 5D:
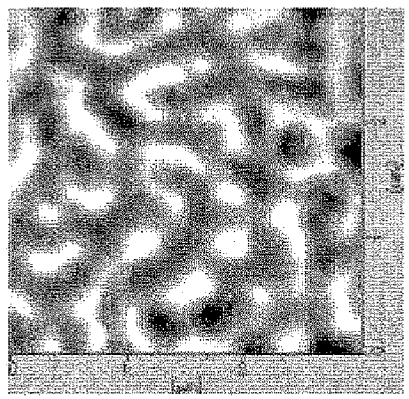
FIG. 5D is a photograph showing an analysis image, in which a result of analysis conducted on a concave and convex surface of a mold, which has been formed by electroforming in Example 1, by use of the scanning probe microscope is displayed on a display.
Figure 5E:
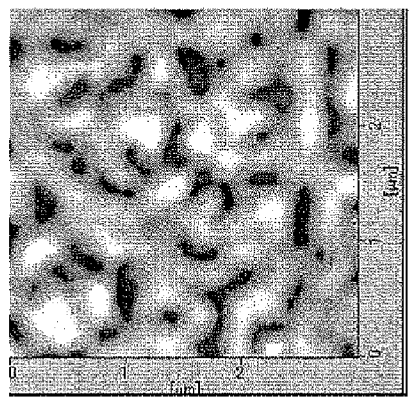
FIG. 5E is a photograph showing an analysis image, in which a result of analysis conducted on a concave and convex surface of a diffraction grating obtained in Example 1 by use of the scanning probe microscope is displayed on a display.

An analysis image of the concavity and convexity shape on the surface of the resin in the diffraction grating was obtained by using an atomic force microscope (a scanning probe microscope equipped with an environment control unit "Nanonavi II Station/E-sweep" manufactured by SII Nano-Technology Inc.). Analysis conditions of the atomic force microscope were as follows. Measurement mode: dynamic force mode Cantilever: SI-DF40 (material: Si, lever width: 40 μm, diameter of tip of chip: 10 nm)
Measurement atmosphere: in air
Measurement temperature: 25 degrees Celsius FIG. 5E shows a concavity and convexity analysis image of the surface of the resin of the obtained diffraction grating. For comparison, FIG. 5C shows a concavity and convexity analysis image of the concavity and convexity pattern of the block copolymer from which PMMA was selectively removed by the etching process, and FIG. 5D shows a concavity and convexity analysis image of the concavity and convexity pattern of the mold formed by the electroforming. The pattern shown in FIG. 5D was a pattern transferred from the pattern shown in FIG. 5C, and thus the pattern shown in FIG. 5D was the inverted pattern of the pattern shown in FIG. 5C. It was found out that patterns of FIGS. 5C, 5D, and 5E had a common pattern regularity and/or common pattern pitch, and that the concavity and convexity pattern of the block copolymer from which PMMA was selectively removed by the etching process was satisfactorily reflected by the electroforming and the transfer to the resin to be thereafter performed.

Figure 5F:
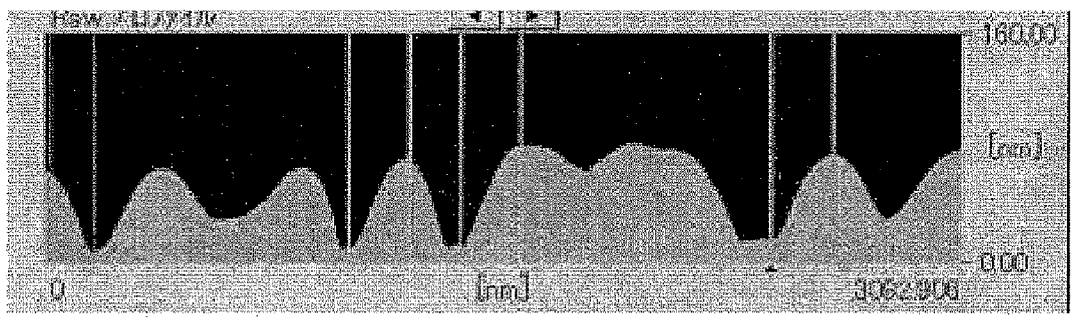
FIG. 5F is a photograph showing an analysis image, in which a result of analysis conducted on a concave and convex cross-section of the diffraction grating obtained in Example 1 by use of the scanning probe microscope is displayed on a display.

FIG. 5F shows a concavity and convexity analysis image of the cross-section in the vicinity of the surface of the resin of the obtained diffraction grating. From the concavity and convexity analysis images of the diffraction grating as shown in FIGS. 5E and 5F, Each of an average height of the concavities and convexities, an average pitch of the concavities and convexities, a Fourier-transformed image, an average value and a median of a depth distribution of the concavities and convexities, and a kurtosis of the concavities and convexities was obtained by the following methods.

<Average Height of Concavities and Convexities>

A concavity and convexity analysis image was obtained as described above by performing a measurement in a randomly selected measuring region of 3 μm square (length: 3 μm, width: 3 μm) in the diffraction grating. Distances between randomly selected concave portions and convex portions in the depth direction were measured at 100 points or more in the concavity and convexity analysis image, and the average of the distances was calculated as the average height (depth) of the concavities and convexities. The average height of the concavity and convexity pattern in the analysis image obtained in this example was 62 nm.

<Average Pitch of Concavities and Convexities>

A concavity and convexity analysis image was obtained as described above by performing a measurement in a randomly selected measuring region of 3 μm square (length: 3 μm, width: 3 μm) in the diffraction grating. Distances between randomly selected adjacent convex portions or between randomly selected adjacent concave portions were measured at 100 points or more in the concavity and convexity analysis image, and the average of the distances was calculated as the average pitch of the concavities and convexities. The average pitch of the concavity and convexity pattern in the analysis image obtained in this example was 480 nm.

<Fourier-Transformed Image>

Figure 5G:
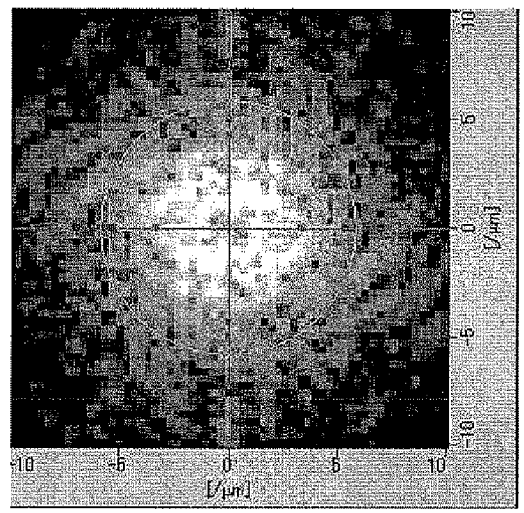
FIG. 5G is a photograph showing a Fourier-transformed image, in which a result of two-dimensional fast Fourier transform processing conducted on a concavity and convexity analysis image, which was obtained by use of an atomic force microscope, of the surface of the diffraction grating obtained in Example 1, is displayed on a display.

A concavity and convexity analysis image was obtained as described above by performing a measurement in a randomly selected measuring region of 3 μm square (length: 3 μm, width: 3 μm) in the diffraction grating. The obtained concavity and convexity analysis image was subjected to a flattening process including primary inclination correction, and then to two-dimensional fast Fourier transform processing. Thus, a Fourier-transformed image was obtained. FIG. 5G shows the obtained Fourier-transformed image. As is clear from the result shown in FIG. 5G, it was confirmed that the Fourier-transformed image showed a circular pattern substantially centered at an origin at which an absolute value of wavenumber was 0 μm$^{-1}$, and that the circular pattern was present within a region where the absolute value of wavenumber was within a range of 10 μm$^{-1}$ or less.

The circular pattern of the Fourier-transformed image is a pattern observed due to gathering of bright spots in the Fourier-transformed image. The term "circular" herein means that the pattern of the gathering of the bright spots looks like a substantially circular shape, and is a concept further including a case where a part of a contour looks like a convex shape or a concave shape. The gathering of the bright spots may look like a substantially annular shape, and this case is expressed as the term "annular". It is noted that the term "annular" is a concept further including a case where a shape of an outer circle or inner circle of the ring looks like a substantially circular shape and further including a case where a part of the contours of the outer circle and/or the inner circle of the ring looks like a convex shape or a concave shape. Further, the phrase "the circular or annular pattern is present within a region where an absolute value of wavenumber is within a range of 10 μm$^{-1}$ or less (more preferably from 1.25 to 10 μm$^{-1}$, further preferably from 1.25 to 5 μm$^{-1}$)" means that 30% or more (more preferably 50% or more, further more preferably 80% or more, and particularly preferably 90% or more) of bright spots forming the Fourier-transformed image are present within a region where the absolute value of wavenumber is within a range of 10 μm$^{-1}$ or less (more preferably from 1.25 to 10 μm$^{-1}$, and further preferably from 1.25 to 5 μm$^{-1}$).

The two-dimensional fast Fourier transform processing on the concavity and convexity analysis image can be easily performed by electronic image processing using a computer equipped with software for two-dimensional fast Fourier transform processing.

<Average Value and Median of Depth Distribution of Concavities and Convexities>

A concavity and convexity analysis image was obtained by performing a measurement in a randomly selected measuring region of 3 μm square (length: 3 μm, width: 3 μm) in the diffraction grating. Here, data of each of the heights of the concavities and convexities was determined at 16384 (128 columns×128 rows) or more measuring points in the measuring region on the nanometer scale. By using E-sweep in this example, a measurement at 65536 points (256 columns×256 rows) (a measurement with a resolution of 256 pixels×256 pixels) was conducted in a measuring region of 3 μm square. Regarding the thus measured heights (unit: nm) of the concavities and convexities, first, a measuring point P which had the largest height from the surface of the substrate among all the measuring points was determined. Then, while a plane which included the measuring point P and was parallel to the surface of the substrate was taken as a reference plane (horizontal plane), values of depths from the reference plane (the differences each obtained by subtracting the height from the substrate at one of the measuring points from the value of the height from the substrate at the measuring point P) were determined as concavity and convexity depth data. The concavity and convexity depth data could be determined by automatic calculation with software provided in E-sweep. The values determined by automatic calculation could be used as the concavity and convexity depth data. After the concavity and convexity depth data was determined at each measuring point as described above, the average value (m) of the depth distribution of the concavities and convexities could be determined by calculation according to the following formula (I):

$$m = \frac{1}{N}\sum_{i=1}^{N} x_i \quad (I)$$

In the formula (I), N represents a total number of measuring points (the number of all the pixels), i represents any integer of 1 to N, $x_i$ represents the concavity and convexity depth data at the i-th measuring point, and m represents the average value of the depth distribution of the concavities and convexities. Further, the median (M) of the depth distribution of the concavities and convexities could be determined as follows, The concavity and convexity depth data $x_i$ at all the 1 to N-th measuring points were rearranged in ascending order, and expressed as $x_{(i)}$ (in this case, the order of the heights was as follows: $x_{(1)} < x_{(2)} < x_{(3)} < \ldots < x_{(N)}$). Then, the median (M) could be determined by calculation according to one of the following formulae (II) depending on whether N was an odd number or an even number:

$$\left. \begin{array}{l} \text{(In a case where } N \text{ was odd number)} \\ M = x_{((N+1)/2)} \\ \text{(In a case where } N \text{ was even number)} \\ M = \frac{x_{(N/2)} + x_{((N/2)+1)}}{2} \end{array} \right\} \quad (II)$$

In the formulae (II), N represents the total number of measuring points (the number of all the pixels), and M represents the median of the depth distribution of the concavities and convexities. The average value (m) of the depth distribution of the concavities and convexities in the diffraction grating obtained in this example was 52.21 nm and the median (M) of the depth distribution of the concavities and convexities was 57.00 nm.

<Kurtosis of Concavities and Convexities>

Similar to the method for measuring the median (M) of the depth distribution and the average value (m) of the depth distribution, data of each of the heights of the concavities and convexities was determined at 16384 (128 columns×128 rows) or more measuring points in the measuring region of 3 μm square. In this example, a measurement was performed adopting 65536 measuring points (256 columns×256 rows). Thereafter, the average value (m) of the depth distribution of the concavities and convexities and the standard deviation (a) of the depth distribution of the concavities and convexities were calculated on the basis of the concavity and convexity depth data of the measuring points. Note that, the average value (m) could be determined by calculation according to the above-described formula (I) as described above. Meanwhile, the standard deviation (a) of the depth distribution could be determined by calculation according to the following formula (III):

$$\sigma = \sqrt{\frac{1}{N}\sum_{i=1}^{N}(x_i - m)^2} \quad (III)$$

In the formula (III), N represents a total number of measuring points (the number of all the pixels), $x_i$ represents the concavity and convexity depth data at the i-th measuring point, and m represents the average value of the depth distribution of the concavities and convexities. Subsequently, on the basis of the thus determined values of the average value (m) and the standard deviation (a), the kurtosis (k) could be determined by calculation according to the following formula (IV):

$$k = \frac{\frac{1}{N}\sum_{i=1}^{N}(x_i - m)^4}{\sigma^4} - 3 \quad (IV)$$

In formula (IV), N represents the total number of measuring points (the number of all the pixels), $x_i$ represents the concavity and convexity depth data at the i-th measuring point, m represents the average value of the depth distribution of the concavities and convexities, and a represents a value of the standard deviation. The Kurtosis of concavities and convexities in the diffraction grating obtained in this example was −0.546.

<Manufacture of Organic EL Element>

On the UV curable resin film as the diffraction grating obtained as described above, a transparent electrode (ITO, thickness: 120 nm), a hole transporting layer (N,N-diphenyl-N,N-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element having a structure as shown in FIG. 4 was obtained.

Example 2

Toluene was added to 120 mg of the block copolymer 2 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 vim to obtain a block copolymer solution.

Subsequently, 0.7 g of octadecyldimethylchlorosilane (ODS) was added to 500 ml of heptane, followed by being stirred to prepare 2.0 mM of ODS solution. A glass substrate after cleaning having a thickness of 1.1 mm was immersed in the solution and stationarily placed for 24 hours. This processed substrate was subjected to ultrasonic cleaning with chloroform for 10 minutes and then subjected to ultrasonic cleaning with pure water for 10 minutes, followed by being dried. Accordingly, an ODS-processed glass substrate was obtained.

The obtained block copolymer solution was applied, on the ODS-processed glass substrate, in a film thickness of 200 to 250 nm, by a spin coating to form a thin film. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the substrate was heated for 3 hours in an oven of 160 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried. By performing the etching process, PMMA on the substrate was selectively removed to obtain a thin film with a minute concavity and convexity pattern.

The base member was subjected to a heating process (second annealing process) for 3 hours in an oven of 125 degrees Celsius so that the thin film was subjected to a process for forming a shape of chevrons.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 μm. The base member on which the nickel was deposited as described above was mechanically peeled off from the nickel electroforming body. The nickel electroforming body from which the base member was peeled off was immersed in Chemisol 2303 manufactured by The Japan Cee-Bee Chemical Co., Ltd., followed by being cleaned while being stirred for 2 hours at 50 degrees Celsius. Thereafter, the nickel electroforming body was immersed in a tetrahydrofuran solution and an ultrasonic cleaning process was carried out for 30 minutes. Polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd, for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained.

Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a UV curable resin film to which the surface profile of the nickel mold was transferred was obtained. Again, the fluorine-based UV curable resin was applied on a PET substrate (COSMOSHINE A-4100 manufactured by Toyobo Co., Ltd.). After the UV curable resin film was pressed against the fluorine-based UV curable resin, the fluorine-based UV curable resin was cured by irradiation with ultraviolet rays at 600 mJ/cm$^2$ and then the UV curable resin film was peeled off. Accordingly, a second UV curable resin film was obtained. Further, the fluorine-based UV curable resin was applied on a glass for which a silane coupling process had been performed. After the second UV curable resin film was pressed against the fluorine-based UV curable resin, the fluorine-based UV curable resin was cured by irradiation with ultraviolet rays at 600 mJ/cm$^2$ and then the second UV curable resin film was peeled off. Accordingly, a diffraction grating in which a pattern was formed on the glass substrate was obtained. For the concavity and convexity pattern of the diffraction grating, the concavity and convexity shape on the surface was analyzed by using the atomic force microscope in the same manner as Example 1 to obtain an analysis image. Analysis conditions of the atomic force microscope were the same as those in Example 1.

Figure 6A:
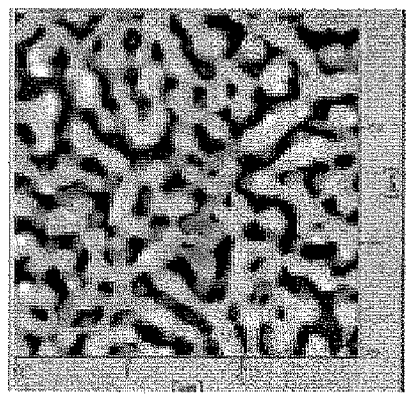
FIG. 6A is a photograph showing an analysis image, in which a result of analysis conducted on a concave and convex surface of a block copolymer from which PMMA has been selectively removed by the etching process in Example 2 by use of the scanning probe microscope is displayed on a display.
Figure 6B:
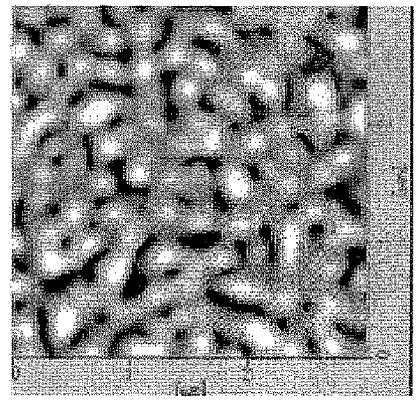
FIG. 6B is a photograph showing an analysis image, in which a result of analysis conducted on a concave and convex surface of a block copolymer treated to have a shape of chevrons by a second annealing process after the etching process in Example 2 by use of the scanning probe microscope is displayed on a display.
Figure 6C:
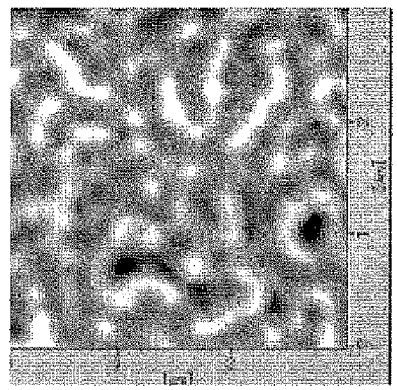
FIG. 6C is a photograph showing an analysis image, in which a result of analysis conducted on a concave and convex surface of a mold formed by the electroforming in Example 2 by use of the scanning probe microscope is displayed on a display.
Figure 6D:
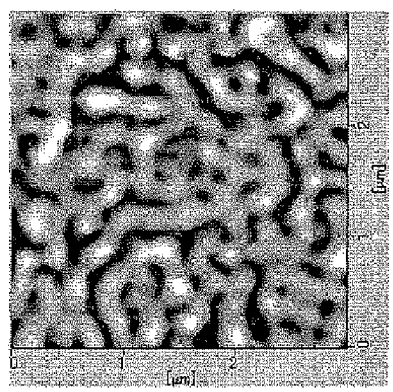
FIG. 6D is a photograph showing an analysis image, in which a result of analysis conducted on a concave and convex surface of a diffraction grating obtained in Example 2 by use of the scanning probe microscope is displayed on a display.

FIG. 6D shows the obtained concavity and convexity analysis image. For comparison, FIG. 6A shows a concavity and convexity analysis image of the concavity and convexity pattern of the block copolymer from which PMMA was selectively removed by the etching process; FIG. 6B shows a concavity and convexity analysis image of the concavity and convexity pattern for which the process for forming the shape of chevrons was performed in the second anneal step after the etching process; and FIG. 6C shows a concavity and convexity analysis image of the concavity and convexity pattern of the mold formed by the electroforming. The pattern shown in FIG. 6C was the inverted pattern of those shown in FIGS. 6A, 6B, and 6D. It was found out that patterns of FIGS. 6A, 6B, 6C, and 6D had a common pattern regularity and/or common pattern pitch, and that the planar shape of the concavity and convexity pattern of the block copolymer from which PMMA was selectively removed by the etching process was satisfactorily reflected by the second heating, the electroforming, and the transfer to the resin to be thereafter performed.

Figure 6E:
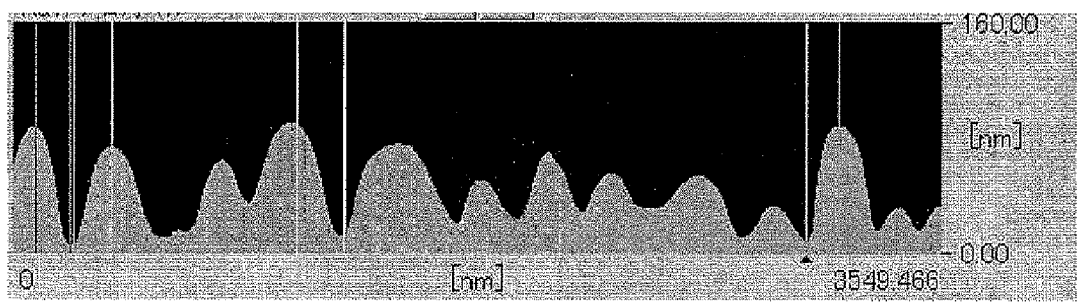
FIG. 6E is a photograph showing an analysis image, in which a result of analysis conducted on a concave and convex cross-section of the diffraction grating obtained in Example 2 by use of the scanning probe microscope is displayed on a display.

FIG. 6E shows a concavity and convexity analysis image of the cross-section in the vicinity of the surface of the obtained diffraction grating. From the analysis images (FIGS. 6D and 6E) of the surfaces of the diffraction grating, an average height of the concavities and convexities, an average pitch of the concavities and convexities, an average value (m) and a median (M) of a depth distribution of the concavities and convexities, and a kurtosis of the concavities and convexities of the diffraction grating were each obtained in the same manner as Example 1. The results thereof are described as follows.

Average height: 55 nm
Average pitch: 320 nm
Average value (m) of depth distribution: 44.93 nm
Median (M) of depth distribution: 45.7 nm
Kurtosis: −1.13

Figure 6F:
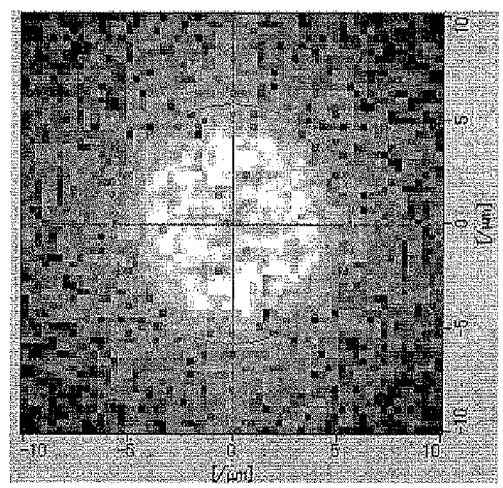
FIG. 6F is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 2, is displayed on a display.

FIG. 6F shows a Fourier-transformed image obtained from the analysis images. As is apparent from the result shown in FIG. 6F, it was observed that the Fourier-transformed image showed a circular pattern substantially centered at an origin at which an absolute value of wavenumber was 0 μm$^{-1}$, and that the circular pattern was present within a region where the absolute value of wavenumber was within a range of 10 μm$^{-1}$ or less.

<Manufacture of Organic EL Element>

On the glass substrate with the pattern made of the fluorine-based UV curable resin as the diffraction grating obtained as described above, a transparent electrode (ITO, thickness: 120 nm), a hole transporting layer (N,N'-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

<Evaluation of Light Emission Efficiency of Organic EL Element>

A light emission efficiency of the organic EL element obtained in this example was measured by the following method. That is, voltage was applied to the obtained organic EL element, and then the applied voltage V and current I flowing through the organic EL element were measured with a source measurement instrument (manufactured by ADC CORPORATION, R6244), and a total luminous flux amount L was measured with a total flux measurement apparatus manufactured by Spectra Co-op. From the thus obtained measured value of the applied voltage V, the current I, and the total luminous flux amount L, a luminance value L' was calculated. Here, for the current efficiency, the following calculation formula (F1) was used:

$$\text{Current efficiency} = (L'/I) \times S \quad (F1)$$

and, for the power efficiency, the following calculation formula (F2) was used:

$$\text{Power efficiency} = (L'/I/V) \times S \quad (F2)$$

Figure 6G:
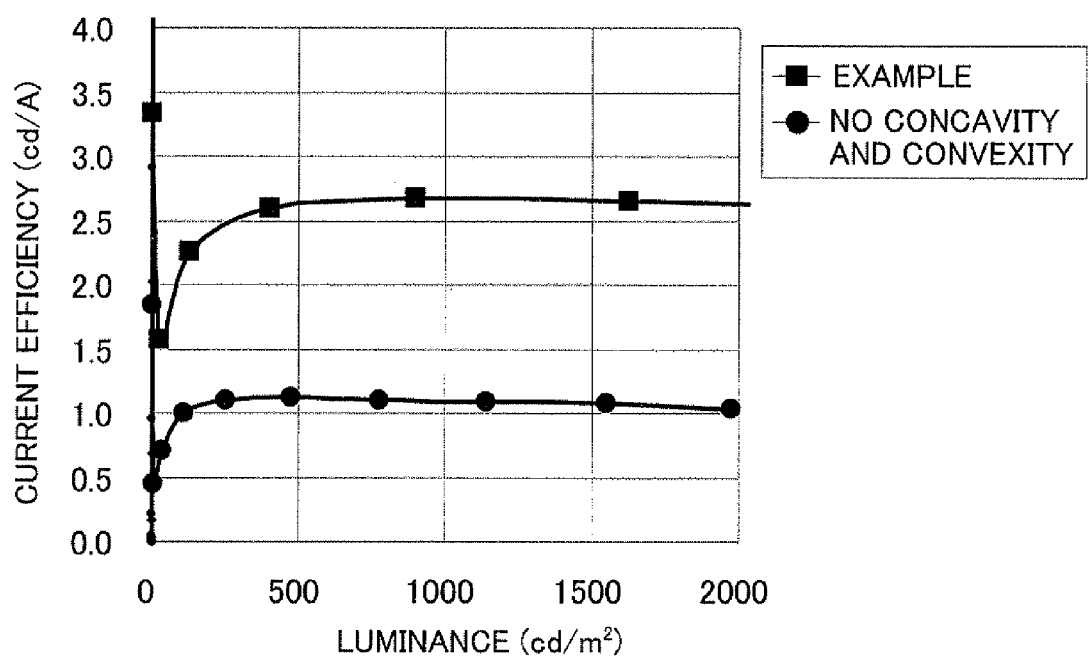
FIG. 6G is a graph showing a relation between a current efficiency and a luminance L' of an organic EL element obtained in Example 2.
Figure 6H:
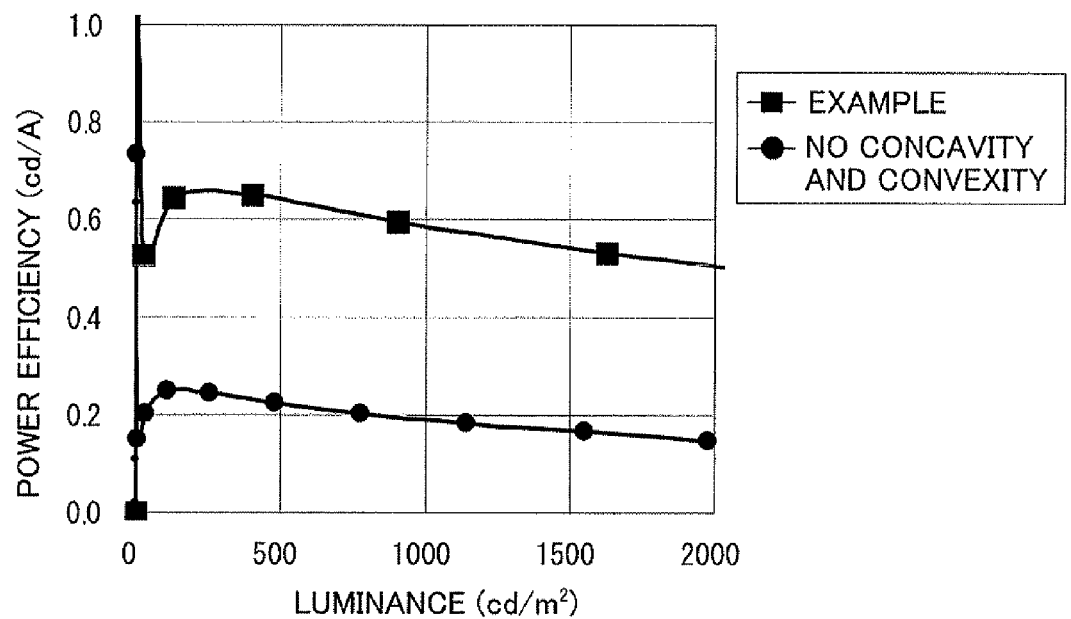
FIG. 6H is a graph showing a relation between a power efficiency and the luminance L' of the organic EL element obtained in Example 2.

Accordingly, the current efficiency and the power efficiency of the organic EL element were calculated. In the above formulae, S is a light-emitting or luminescent area of the organic EL element. FIG. 6G shows a graph showing change of the current efficiency of the organic EL element obtained by using the above formula with respect to the luminance L'. Further, FIG. 6H shows a graph showing change of the power efficiency of the organic EL element calculated by using the above formula with respect to the luminance L'. In each of FIG. 6G and FIG. 6H, square marks indicate results of this example and circular dots indicate results of the organic EL element produced by stacking each layer on a glass substrate in which no concavity and convexity pattern of the diffraction grating is formed, in the same manner as described above. Noted that the value of the luminance L' was calculated on the assumption that light distribution characteristic of the organic EL element followed Lambert's law. The following calculation formula (F3) was used:

$$L' = L/\pi/S \quad (F3)$$

From the result shown in FIG. 6O, it was found that the current efficiency of the organic EL element of this example at a luminance of 500 to 2000 cd/m$^2$ was about 2.5 times that of the organic EL element having no concavity and convexity on the glass substrate. Further, from the result shown in FIG. 6H, it was found that the current efficiency of the organic EL element of this example at the luminance of 500 to 2000 cd/m$^2$ was about 3 times that of the organic EL element having no concavity and convexity on the glass substrate. Therefore, the organic EL element of the present invention had an external extraction efficiency sufficiently.

<Evaluation of Light Emission Directivity of Organic EL Element>

The directivity of light emission of the organic EL element obtained in this example was evaluated by the following method. That is, the organic EL element in a luminescent state was visually observed in all the directions (directions of all around) 360°. Neither particularly bright sites nor particularly dark sites were observed when the organic EL element obtained in Example 2 was observed in any of the directions of all around 360°, and the brightness was uniform in all the directions. In this way, it was shown that the directivity of light emission of the organic EL element of the present invention was sufficiently low.

Example 3

Toluene was added to 120 mg of the block copolymer 2 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 µm to obtain a block copolymer solution.

Subsequently, 170 mg of methyltrimethoxysilane (MTMS) and 89 mg of 1,2-bis(trimethoxysilyl)ethane (BT-MSE) were added to 4.75 g of methylisobutylketone, followed by being stirred to prepare methyltrimethoxysilane/1,2-bis(trimethoxysilyl)ethane solution. This solution was applied on a glass substrate after cleaning having a thickness of 1.1 mm by a spin coating to obtain a glass substrate with a coating film made of methyltrimethoxysilane/1,2-bis(trimethoxysilyl)ethane. The spin coating was performed at a spin speed of 500 rpm for 10 seconds, and then performed at a spin speed of 800 rpm for 30 seconds. The glass substrate with the coating film was sintered for 6 hours in a nitrogen atmosphere at a temperature of 280 degrees Celsius to obtain an organo silicate processed glass substrate.

The obtained block copolymer solution was applied, on the organo silicate processed glass substrate, in a film thickness of 200 to 250 nm, by a spin coating, to form a thin film. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the base member was heated for 6 hours in an oven of 160 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried. By performing the etching process, PMMA on the substrate was selectively removed to obtain a thin film with a minute concavity and convexity pattern.

The base member was subjected to a heating process (second annealing process) for 1 hour in an oven of 125 degrees Celsius so that the thin film was subjected to a process for forming a shape of chevrons.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 µm. The base member on which the nickel was deposited as described above was immersed in a tetrahydrofuran solution, and then the base member was peeled off from the nickel electroforming body. The nickel electroforming body from which the base member was peeled off was immersed in the tetrahydrofuran solution and an ultrasonic cleaning process was carried out for 30 minutes. Polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute, Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a UV curable resin film to which the surface profile of the nickel mold was transferred was obtained. Further, the fluorine-based UV curable resin was applied on a glass for which a silane coupling process had been performed. After the UV curable resin film was pressed against the fluorine-based UV curable resin, the fluorine-based UV curable resin was cured by irradiation with ultraviolet rays at 600 mJ/cm$^2$ and then the UV curable resin film was peeled off. Accordingly, a diffraction grating formed of the glass substrate was obtained. For the concavity and convexity pattern of the diffraction grating, the concavity and convexity shape on the surface was analyzed by using the atomic force microscope used in Example 1 to obtain an analysis image. Analysis conditions of the atomic force microscope were the same as those in Example 1.

Figure 7A:
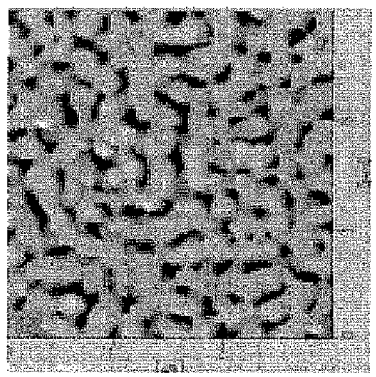
FIG. 7A is a photograph showing an analysis image, in which a result of analysis conducted on a concave and convex surface of a block copolymer from which PMMA has been selectively removed by the etching process in Example 3 by use of the scanning probe microscope is displayed on a display.
Figure 7B:
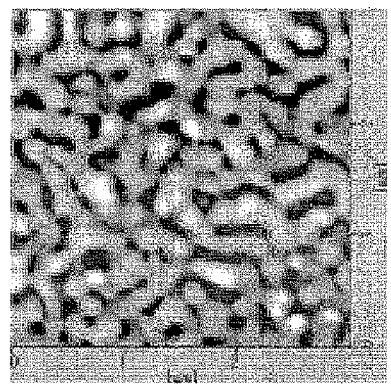
FIG. 7B is a photograph showing an analysis image, in which a result of analysis conducted on a concave and convex surface of a block copolymer treated to have the shape of chevrons by the second annealing process after the etching process in Example 3 by use of the scanning probe microscope is displayed on a display.
Figure 7C:
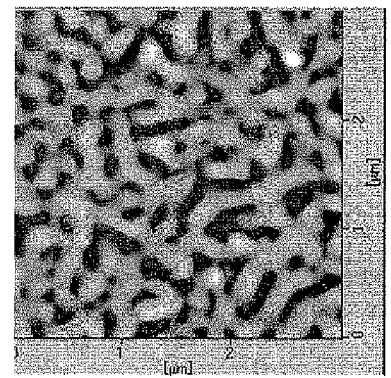
FIG. 7C is a photograph showing an analysis image, in which a result of analysis conducted on a concave and convex surface of a diffraction grating obtained in Example 3 by use of the scanning probe microscope is displayed on a display.

FIG. 7C shows the obtained concavity and convexity analysis image. For comparison, FIG. 7A shows a concavity and convexity analysis image of the concavity and convexity pattern of the block copolymer from which PMMA was selectively removed by the etching process; and FIG. 7B shows a concavity and convexity analysis image of the concavity and convexity pattern for which the process for forming the shape of chevrons was performed in the second anneal step after the etching process. It was found out that the patterns shown in FIGS. 7A, 7B, and 7C had a common pattern regularity and/or common pattern pitch and that the planar shape of the concavity and convexity pattern of the block copolymer from which PMMA was selectively removed by the etching process was satisfactorily reflected by the second heating process and the transfer of the mold to the resin.

Figure 7D:
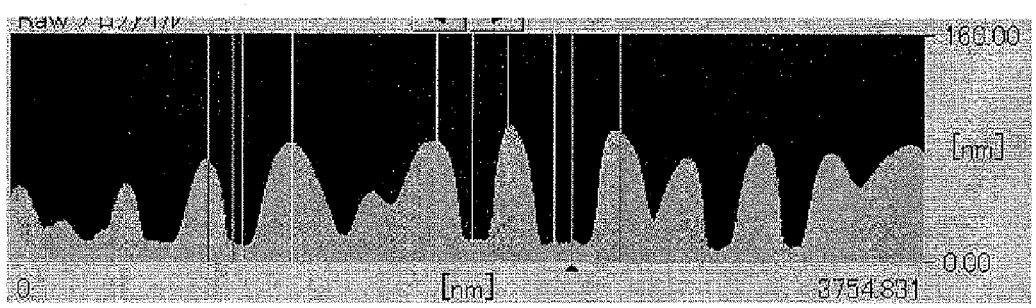
FIG. 7D is a photograph showing an analysis image, in which a result of analysis conducted on a concave and convex cross-section of the diffraction grating obtained in Example 3 by use of the scanning probe microscope is displayed on a display.

FIG. 7D shows a concavity and convexity analysis image of the cross-section in the vicinity of the surface of the obtained diffraction grating. From the analysis images of the surfaces of the diffraction grating, an average height of the concavities and convexities, an average pitch of the concavities and convexities, an average value (m) and a median (M) of a depth distribution of the concavities and convexities, and a kurtosis of the concavities and convexities of the diffraction grating were each obtained in the same manner as Example 1. The results thereof are described as follows.
Average height: 61 nm
Average pitch: 310 nm
Average value (m) of depth distribution: 48.69 nm
Median (M) of depth distribution: 50.41 nm
Kurtosis: −1.17

Figure 7E:
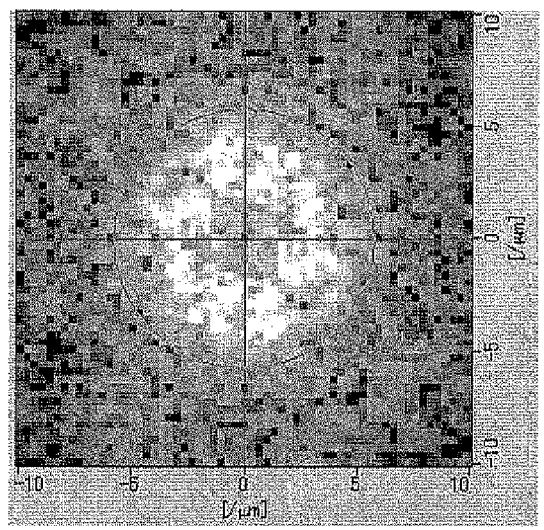
FIG. 7E is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 3, is displayed on a display.

FIG. 7E shows a Fourier-transformed image obtained from the analysis images. As is apparent from the result shown in FIG. 7E, it was observed that the Fourier-transformed image showed a circular pattern substantially centered at an origin at which an absolute value of wavenumber was 0 µm$^{-1}$, and that the circular pattern was present within a region where the absolute value of wavenumber was within a range of 10 µm$^{-1}$ or less.

On the glass substrate with the concavities and convexities as the diffraction grating obtained as described above, a transparent electrode (ITO, thickness: 120 nm), a hole transporting layer (N,N'-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

Example 4

Toluene was added to 120 mg of the block copolymer 3 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 µm to obtain a block copolymer solution.

170 mg of methyltrimethoxysilane (MTMS) and 89 mg of 1,2-bis(trimethoxysilyl)ethane (BTMSE) were added to 4.75 g of methylisobutylketone, followed by being stirred to prepare methyltrimethoxysilane/1,2-bis(trimethoxysilyl)ethane solution. This solution was applied on a glass substrate after cleaning having a thickness of 1.1 mm by a spin coating to obtain a glass substrate with a coating film made of methyltrimethoxysilane/1,2-bis(trimethoxysilyl)ethane. The spin coating was performed at a spin speed of 500 rpm for 10 seconds, and then performed at a spin speed of 800 rpm for 30 seconds. Subsequently, the glass substrate with the coating film was sintered for 6 hours in a nitrogen atmosphere at a temperature of 300 degrees Celsius to obtain an organo silicate processed glass substrate.

The obtained block copolymer solution was applied, on the organo silicate processed glass substrate, in a film thickness of 200 to 250 nm, by a spin coating. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the substrate was heated for 6 hours in an oven of 160 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30.1/cm$^2$ by use of a high pressure mercury lamp. Then, the thin film was immersed in acetone, and was subjected to cleaning with ion-exchanged water, followed by being dried. By performing the etching process, PMMA on the substrate was selectively removed to obtain a thin film with a minute concavity and convexity pattern.

The base member was subjected to a heating process (second annealing process) for 1 hour in an oven of 125 degrees Celsius so that the thin film was subjected to a process for forming a shape of chevrons.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 μm. The base member on which the nickel was deposited as described above was mechanically peeled off from the nickel electroforming body. Then, the following process was repeated three times. An acrylic-based UV curable resin was applied on the nickel electroforming body from which the base member was peeled off; the applied acrylic-based UV curable resin was cured; and then the cured resin was peeled off. Further, the nickel electroforming body was immersed in Chemizol 2303 manufactured by The Japan Cee-Bee Chemical Co., Ltd., followed by being cleaned while being stirred for 2 hours at a temperature of 50 degrees Celsius. Accordingly, polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a silicone-based polymer [a resin composition of a mixture of 90% by mass of a silicone rubber (manufactured by Wacker Chemie AG under the product name of "Elastosil RT601") and 10% by mass of a curing agent] was applied onto the nickel mold by a dropping method, then cured by being heated at 50 degrees Celsius for 1 hour, and thereafter detached from the nickel mold. Thus, a silicone rubber to which the surface profile of the nickel mold was transferred was obtained. Further, a fluorine-based UV curable resin was applied on a glass for which a silane coupling process had been performed. After the silicone rubber was pressed against the fluorine-based UV curable resin, the fluorine-based UV curable resin was cured by irradiation with ultraviolet rays at 600 mJ/cm$^2$ and then the silicone rubber was peeled off. Accordingly, a diffraction grating formed of the glass substrate, in which the concavity and convexity pattern of a fluorine-based resin was formed, was obtained.

For the concavity and convexity pattern of the diffraction grating, the concavity and convexity shape on the surface was analyzed by using the atomic force microscope used in Example 1 to obtain an analysis image. Analysis conditions of the atomic force microscope were the same as those in Example 1.

Figure 8A:
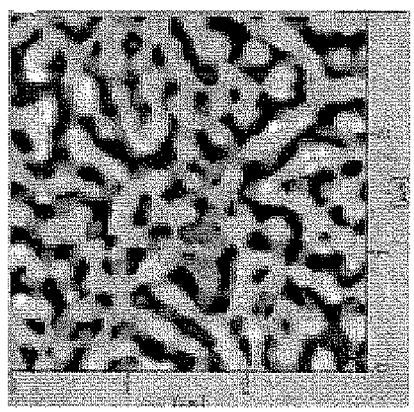
FIG. 8A is a photograph showing an analysis image, in which a result of analysis conducted on a concave and convex surface of a block copolymer from which PMMA has been selectively removed by the etching process in Example 4 by use of the scanning probe microscope is displayed on a display.
Figure 8B:
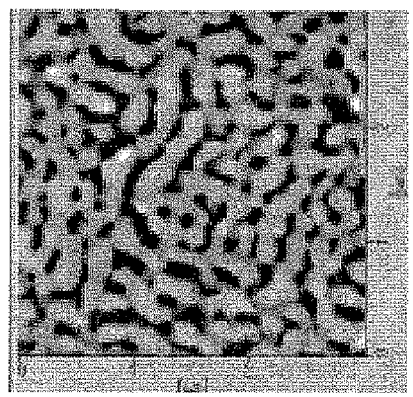
FIG. 8B is a photograph showing an analysis image, in which a result of analysis conducted on a concave and convex surface of a block copolymer treated to have the shape of chevrons by the second annealing process after the etching process in Example 4 by use of the scanning probe microscope is displayed on a display.
Figure 8C:
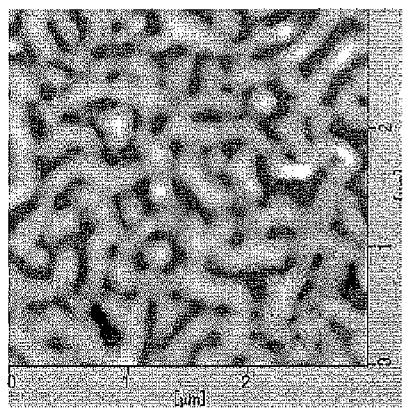
FIG. 8C is a photograph showing an analysis image, in which a result of analysis conducted on a concave and convex surface of a diffraction grating obtained in Example 4 by use of the scanning probe microscope is displayed on a display.

FIG. 8C shows the obtained concavity and convexity analysis image. For comparison, FIG. 8A shows a concavity and convexity analysis image of the concavity and convexity pattern of the block copolymer from which PMMA was selectively removed by the etching process; and FIG. 8B shows a concavity and convexity analysis image of the concavity and convexity pattern for which the process for forming the shape of chevrons was performed in the second anneal step after the etching process. It was found out that the patterns shown in FIGS. 8A, 8B, and 8C had a common pattern regularity and/or common pattern pitch and that the planar shape of the concavity and convexity pattern of the block copolymer from which PMMA was selectively removed by the etching process was satisfactorily reflected by the second annealing process and the transfer of the mold to the resin.

Figure 8D:
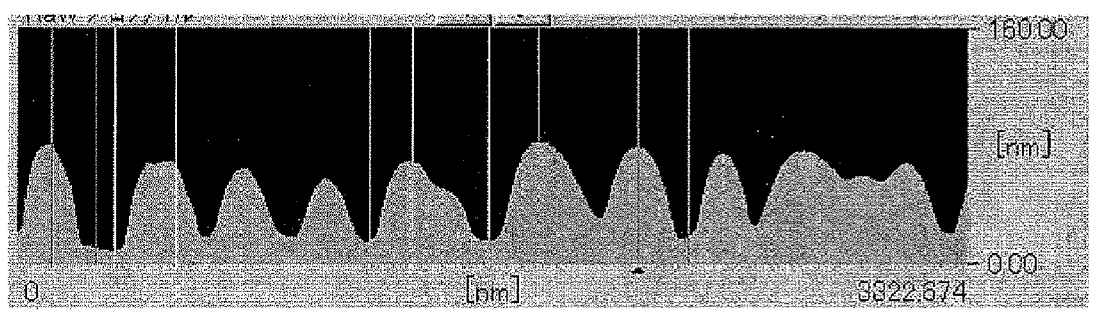
FIG. 8D is a photograph showing an analysis image, in which a result of analysis conducted on a concave and convex cross-section of the diffraction grating obtained in Example 4 by use of the scanning probe microscope is displayed on a display.

FIG. 8D shows a concavity and convexity analysis image of the cross-section in the vicinity of the surface of the obtained diffraction grating. From the analysis images of the surfaces of the diffraction grating, an average height of the concavities and convexities, an average pitch of the concavities and convexities, an average value (m) and a median (M) of a depth distribution of the concavities and convexities, and a kurtosis of the concavities and convexities of the diffraction grating were each obtained in the same manner as Example 1. The results thereof are described as follows.

Average height: 58 nm
Average pitch: 300 nm
Average value (m) of depth distribution: 51.96 nm
Median (M) of depth distribution: 55.56 nm
Kurtosis: −1.142

Figure 8E:
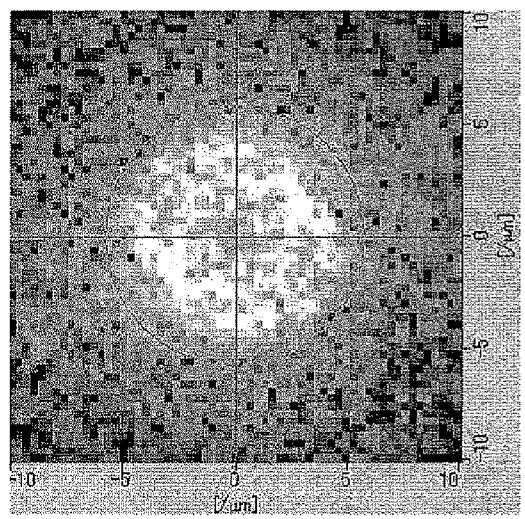
FIG. 8E is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 4, is displayed on a display.

FIG. 8E shows a Fourier-transformed image obtained from the analysis images. As is apparent from the result shown in FIG. 8E, it was observed that the Fourier-transformed image showed a circular pattern substantially centered at an origin at which an absolute value of wavenumber was 0 μm$^{-1}$, and that the circular pattern was present within a region where the absolute value of wavenumber was within a range of 10 μm$^{-1}$ or less.

On the UV curable resin film as the diffraction grating obtained as described above, a transparent electrode (ITO, thickness: 120 nm), a hole transporting layer (N,N'-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

<Evaluation of Light Emission Efficiency of Organic EL Element>

Figure 8F:
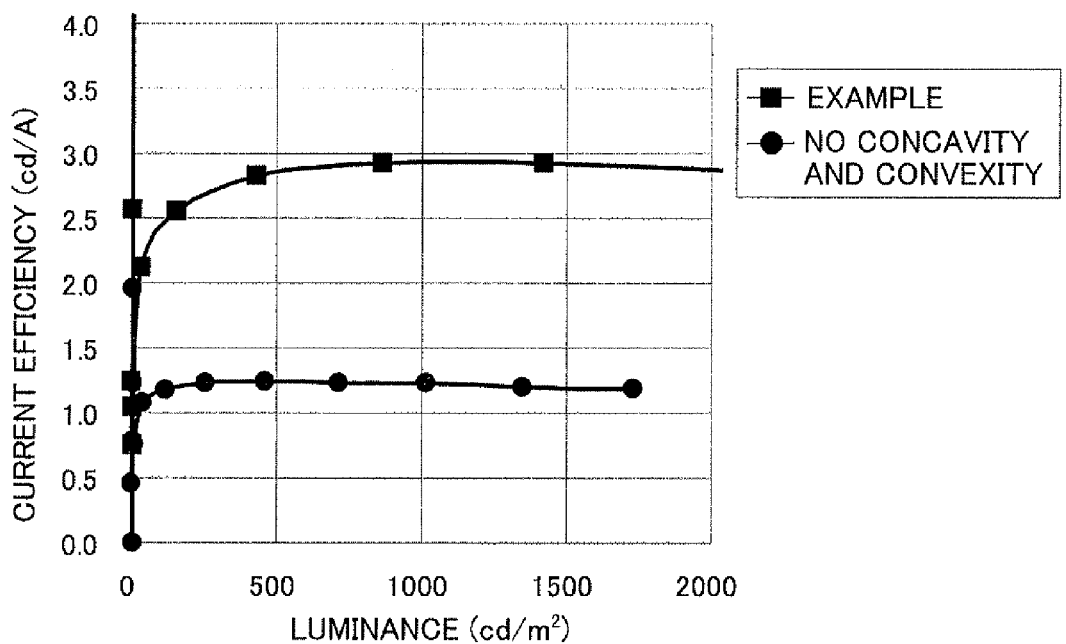
FIG. 8F is a graph showing a relation between a current efficiency and a luminance L' of an organic EL element obtained in Example 4.
Figure 8G:
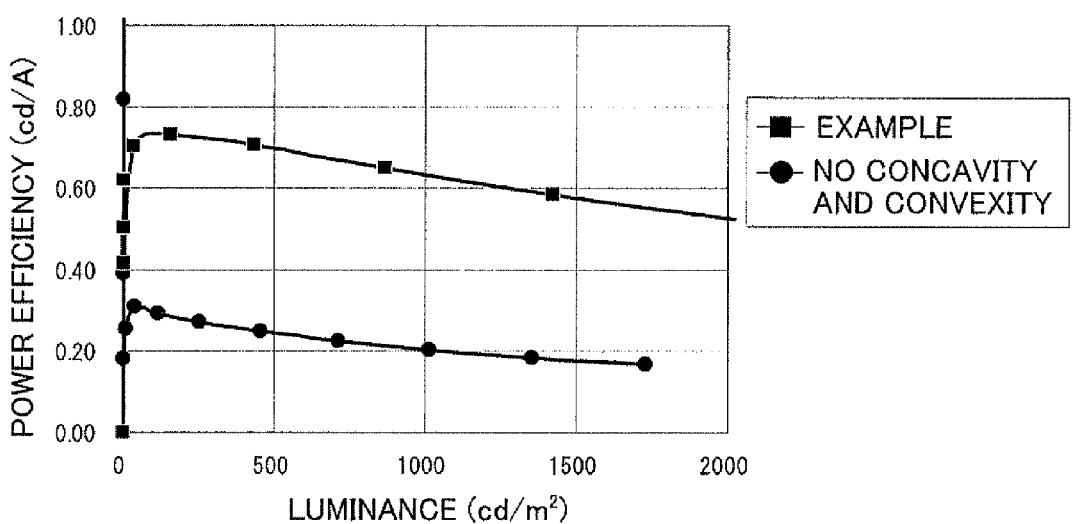
FIG. 8G is a graph showing a relation between a power efficiency and the luminance L' of the organic EL element obtained in Example 4.

A light emission efficiency of the organic EL element obtained in this example was measured in the same manner as Example 2. FIG. 8F shows a relation between a current efficiency and a luminance L' of the organic EL element; FIG. 8G shows a relation between a power efficiency and the luminance L' of the organic EL element. In each of FIG. 8F and FIG. 8G, square marks indicate results of this example and circular dots indicate results of the organic EL element produced by stacking each layer on a glass substrate in which the concavity and convexity pattern of the diffraction grating is not formed, in the same manner as described above. From the result shown in FIG. 5F, it was found that the current efficiency of the organic EL element of this example at a luminance of 500 to 2000 cd/m$^2$ was more than twice that of the organic EL element having no concavity and convexity on the glass substrate. Further, from the result shown in FIG. 8G, it was found that the current efficiency of the organic EL element of this example at the luminance of 500 to 2000 cd/m$^2$ was about 3 times that of the organic EL element having no concavity and convexity on the glass substrate. Therefore, the organic EL element of the present invention had an external extraction efficiency sufficiently.

<Evaluation of Light Emission Directivity of Organic EL Element>

The directivity of light emission of the organic EL element obtained in this example was evaluated in the similar manner as Example 2. That is, the organic EL element in a luminescent state was visually observed in all the directions (directions of all around 360°). Neither particularly bright sites nor particularly dark sites were observed when the organic EL element obtained in Example 4 was observed in any of the directions of all around 360°, and the brightness was uniform in all the directions. In this way, it was shown that the directivity of light emission of the organic EL element of the present invention was sufficiently low.

Example 5

Toluene was added to 150 mg of the block copolymer 4 and 23 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 μm to obtain a block copolymer solution.

Subsequently, 0.7 g of octadecyl trichlorosilane (OTS) was added to 500 ml of heptane, followed by being stirred to prepare 2.0 mM of OTS solution. A glass substrate after cleaning having a thickness of 1.1 mm was immersed in the solution and stationarily placed for 24 hours. This processed substrate was subjected to ultrasonic cleaning with chloroform for 10 minutes and then subjected to ultrasonic cleaning with pure water for 10 minutes, followed by being dried. Accordingly, an OTS-processed glass substrate was obtained.

The obtained block copolymer solution was applied, on the OTS-processed glass substrate, in a film thickness of 200 to 250 nm, by a spin coating. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the base member was heated for 8 hours in an oven of 150 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried. By performing the etching process, PMMA on the base member was selectively removed to obtain a thin film with a minute concavity and convexity pattern.

The base member was subjected to a heating process (second annealing process) for 1 hour in an oven of 125 degrees Celsius so that the thin film was subjected to a process for forming a shape of chevrons.

Subsequently, about 30 nm of a thin nickel layer was formed on the surface of the thin film by a vapor deposition method. Then, the base member was subjected to an electroforming process under the same condition as Example 1 in a nickel sulfamate bath to precipitate nickel until the thickness of nickel became 250 μm. The base member on which the nickel was deposited as described above was mechanically peeled off from the nickel electroforming body. Then, the following process was repeated three times. An acrylic-based UV curable resin was applied on the nickel electroforming body from which the base member was peeled off; the applied acrylic-based UV curable resin was cured; and then the cured resin was peeled off. Further, the nickel electroforming body was immersed in Chemisol 2303 manufactured by The Japan Cee-Bee Chemical Co., Ltd., followed by being cleaned while being stirred for 2 hours at 50 degrees Celsius. Accordingly, polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of a UV curable resin film to which the surface profile of the nickel mold was transferred was obtained. For the concavity and convexity pattern of the diffraction grating, the concavity and convexity shape on the surface was analyzed by using the atomic force microscope used in Example 1 to obtain an analysis image. Analysis conditions of the atomic force microscope were the same as those in Example 1.

Figure 9A:
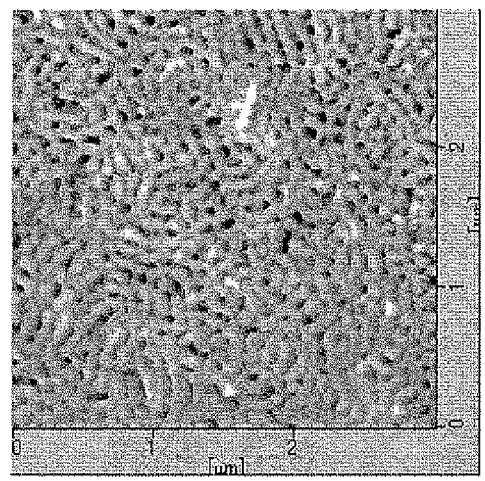
FIG. 9A is a photograph showing an analysis image, in which a result of analysis conducted on a concave and convex surface of a diffraction grating obtained in Example 5 by use of the scanning probe microscope is displayed on a display.
Figure 9B:
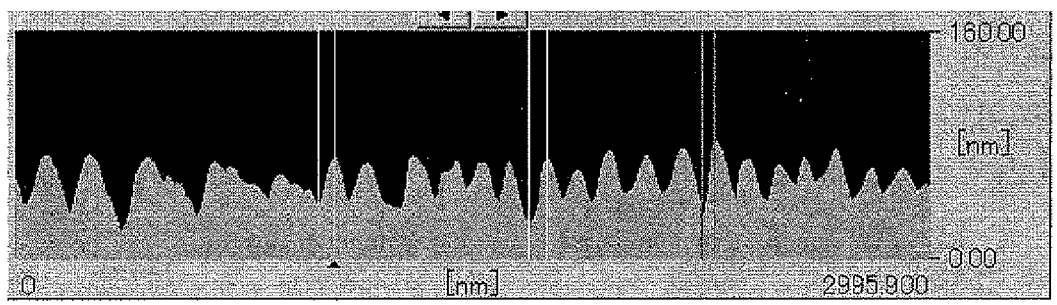
FIG. 9B is a photograph showing an analysis image, in which a result of analysis conducted on a concave and convex cross-section of the diffraction grating obtained in Example 5 by use of the scanning probe microscope is displayed on a display.

FIG. 9A shows the obtained concavity and convexity analysis image. Further, FIG. 9B shows the obtained concavity and convexity analysis image of the cross-section. From the analysis images, an average height of the concavities and convexities, an average pitch of the concavities and convexities, an average value (m) and a median (M) of a depth distribution of the concavities and convexities, and a kurtosis of the concavities and convexities were each obtained in the same manner as Example 1. The results thereof are described as follows.

Average height: 40 nm
Average pitch: 110 nm
Average value (m) of depth distribution: 59.84 nm
Median (M) of depth distribution: 61.06 nm
Kurtosis: 0.729

Figure 9C:
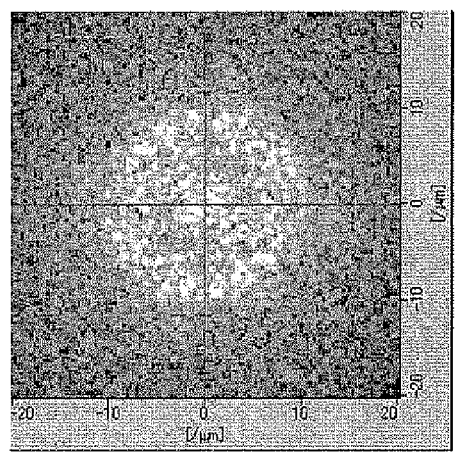
FIG. 9C is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 5, is displayed on a display.

FIG. 9C shows a Fourier-transformed image obtained from the analysis images. As is apparent from the result shown in FIG. 9C, it was observed that the Fourier-transformed image showed a circular pattern substantially centered at an origin at which an absolute value of wavenumber was 0 μm$^{-1}$, and that the circular pattern was present within a region where the absolute value of wavenumber was within a range of 10 μm$^{-1}$ or less.

On the UV curable resin film as the diffraction grating obtained as described above, a transparent electrode (ITO, thickness: 120 nm), a hole transporting layer (N,N-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

Example 6

Toluene was added to 120 mg of the block copolymer 2 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 μm to obtain a block copolymer solution.

Subsequently, 170 mg of methyltrimethoxysilane (MTMS) and 89 mg of 1,2-bis(trimethoxysilyl)ethane (BT-MSE) were added to 4.75 g of methylisobutylketone, followed by being stirred to prepare methyltrimethoxysilane/1,2-bis(trimethoxysilyl)ethane solution. This solution was applied on a glass substrate after cleaning having a thickness of 1.1 mm by a spin coating to obtain a glass substrate with a coating film made of methyltrimethoxysilane/1,2-bis(trimethoxysilyl)ethane. The spin coating was performed at a spin speed of 500 rpm for 10 seconds, and then performed at a spin speed of 800 rpm for 30 seconds. Thereafter, the glass substrate with the coating film was sintered for 6 hours in a nitrogen atmosphere at a temperature of 280 degrees Celsius to obtain an organo silicate processed glass substrate.

The obtained block copolymer solution was applied, on the organo silicate processed glass substrate, in a film thickness of 200 to 250 nm, by a spin coating. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the base member was heated for 5 hours in an oven of 160 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried. By performing the etching process, PMMA on the base member was selectively removed to obtain a thin film with a minute concavity and convexity pattern.

The base member was subjected to a heating process (second annealing process) for 85 hours in an oven of 110 degrees Celsius so that the thin film was subjected to a process for forming a shape of chevrons.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 μm. The base member on which the nickel was deposited as described above was mechanically peeled off from the nickel electroforming body. The nickel electroforming body from which the base member was peeled off was immersed in Chemisol 2303 manufactured by The Japan Cee-Bee Chemical Co., Ltd., followed by being cleaned while being stirred for 2 hours at 50 degrees Celsius. Thereafter, the nickel electroforming body was immersed in a tetrahydrofuran solution and an ultrasonic cleaning process was carried out for 30 minutes. Accordingly, polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of the UV curable resin film to which the surface profile of the nickel mold was transferred was obtained. For the concavity and convexity pattern of the diffraction grating, the concavity and convexity shape on the surface was analyzed by using the atomic force microscope used in Example 1 to obtain an analysis image. Analysis conditions of the atomic force microscope were the same as those in Example 1.

Figure 10A:
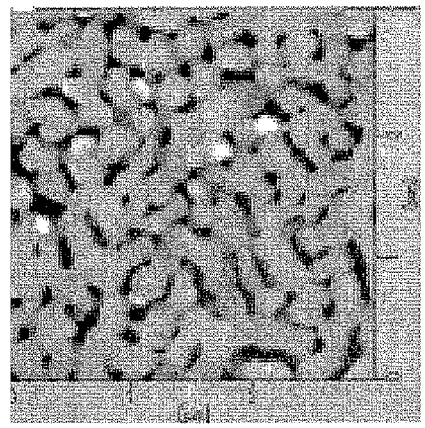
FIG. 10A is a photograph showing an analysis image, in which a result of analysis conducted on a concave and convex surface of a block copolymer from which PMMA has been selectively removed by the etching process in Example 6 by use of the scanning probe microscope is displayed on a display.
Figure 10B:
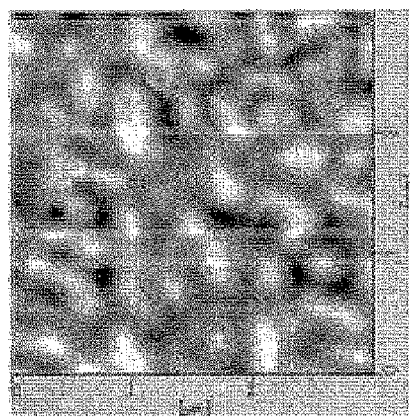
FIG. 10B is a photograph showing an analysis image, in which a result of analysis conducted on a concave and convex surface of a mold formed by the electroforming in Example 6 by use of the scanning probe microscope is displayed on a display.
Figure 10C:
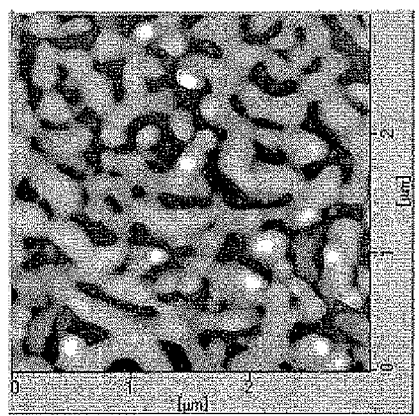
FIG. 10C is a photograph showing an analysis image, in which a result of analysis conducted on a concave and convex surface of a diffraction grating obtained in Example 6 by use of the scanning probe microscope is displayed on a display.

FIG. 10C shows the obtained concavity and convexity analysis image. For comparison, FIG. 10A shows a concavity and convexity analysis image of the concavity and convexity pattern of the block copolymer from which PMMA was selectively removed by the etching process; and FIG. 10B shows a concavity and convexity analysis image of the concavity and convexity pattern of the mold formed by the electroforming. The pattern shown in FIG. 10B showed the inverted pattern, of the pattern shown in FIG. 10A, which was transferred from the pattern shown in FIG. 10A. From FIGS. 10A, 10B, and 10C, it was found out that the patterns of FIGS. 10A, 10B, and 10C had a common pattern regularity and/or common pattern pitch and that the planar shape of the concavity and convexity pattern of the block copolymer from which PMMA was selectively removed by the etching process was satisfactorily reflected by the electroforming and the transfer of the mold to the resin.

Figure 10D:
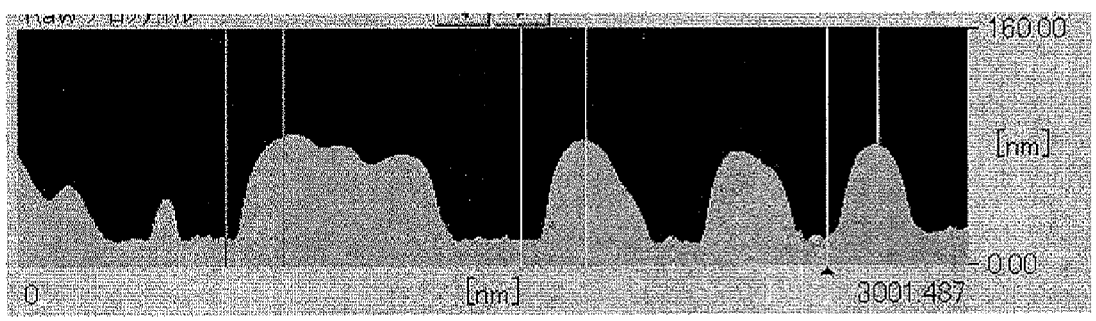
FIG. 10D is a photograph showing an analysis image, in which a result of analysis conducted on a concave and convex cross-section of the diffraction grating obtained in Example 6 by use of the scanning probe microscope is displayed on a display.

FIG. 10D shows a concavity and convexity analysis image of the cross-section in the vicinity of the surface of the obtained diffraction grating. From the analysis images of the surfaces of the diffraction grating, an average height of the concavities and convexities, an average pitch of the concavities and convexities, an average value (m) and a median (M) of a depth distribution of the concavities and convexities, and a kurtosis of the concavities and convexities of the diffraction grating were each obtained in the same manner as Example 1. The results thereof are described as follows.

Average height: 72 nm
Average pitch: 380 nm
Average value (m) of depth distribution: 61.43 nm
Median (M) of depth distribution: 63.69 nm
Kurtosis: −1.091

Figure 10E:
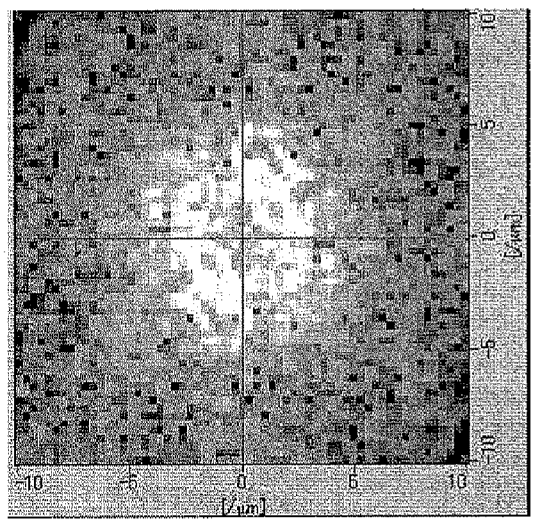
FIG. 10E is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 6, is displayed on a display.

FIG. 10E shows a Fourier-transformed image obtained from the analysis images. As is apparent from the result shown in FIG. 10E, it was observed that the Fourier-transformed image showed a circular pattern substantially centered at an origin at which an absolute value of wavenumber was 0 μm$^{-1}$, and that the circular pattern was present within a region where the absolute value of wavenumber was within a range of 10 μm$^{-1}$ or less.

On the UV curable resin film as the diffraction grating obtained as described above, a transparent electrode (ITO, thickness: 120 μm), a hole transporting layer (N,N'-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

Example 7

Toluene was added to 120 mg of the block copolymer 2 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 μm to obtain a block copolymer solution.

Subsequently, 170 mg of methyltrimethoxysilane (MTMS) and 89 mg of 1,2-bis(trimethoxysilyl)ethane (BTMSE) were added to 4.75 g of methylisobutylketone, followed by being stirred to prepare methyltrimethoxysilane/1,2-bis(trimethoxysilyl)ethane solution. This solution was applied on a glass substrate after cleaning having a thickness of 1.1 mm by a spin coating to obtain a glass substrate with a coating film made of methyltrimethoxysilane/1,2-bis(trimethoxysilyl)ethane. The spin coating was performed at a spin speed of 500 rpm for 10 seconds, and then performed at a spin speed of 800 rpm for 30 seconds. Thereafter, the glass substrate with the coating film was sintered for 6 hours in a nitrogen atmosphere at a temperature of 280 degrees Celsius to obtain an organo silicate processed glass substrate.

The obtained block copolymer solution was applied, on the organo silicate processed glass substrate, in a film thickness of 200 to 250 nm, by a spin coating. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the substrate was heated for 5 hours in an oven of 160 degrees Celsius (annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried. By performing the etching process, PMMA on the base member was selectively removed to obtain a thin film with a minute concavity and convexity pattern.

The base member was subjected to a heating process (second annealing process) for 20 minutes in an oven of 170 degrees Celsius so that the thin film was subjected to a process for forming a shape of chevrons.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 µm. The base member on which the nickel was deposited as described above was mechanically peeled off from the nickel electroforming body. The nickel electroforming body from which the base member was peeled off was immersed in Chemisol 2303 manufactured by The Japan Cee-Bee Chemical Co., Ltd., followed by being cleaned while being stirred for 2 hours at 50 degrees Celsius. Thereafter, the nickel electroforming body was immersed in a tetrahydrofuran solution and an ultrasonic cleaning process was carried out for 30 minutes. Accordingly, polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a fluorine-based UV curable resin was applied on the nickel mold. After a glass, for which a silane coupling process had been performed, was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of the glass substrate on which the concavity and convexity pattern of the fluorine-based resin, to which the surface profile of the nickel mold was transferred, was formed was obtained. For the concavity and convexity pattern of the diffraction grating, the concavity and convexity shape on the surface was analyzed by using the atomic force microscope used in Example 1 to obtain an analysis image. Analysis conditions of the atomic force microscope were the same as those in Example 1.

Figure 11A:
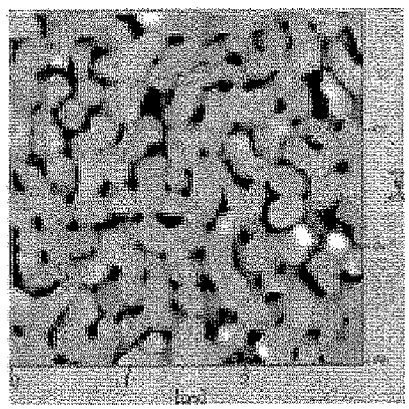
FIG. 11A is a photograph showing an analysis image, in which a result of analysis conducted on a concave and convex surface of a block copolymer from which PMMA has been selectively removed by the etching process in Example 7, by use of the scanning probe microscope is displayed on a display.
Figure 11B:
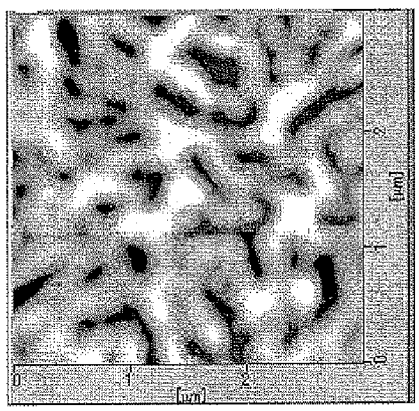
FIG. 11B is a photograph showing an analysis image, in which a result of analysis conducted on a concave and convex surface of a diffraction grating obtained in Example 7, by use of the scanning probe microscope is displayed on a display.

FIG. 11B shows the obtained concavity and convexity analysis image. For comparison, FIG. 11A shows a concavity and convexity analysis image of the concavity and convexity pattern of the block copolymer from which PMMA was selectively removed by the etching process. From FIGS. 11A and 11B, it was found out that the patterns shown in FIGS. 11A and 11B had a common pattern regularity and/or common pattern pitch and that the planar shape of the concavity and convexity pattern of the block copolymer from which PMMA was selectively removed by the etching process was satisfactorily reflected by the transfer of the mold to the resin.

Figure 11C:
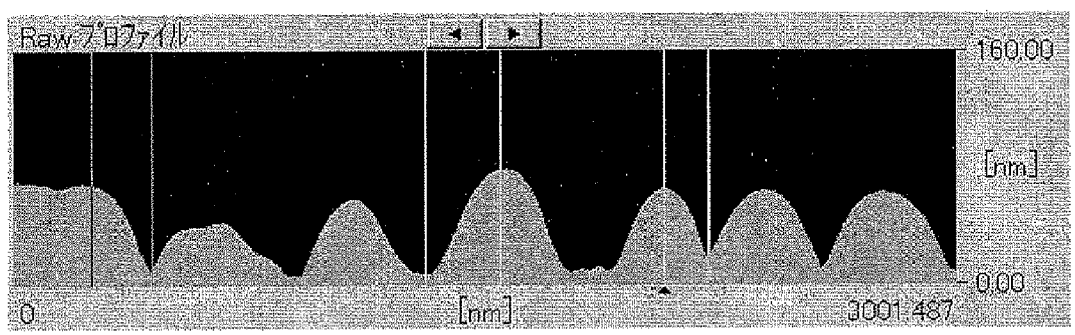
FIG. 11C is a photograph showing an analysis image, in which a result of analysis conducted on a concave and convex cross-section of the diffraction grating obtained in Example 7, by use of the scanning probe microscope is displayed on a display.

FIG. 11C shows a concavity and convexity analysis image of the cross-section in the vicinity of the surface of the obtained diffraction grating. From the analysis images of the surfaces of the diffraction grating, an average height of the concavities and convexities, an average pitch of the concavities and convexities, an average value (m) and a median (M) of a depth distribution of the concavities and convexities, and a kurtosis of the concavities and convexities of the diffraction grating were each obtained in the same manner as Example 1. The results thereof are described as follows.

Average height: 68 nm
Average pitch: 420 nm
Average value (m) of depth distribution: 49.88 nm
Median (M) of depth distribution: 54.27 nm
Kurtosis: −0.518

Figure 11D:
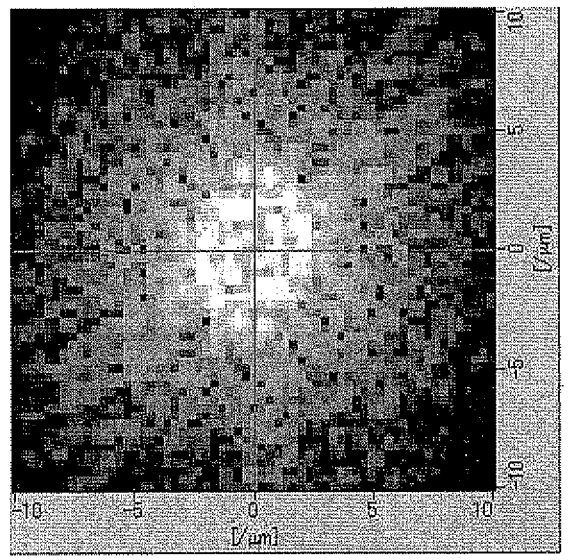
FIG. 11D is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 7, is displayed on a display.

FIG. 11D shows a Fourier-transformed image obtained from the analysis images. As is apparent from the result shown in FIG. 11D, it was observed that the Fourier-transformed image showed a circular pattern substantially centered at an origin at which an absolute value of wavenumber was 0 µm$^{-1}$, and that the circular pattern was present within a region where the absolute value of wavenumber was within a range of 10 µm$^{-1}$ or less.

On the UV curable resin film as the diffraction grating obtained as described above, a transparent electrode (ITO, thickness: 120 nm), a hole transporting layer (N,N-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

Example 8

Toluene was added to 120 mg of the block copolymer 1 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 to obtain a block copolymer solution. The obtained block copolymer solution was applied, on a polyphenylene sulfide film (TORELINA manufactured by TORAY INDUSTRIRES, INC.), in a film thickness of 200 to 250 nm, by a spin coating. The spin coating was performed at a spin speed of 500 rpm for 10 seconds, and then performed at a spin speed of 800 rpm for 30 seconds. The thin film applied by the spin coating was left at a room temperature for 10 minutes until the thin film was dried.

Figure 12A:
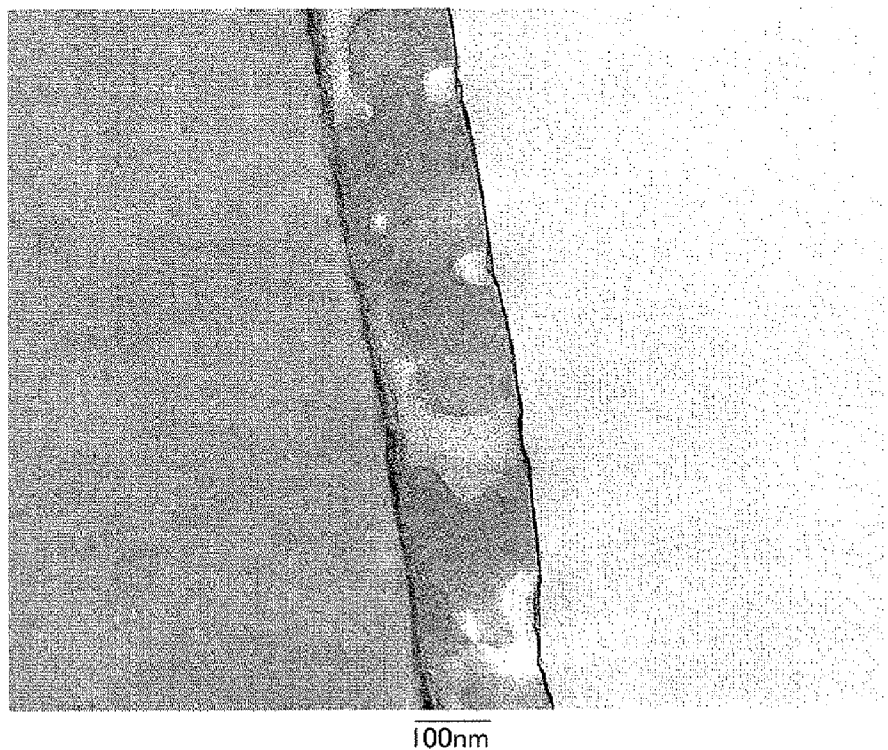
FIG. 12A is a transmission electron micrograph of a cross-section of a coating film after the first annealing process obtained in Example 8.

Subsequently, the base member was heated for 3 hours in an oven of 170 degrees Celsius (first annealing process). It was observed that concavities and convexities were formed on the thin film on the surface of the heated base member and that micro phase separation of the block copolymer was caused. The cross-section of the thin film was observed with the transmission electron microscope used in Example 1. As shown in the micrograph of FIG. 12A, which is obtained by the transmission electron microscope, PS portions correspond to black portions and PMMA portions correspond to white portions as a result of $RuO_4$ staining.

The heated thin film was subjected to an etching process as described below. The thin film was irradiated with ultraviolet rays at an irradiation intensity of 30 $J/cm^2$ by use of a high pressure mercury lamp. Then, the thin film was immersed in acetic acid, and was subjected to cleaning with ion-exchanged water, followed by being dried. By performing the etching process, PMMA on the base member was selectively removed to obtain a thin film with a minute concavity and convexity pattern.

The base member was subjected to a heating process (second annealing process) for 1 hour in an oven of 140 degrees Celsius so that the thin film was subjected to a process for forming a shape of chevrons.

Figure 12B:
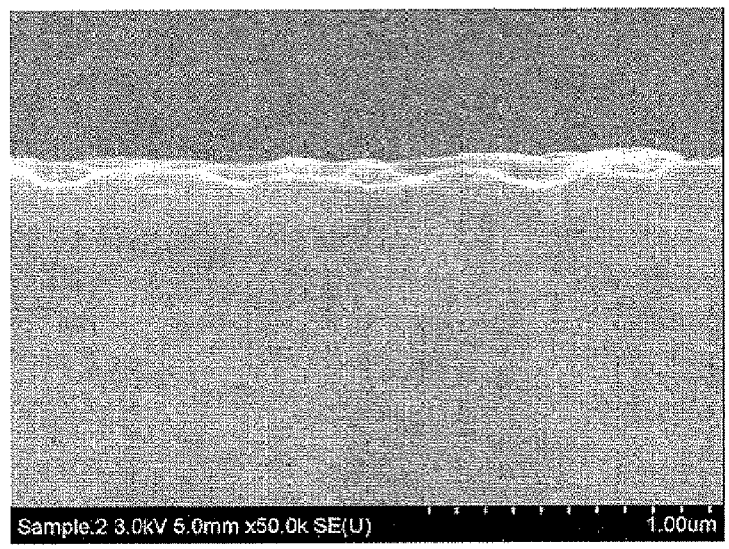
FIG. 12B is a scanning electron micrograph, of a cross-section of a nickel mold from which a polymer component has been removed in Example 8.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 µm. The base member on which the nickel was deposited as described above was mechanically peeled off from the nickel electroforming body. The nickel electroforming body from which the base member was peeled off was immersed in Chemisol 2303 manufactured by The Japan Cee-Bee Chemical Co., Ltd., followed by being cleaned while being stirred for 2 hours at 50 degrees Celsius. Thereafter, the nickel electroforming body was immersed in a tetrahydrofuran solution and an ultrasonic cleaning process was carried out for 30 minutes. Then, the following process was repeated three times. An acrylic-based UV curable resin was applied on the nickel electroforming body; the applied acrylic-based UV curable resin was cured; and then the cured resin was peeled off. Accordingly, polymer component(s) adhered to a part of the surface of the electroforming body was(were) removed. FIG. 12B shows a measurement result of the cross-section of the nickel electroforming body using the SEM. It is understood from FIG. 12B that concavities and convexities of the nickel electroforming body were smooth and the cross-section of each convex portion had a chevron shape.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd, to perform an ultrasonic cleaning process for about 1 minute. Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 $mJ/cm^2$ and then the nickel mold was peeled off. Accordingly, a diffraction grating made of the UV curable resin film to which the surface profile of the nickel mold was transferred was obtained. For the concavity and convexity pattern of the diffraction grating, the concavity and convexity shape on the surface was analyzed by using the atomic force microscope used in Example 1 to obtain an analysis image. Analysis conditions of the atomic force microscope were the same as those in Example 1.

Figure 12C:
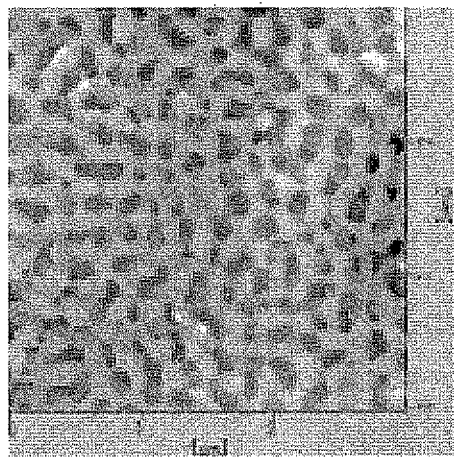
FIG. 12C is a photograph showing an analysis image, in which a result of analysis conducted on a concave and convex surface of a block copolymer from which PMMA has been selectively removed by the etching process in Example 8 by use of the scanning probe microscope is displayed on a display.
Figure 12D:
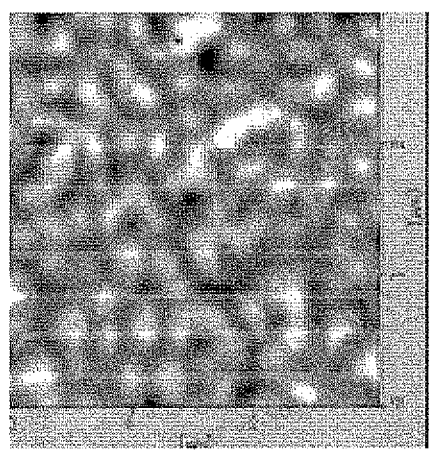
FIG. 12D is a photograph showing an analysis image, in which a result of analysis conducted on a concave and convex surface of a mold formed by the electroforming in Example 8 by use of the scanning probe microscope is displayed on a display.
Figure 12E:
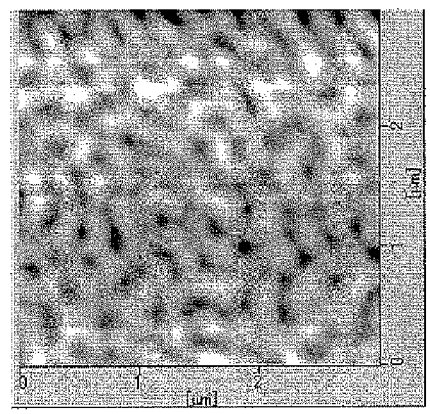
FIG. 12E is a photograph showing an analysis image, in which a result of analysis conducted on a concave and convex surface of the diffraction grating obtained in Example 8 by use of the scanning probe microscope is displayed on a display.

FIG. 12E shows a concavity and convexity analysis image of the surface of the resin of the obtained diffraction grating. For comparison, FIG. 12C shows a concavity and convexity analysis image of the concavity and convexity pattern of the block copolymer from which PMMA was selectively removed by the etching process and FIG. 5D shows a concavity and convexity analysis image of the concavity and convexity pattern of the mold formed by the electroforming. The pattern shown in FIG. 12D was a pattern transferred from the pattern shown in FIG. 12C, and thus the pattern shown in FIG. 12D was the inverted pattern of the pattern shown in FIG. 12C. It was found out that patterns of FIGS. 12C, 12D, and 12E had a common pattern regularity and/or common pattern pitch and that the concavity and convexity pattern of the block copolymer from which PMMA was selectively removed by the etching process was satisfactorily reflected by the electroforming and the transfer to the resin to be thereafter performed.

Figure 12F:
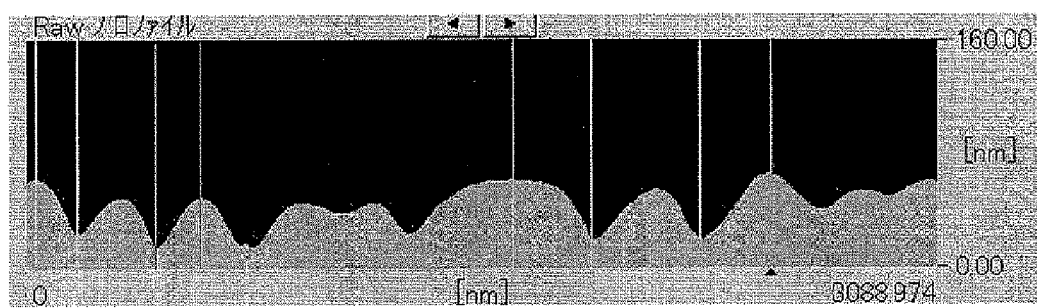
FIG. 12F is a photograph showing an analysis image, in which a result of analysis conducted on a concave and convex cross-section of the diffraction grating obtained in Example 8 by use of the scanning probe microscope is displayed on a display.

FIG. 12F shows a concavity and convexity analysis image of the cross-section in the vicinity of the resin surface of the obtained diffraction grating. From the analysis images of the concavities and convexities of the diffraction grating shown in FIGS. 12E and 12F, an average height of the concavities and convexities, an average pitch of the concavities and convexities, a Fourier-transformed image, an average value and a median of a depth distribution of the concavities and convexities, and a kurtosis of the concavities and convexities were each obtained in the same manner as Example 1. The results thereof are described as follows.

Average height: 51 nm
Average pitch: 290 nm
Average value (m) of depth distribution: 45.67 nm
Median (M) of depth distribution: 46.69 nm
Kurtosis: −0.054

Figure 12G:
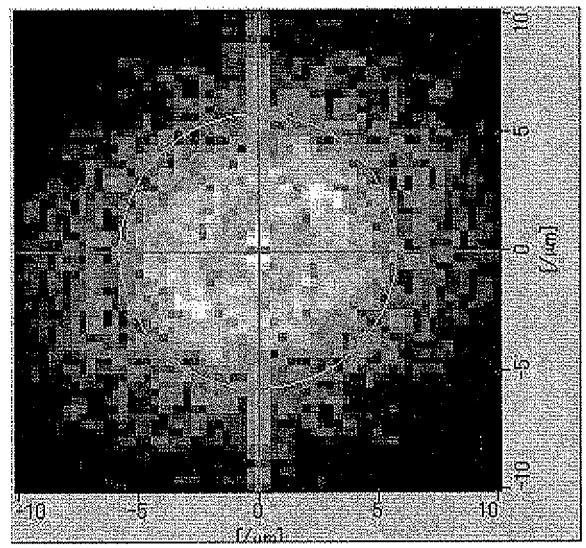
FIG. 12G is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 8, is displayed on a display.

FIG. 12G shows a Fourier-transformed image obtained from the analysis images. As is apparent from the result shown in FIG. 12G, it was observed that the Fourier-transformed image showed a circular pattern substantially centered at an origin at which an absolute value of wavenumber was 0 $\mu m^{-1}$, and that the circular pattern was present within a region where the absolute value of wavenumber was within a range of 10 $\mu m^{-1}$ or less.

On the UV curable resin film as the diffraction grating obtained as described above, a transparent electrode (ITO, thickness: 120 nm), a hole transporting layer (N,N'-diphenyl-N,N-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

Example 9

Toluene was added to 120 mg of the block copolymer 2 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 μm to obtain a block copolymer solution.

Subsequently, 170 mg of methyltrimethoxysilane (MTMS) and 89 mg of 1,2-bis(trimethoxysilyl)ethane (BT-MSE) were added to 4.75 g of methylisobutylketone, followed by being stirred to prepare methyltrimethoxysilane/1,2-bis(trimethoxysilyl)ethane solution. This solution was applied on a glass substrate after cleaning having a thickness of 1.1 mm by a spin coating to obtain a glass substrate with a coating film made of methyltrimethoxysilane/1,2-bis(trimethoxysilyl)ethane. The spin coating was performed at a spin speed of 500 rpm for 10 seconds, and then performed at a spin speed of 800 rpm for 30 seconds. The glass substrate with the coating film was sintered for 6 hours in a nitrogen atmosphere at a temperature of 320 degrees Celsius to obtain an organo silicate processed glass substrate.

The obtained block copolymer solution was applied, on the organo silicate processed glass substrate, in a film thickness of 200 to 250 nm, by a spin coating. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the base member was heated for 24 hours in an oven of 160 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried. By performing the etching process, PMMA on the substrate was selectively removed to obtain a thin film with a minute concavity and convexity pattern.

The base member was subjected to a heating process (second annealing process) for 1 hour in an oven of 125 degrees Celsius so that the thin film was subjected to a process for forming a shape of chevrons.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 μm. The base member on which the nickel was deposited as described above was mechanically peeled off from the nickel electroforming body. The nickel electroforming body from which the base member was peeled off was immersed in Chemisol 2303 manufactured by The Japan Cee-Bee Chemical Co., Ltd., followed by being cleaned while being stirred for 2 hours at 50 degrees Celsius. Thereafter, the following process was repeated three times. An acrylic-based UV curable resin was applied on the nickel electroforming body; the applied acrylic-based UV curable resin was cured; and then the cured resin was peeled off. Accordingly, polymer component(s) adhered to a part of the surface of the electroforming body was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of the UV curable resin film to which the surface profile of the nickel mold was transferred was obtained. For the concavity and convexity pattern of the diffraction grating, the concavity and convexity shape on the surface was analyzed by using the atomic force microscope used in Example 1 to obtain an analysis image. Analysis conditions of the atomic force microscope were the same as those in Example 1.

Figure 13A:
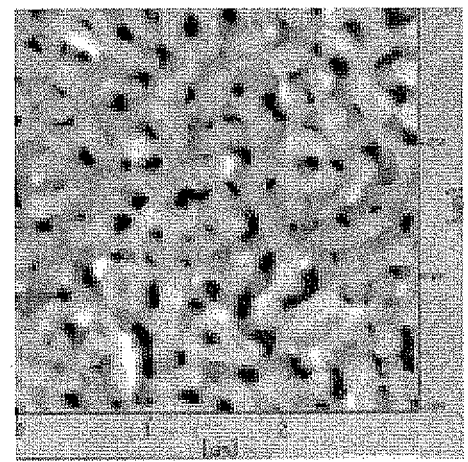
FIG. 13A is a photograph showing an analysis image, in which a result of analysis conducted on a concave and convex surface of a block copolymer from which PMMA has been selectively removed by the etching process in Example 9 by use of the scanning probe microscope is displayed on a display.
Figure 13B:
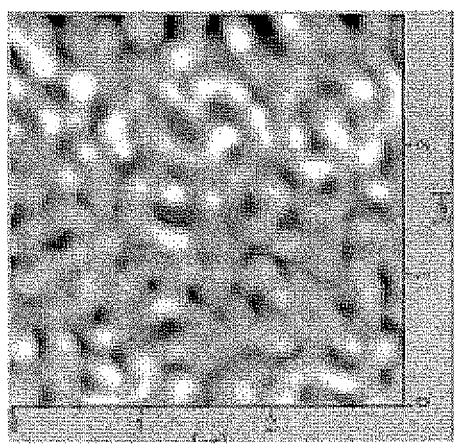
FIG. 13B is a photograph showing an analysis image, in which a result of analysis conducted on a concave and convex surface of a block copolymer treated to have the shape of chevrons by the second annealing process after the etching process in Example 9 by use of the scanning probe microscope is displayed on a display.
Figure 13C:
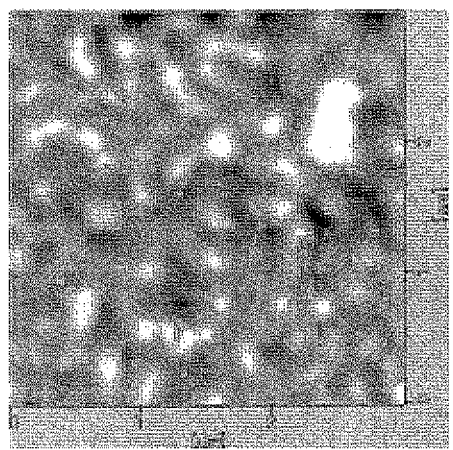
FIG. 13C is a photograph showing an analysis image, in which a result of analysis conducted on a concave and convex surface of a mold formed by the electroforming in Example 9 by use of the scanning probe microscope is displayed on a display.
Figure 13D:
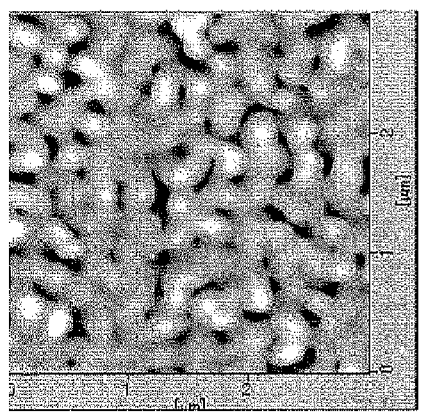
FIG. 13D is a photograph showing an analysis image, in which a result of analysis conducted on a concave and convex surface of a diffraction grating obtained in Example 9 by use of the scanning probe microscope is displayed on a display.

FIG. 13D shows the obtained concavity and convexity analysis image. For comparison, FIG. 13A shows a concavity and convexity analysis image of the concavity and convexity pattern of the block copolymer from which PMMA was selectively removed by the etching process; FIG. 13B shows a concavity and convexity analysis image of the concavity and convexity pattern for which the process for forming the shape of chevrons was performed in the second anneal step after the etching process; and FIG. 13C shows a concavity and convexity analysis image of the concavity and convexity pattern of the mold formed by the electroforming. The pattern shown in FIG. 13C was a pattern transferred from the pattern shown in FIG. 13A, and thus the pattern shown in FIG. 13C was the inverted pattern of those shown in FIGS. 13A, 13B, and 13D. It was found out that patterns of FIGS. 13A, 13B, 13C, and 13D had a common pattern regularity and/or common pattern pitch and that the planar shape of the concavity and convexity pattern of the block copolymer from which PMMA was selectively removed by the etching process was satisfactorily reflected by the second annealing process, the electroforming, and the transfer to the resin to be thereafter performed.

Figure 13E:
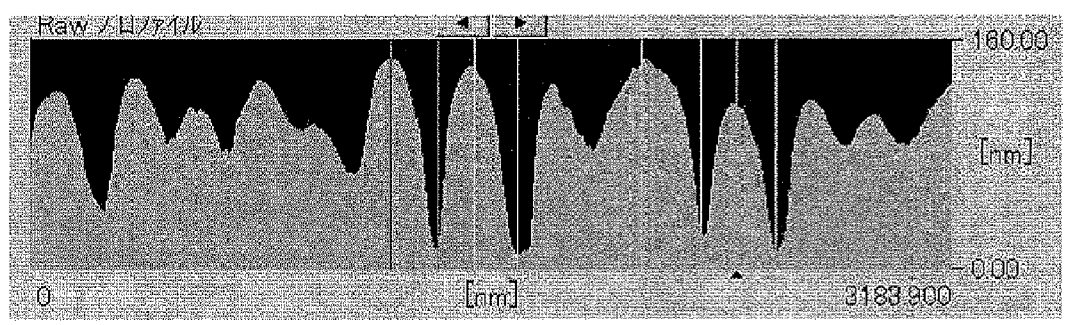
FIG. 13E is a photograph showing an analysis image, in which a result of analysis conducted on a concave and convex cross-section of the diffraction grating obtained in Example 9 by use of the scanning probe microscope is displayed on a display.

FIG. 13E shows a concavity and convexity analysis image of the cross-section in the vicinity of the surface of the obtained diffraction grating. From the concavity and convexity analysis images (FIGS. 13D and 13E) of the surfaces of the diffraction grating, an average height of the concavities and convexities, an average pitch of the concavities and convexities, an average value (m) and a median (M) of a depth distribution of the concavities and convexities, and a kurtosis of the concavities and convexities of the diffraction grating were each obtained in the same manner as Example 1. The results thereof are described as follows.

Average height: 110 nm
Average pitch: 290 nm
Average value (m) of depth distribution: 91.22 nm
Median (M) of depth distribution: 95.9 nm
Kurtosis: −0.348

Figure 13F:
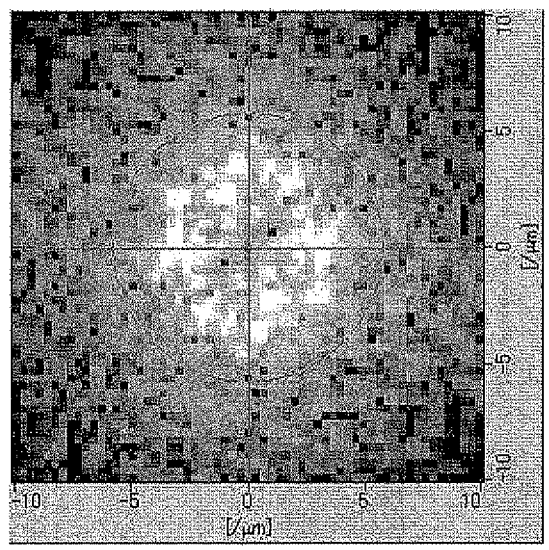
FIG. 13F is a photograph showing a Fourier-transformed image, in which a result of two-dimensional fast Fourier transform processing conducted on a concavity and convexity analysis image, which was obtained by use of the atomic force microscope, of the surface of the diffraction grating obtained in Example 9, is displayed on a display.

FIG. 13F shows a Fourier-transformed image obtained from the analysis images. As is apparent from the result shown in FIG. 13F, it was observed that the Fourier-transformed image showed a circular pattern substantially centered at an origin at which an absolute value of wavenumber was 0 μm$^{-1}$, and that the circular pattern was present within a region where the absolute value of wavenumber was within a range of 10 μm$^{-1}$ or less.

On the UV curable resin film as the diffraction grating obtained as described above, a transparent electrode (ITO, thickness: 120 nm), a hole transporting layer (N,N'-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 100 nm) were each stacked by a vapor deposition method to maintain the shape of the concavities and convexities formed on the surface of the cured resin layer. Accordingly, the organic EL element was obtained.

Comparative Example 1

Figure 14C:
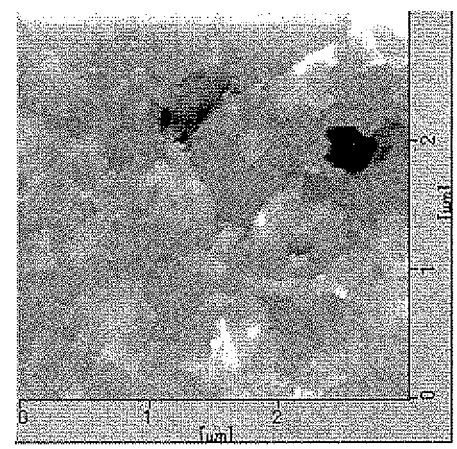
FIG. 14C is a photograph showing an analysis image, in which a result of analysis conducted on a concave and convex surface of a mold formed by the electroforming in Comparative Example 1 by use of the scanning probe microscope is displayed on a display.

A nickel electroforming body was obtained in the similar manner as Example 1, except that the heating process (second annealing process) for 1 hour in the oven of 140 degrees Celsius was not performed. FIG. 14A shows a SEM measurement result of the cross-section of the nickel electroforming body. The concavity and convexity shape on the surface of the nickel electroforming body was measured by using the atomic force microscope used in Example 1 to obtain an analysis image. Analysis conditions of the atomic force microscope were the same as those in Example 1. The obtained analysis image is shown in FIG. 14C. For comparison, FIG. 14B shows a concavity and convexity analysis image of the concavity and convexity pattern of the block copolymer from which PMMA was selectively removed by the etching process.

As is clear from FIG. 14A, regarding the nickel electroforming body obtained in this example, the concavities and convexities on the surface were ununiform and coarse as compared with those obtained in Example 1, and further portions like overhangs were observed. Furthermore, it was found that polystyrene (portions look black) was remained at each concave portion of the nickel surface. In FIG. 14C, the periodic concavity and convexity pattern which appeared in FIG. 14B was not observed. Therefore, it is considered that the concavity and convexity pattern of the block copolymer from which PMMA was selectively removed by the etching process had a cross-section structure (see FIG. 1C) which was not suitable for the transfer even by the electroforming.

Comparative Example 2

Figure 15A:
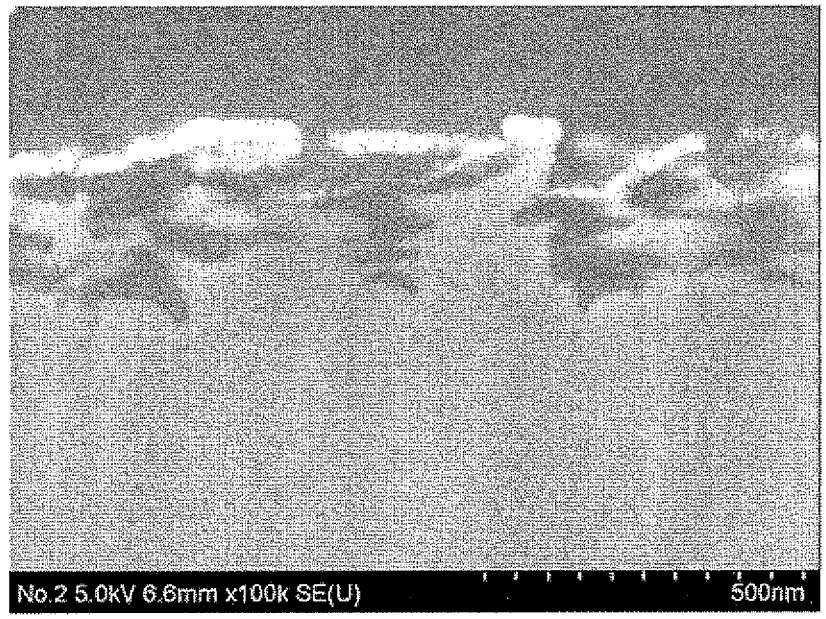
FIG. 15A is a scanning electron micrograph of a cross-section of a nickel mold obtained in Comparative Example 2.
Figure 15B:
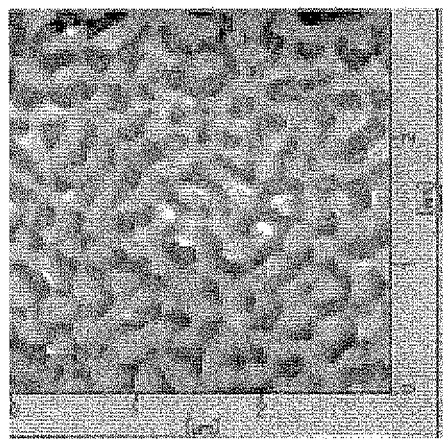
FIG. 15B is a photograph showing an analysis image, in which a result of analysis conducted on a concave and convex surface of a block copolymer from which PMMA has been selectively removed by the etching process in Comparative Example 2 by use of the scanning probe microscope is displayed on a display.
Figure 15C:
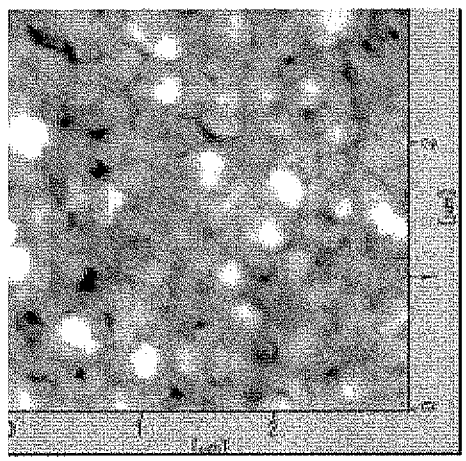
FIG. 15C is a photograph showing an analysis image, in which a result of analysis conducted on a concave and convex surface of a mold formed by the electroforming in Comparative Example 2 by use of the scanning probe microscope is displayed on a display.

A nickel electroforming body was obtained in the similar manner as Example 8, except that the heating process (second annealing process) for 1 hour in the oven of 140 degrees Celsius was not performed. FIG. 15A shows a SEM measurement result of the cross-section of the nickel electroforming body. The concavity and convexity shape of the nickel electroforming body was measured by using the atomic force microscope used in Example 1 to obtain an analysis image. Analysis conditions of the atomic force microscope were the same as those in Example 1. The obtained analysis image is shown in FIG. 15C. For comparison, FIG. 15B shows a concavity and convexity analysis image of the concavity and convexity pattern of the block copolymer from which PMMA was selectively removed by the etching process.

As is clear from FIG. 15A, regarding the nickel electroforming body obtained in this example, the concavities and convexities on the surface were ununiform and coarse as compared with those obtained in Example 8, and further portions like overhangs were observed. Furthermore, it was found that polystyrene (portions look black) was remained at each concave portion of the nickel. In FIG. 15C, the periodic concavity and convexity pattern which appeared in FIG. 15B was not observed. Therefore, it is considered that the concavity and convexity pattern of the block copolymer from which PMMA was selectively removed by the etching process had a cross-section structure which was not suitable for the transfer by the electroforming.

Comparative Example 3

Toluene was added to 120 mg of the block copolymer 1 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 μm to obtain a block copolymer solution.

Subsequently, 0.7 g of octadecyldimethylchlorosilane (ODS) was added to 500 ml of heptane, followed by being stirred to prepare 2.0 mM of ODS solution. A glass substrate after cleaning having a thickness of 1.1 mm was immersed in the solution and stationarily placed for 24 hours. This processed substrate was subjected to ultrasonic cleaning with chloroform for 10 minutes and then subjected to ultrasonic cleaning with pure water for 10 minutes, followed by being dried. Accordingly, an ODS-processed glass substrate was obtained.

The obtained block copolymer solution was applied, on the ODS-processed glass substrate, in a film thickness of 200 to 250 nm, by a spin coating. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the base member was heated for 3 hours in an oven of 160 degrees Celsius (annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried. By performing the etching process, PMMA on the base member was selectively removed to obtain a thin film with a minute concavity and convexity pattern.

Subsequently, about 10 nm of a thin nickel layer was formed on the surface of the thin film by a sputtering. Then, the base member was subjected to an electroforming process under the same condition as Example 1 in a nickel sulfamate bath to precipitate nickel until the thickness of nickel became 250 μm. The base member on which the nickel was deposited as described above was mechanically peeled off from the nickel electroforming body. The nickel electroforming body from which the base member was peeled off was immersed in Chemisol 2303 manufactured by The Japan Cee-Bee Chemical Co., Ltd., followed by being cleaned while being stirred for 2 hours at 50 degrees Celsius. Thereafter, the nickel electroforming body was immersed in a tetrahydrofuran solution and an ultrasonic cleaning process was carried out for 30 minutes.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Then, a fluorine-based UV curable resin was applied on a PET substrate (COSMOSHINE A-4100 manufactured by Toyobo Co., Ltd). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of the UV curable resin film to which the surface profile of the nickel mold was transferred was obtained. For the concavity and convexity pattern of the diffraction grating, the concavity and convexity shape on the surface was analyzed by using the atomic force microscope used in Example 1 to obtain an analysis image. However, the shape representing the concavity and convexity on the surface was not observed in the analysis image. For reference, the analysis image of the concavity and convexity pattern of the block copolymer from which PMMA was selectively removed by the etching process and the analysis image of concavity and convexity pattern of the surface of the nickel electroforming body were each obtained by performing measurement using the atomic force microscope used in Example 1. Analysis conditions of the atomic force microscope were the same as those in Example 1. Respective analysis images are shown in FIGS. 16A and 16B.

Figure 16A:
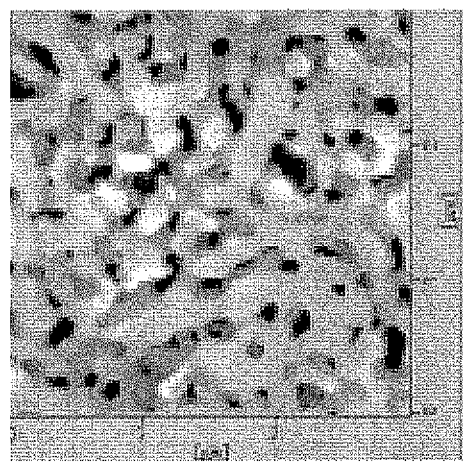
FIG. 16A is a photograph showing an analysis image, in which a result of analysis conducted on a concave and convex surface of a block copolymer from which PMMA has been selectively removed by the etching process in Comparative Example 3 by use of the scanning probe microscope is displayed on a display.
Figure 16B:
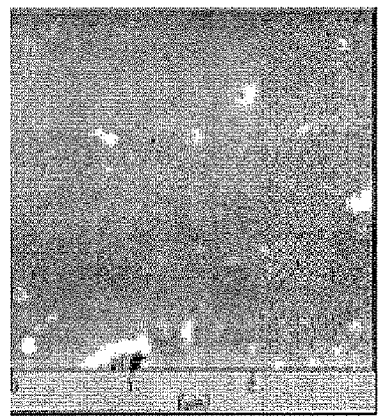
FIG. 16B is a photograph showing an analysis image, in which a result of analysis conducted on a concave and convex surface of a mold formed by the electroforming in Comparative Example 3 by use of the scanning probe microscope is displayed on a display.

It was found out that the periodic concavity and convexity pattern which appeared in FIG. 16A did not appear at all in FIG. 16B. Therefore, it is considered that the concavity and convexity pattern of the block copolymer from which PMMA was selectively removed by the etching process had a cross-section structure which was not suitable for the transfer by the electroforming.

Comparative Example 4

Toluene was added to 120 mg of the block copolymer 1 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 μm to obtain a block copolymer solution. The obtained block copolymer solution was applied, on a polyphenylene sulfide film (TORELINA manufactured by TORAY INDUSTRIRES, INC.), in a film thickness of 200 to 250 nm, by a spin coating. The spin coating was performed at a spin speed of 500 rpm for 10 seconds, and then performed at a spin speed of 800 rpm for 30 seconds. The thin film applied by the spin coating was left at a room temperature for 10 minutes until the thin film was dried.

Subsequently, the base member was heated for 5 hours in an oven of 170 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetic acid, and was subjected to cleaning with ion-exchanged water, followed by being dried. By performing the etching process, PMMA on the base member was selectively removed to obtain a thin film with a minute concavity and convexity pattern.

Subsequently, about 10 nm of a thin nickel layer was formed on the surface of the thin film by a sputtering without performing the second annealing process. Then, the base member was subjected to an electroforming process under the same condition as Example 1 in a nickel sulfamate bath to precipitate nickel until the thickness of nickel became 250 μm. The base member on which the nickel was deposited as described above was mechanically peeled off from the nickel electroforming body. The nickel electroforming body from which the base member was peeled off was immersed in Chemisol 2303 manufactured by The Japan Cee-Bee Chemical Co., Ltd., followed by being cleaned while being stirred for 2 hours at 50 degrees Celsius. Thereafter, the nickel electroforming body was immersed in a tetrahydrofuran solution and an ultrasonic cleaning process was carried out for 30 minutes.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). The fluorine-based UV curable resin was cured by irradiation with ultraviolet rays at 600 mJ/cm$^2$ while the nickel mold was pressed against the fluorine-based UV curable resin. Then, the nickel mold was peeled off from the cured resin. Accordingly, a diffraction grating made of the UV curable resin film to which the surface profile of the nickel mold was transferred was obtained. For the concavity and convexity pattern of the diffraction grating, the concavity and convexity shape on the surface was analyzed by using the atomic force microscope used in Example 1. However, the shape representing the concavity and convexity on the surface was not observed in the analysis image. For reference, the analysis image of the concavity and convexity pattern of the block copolymer from which PMMA was selectively removed by the etching process and the analysis image of the concavity and convexity pattern on the surface of the nickel electroforming body were each obtained by performing measurement using the atomic force microscope used in Example 1. Analysis conditions of the atomic force microscope were the same as those in Example 1, Respective analysis images are shown in FIGS. 17A and 17B.

Figure 17A:
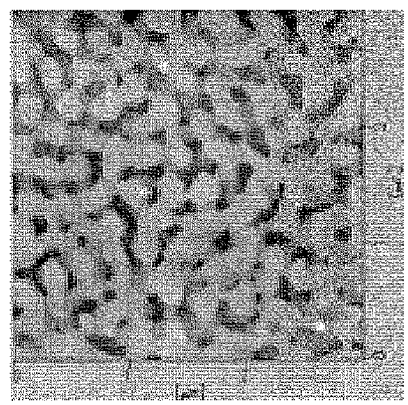
FIG. 17A is a photograph showing an analysis image, in which a result of analysis conducted on a concave and convex surface of a block copolymer from which PMMA has been selectively removed by the etching process in Comparative Example 4 by use of the scanning probe microscope is displayed on a display.
Figure 17B:
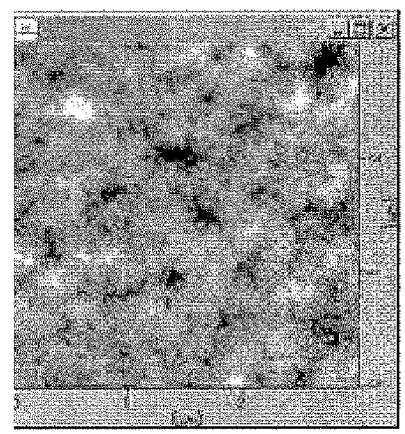
FIG. 17B is a photograph showing an analysis image, in which a result of analysis conducted on a concave and convex surface of a mold formed by the electroforming in Comparative Example 4 by use of the scanning probe microscope is displayed on a display.

It was found out that the periodic concavity and convexity pattern which appeared in FIG. 17A did not appear in FIG. 17B. Therefore, it is considered that the concavity and convexity pattern of the block copolymer from which PMMA was selectively removed by the etching process had a cross-section structure which was not suitable for the transfer by the electroforming.

Comparative Example 5

Toluene was added to 120 mg of the block copolymer 5 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 μm to obtain a block copolymer solution.

Subsequently, 0.7 g of octadecyl trichlorosilane (OTS) was added to 500 ml of heptane, followed by being stirred to prepare 2.0 mM of OTS solution. A glass substrate after cleaning having a thickness of 1.1 mm was immersed in the solution and stationarily placed for 24 hours. This processed substrate was subjected to ultrasonic cleaning with chloroform for 10 minutes and then subjected to ultrasonic cleaning with pure water for 10 minutes, followed by being dried. Accordingly, an OTS-processed glass substrate was obtained.

The obtained block copolymer solution was applied, on the OTS-processed glass substrate, in a film thickness of 200 to 250 nm, by a spin coating. The spin coating was performed at a spin speed of 500 rpm for 10 seconds, and then performed at a spin speed of 800 rpm for 30 seconds. After the spin coating, the thin film was left at a room temperature for 10 minutes until the thin film was dried.

Subsequently, the base member was heated for 8 hours in an oven of 190 degrees Celsius (first annealing process). It was observed that concavities and convexities were formed on the thin film on the surface of the heated base member and that micro phase separation of the block copolymer was caused.

The heated thin film was subjected to an etching process as described below. The thin film was irradiated with ultraviolet rays at an irradiation intensity of 30 J/cm$^2$ by use of a high pressure mercury lamp. Then, the thin film was immersed in acetone, and was subjected to cleaning with ion-exchanged water, followed by being dried, By performing the etching process, PMMA on the base member was selectively removed to obtain a thin film with a minute concavity and convexity pattern.

Subsequently, about 30 nm of a thin nickel layer was formed on the surface of the thin film by a vapor deposition method without performing the second annealing process. Then, the base member was subjected to an electroforming process under the same condition as Example 1 in a nickel sulfamate bath to precipitate nickel until the thickness of nickel became 250 µm. The base member on which the nickel was deposited as described above was mechanically peeled off from the nickel electroforming body. Then, the following process was repeated three times. An acrylic-based UV curable resin was applied on the nickel electroforming body from which the base member was peeled off; the applied acrylic-based UV curable resin was cured; and then the cured resin was peeled off. Further, the nickel electroforming body was immersed in Chemisol 2303 manufactured by The Japan Cee-Bee Chemical Co., Ltd., followed by being cleaned while being stirred for 2 hours at 50 degrees Celsius. Accordingly, polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of the UV curable resin film to which the surface profile of the nickel mold was transferred was obtained.

Figure 18:
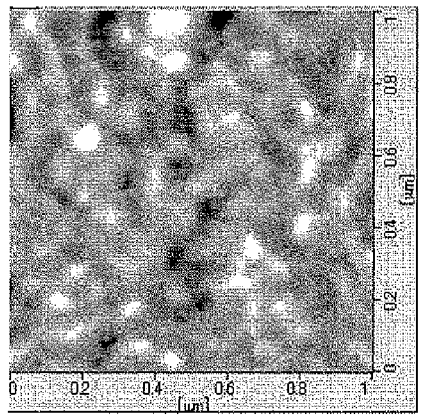
FIG. 18 is a photograph showing an analysis image, in which a result of analysis conducted on a concave and convex surface of a mold formed by the electroforming in Comparative Example 5 by use of the scanning probe microscope is displayed on a display.

For the concavity and convexity pattern of the surface of the nickel electroforming body, the analysis image was obtained by performing measurement using the atomic force microscope used in Example 1. Analysis conditions of the atomic force microscope were the same as those in Example 1. The analysis image is shown in FIG. 18. Although the second annealing process was not performed in this example, it was found out from FIG. 18 that the periodic concavity and convexity pattern appeared on the surface of the diffraction grating while it was unclear (the pattern was not as clear as that of Example 1). The reason thereof is considered that the molecular weight of the block copolymer 5 was relatively low.

Comparative Example 6

Toluene was added to 120 mg of the block copolymer 2 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 µm to obtain a block copolymer solution. The obtained block copolymer solution was applied, on a polyphenylene sulfide film (TORELINA manufactured by TORAY INDUSTRIRES, INC.), in a film thickness of 200 to 250 nm, by a spin coating to form a thin film. The spin coating was performed at a spin speed of 500 rpm for 10 seconds, and then performed at a spin speed of 800 rpm for 30 seconds. The thin film applied by the spin coating was left at a room temperature for 10 minutes until the thin film was dried.

Subsequently, the base member was heated for 5 hours in an oven of 170 degrees Celsius (first annealing process).

The heated thin film was subjected to an etching process as described below. The thin film was irradiated with ultraviolet rays at an irradiation intensity of 30 J/cm$^2$ by use of a high pressure mercury lamp. Then, the thin film was immersed in acetic acid, and was subjected to cleaning with ion-exchanged water, followed by being dried. By performing the etching process, PMMA on the base member was selectively removed to obtain a thin film with a minute concavity and convexity pattern.

Subsequently, about 30 nm of a thin nickel layer was formed on the surface of the thin film by a vapor deposition method. Then, the base member was subjected to an electroforming process under the same condition as Example 1 in a nickel sulfamate bath to precipitate nickel until the thickness of nickel became 250 µm. The base member on which the nickel was deposited as described above was mechanically peeled off from the nickel electroforming body. Then, the following process was repeated three times. An acrylic-based UV curable resin was applied on the nickel electroforming body from which the base member was peeled off; the applied acrylic-based UV curable resin was cured; and then the cured resin was peeled off. Further, the nickel electroforming body was immersed in Chemisol 2303 manufactured by The Japan Cee-Bee Chemical Co., Ltd., followed by being cleaned while being stirred for 2 hours at 50 degrees Celsius. Accordingly, polymer component(s), adhered to a part of the surface of the electroforming body, which was(were) visually confirmed was(were) removed.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained.

Figure 19:
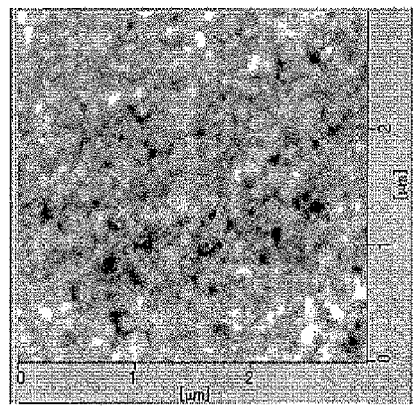
FIG. 19 is a photograph showing an analysis image, in which a result of analysis conducted on a concave and convex surface of a mold formed by the electroforming in Comparative Example 6 by use of the scanning probe microscope is displayed on a display.

Subsequently, a fluorine-based UV curable resin was applied on a PET substrate (COSMOSHINE A-4100 manufactured by Toyobo Co., Ltd.). After the nickel electroforming body was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of the UV curable resin film to which the surface profile of the nickel mold was transferred was obtained. For the concavity and convexity pattern of the diffraction grating, the concavity and convexity shape on the surface was measured by using the atomic force microscope used in Example 1. However, the concavity and convexity shape on the surface was not observed. For reference, the analysis image of the concavity and convexity pattern of the surface of the nickel electroforming body was obtained by performing measurement using the atomic force microscope used in Example 1. Analysis conditions of the atomic force microscope were the same as those in Example 1. The obtained analysis image is shown in FIG. 19. It was found out that the periodic concavity and convexity pattern did not appear at all in FIG. 19.

Comparative Example 7

Toluene was added to 120 mg of the block copolymer 1 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 µm to obtain a block copolymer solution. The obtained block copolymer solution was applied, on a polyphenylene sulfide film (TORELINA manufactured by TORAY INDUSTRIRES, INC.), in a film thickness of 200 to 250 nm, by a spin coating. The spin coating was performed at a spin speed of 500 rpm for 10 seconds, and then performed at a spin speed of 800 rpm for 30 seconds. The thin film applied by the spin coating was left at a room temperature for 10 minutes until the thin film was dried.

Subsequently, the base member was heated for 6 hours in an oven of 160 degrees Celsius (first annealing process).

The heated thin film was subjected to an etching process as described below. The thin film was irradiated with ultraviolet rays at an irradiation intensity of 30 J/cm$^2$ by use of a high pressure mercury lamp. Then, the thin film was immersed in acetic acid, and was subjected to cleaning with ion-exchanged water, followed by being dried. By performing the etching process, PMMA on the base member was selectively removed to obtain a thin film with a minute concavity and convexity pattern.

Subsequently, about 30 nm of a thin nickel layer was formed on the surface of the thin film by a vapor deposition method. Then, the base member was subjected to an electroforming process under the same condition as Example 1 in a nickel sulfamate bath to precipitate nickel until the thickness of nickel became 250 µm. The base member on which the nickel was deposited as described above was mechanically peeled off from the nickel electroforming body. Then, the following process was repeated three times. An acrylic-based UV curable resin was applied on the nickel electroforming body from which the base member was peeled off; the applied acrylic-based UV curable resin was cured; and then the cured resin was peeled off. Further, the nickel electroforming body was immersed in Chemisol 2303 manufactured by The Japan Cee-Bee Chemical Co., Ltd., followed by being cleaned while being stirred for 2 hours at 50 degrees Celsius. Accordingly, polymer component(s), adhered to a part of the surface of the electroforming body, which was(were) visually confirmed was(were) removed.

Figure 20:
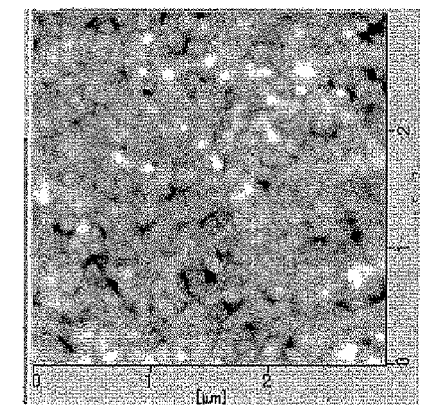
FIG. 20 is a photograph showing an analysis image, in which a result of analysis conducted on a concave and convex surface of a mold formed by the electroforming in Comparative Example 7 by use of the scanning probe microscope is displayed on a display.

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained. Subsequently, a fluorine-based UV curable resin was applied on a PET substrate (COSMOSHINE A-4100 manufactured by Toyobo Co., Ltd.). After the nickel mold was pressed against the fluorine-based UV curable resin, the fluorine-based UV curable resin was cured by irradiation with ultraviolet rays at 600 mJ/cm$^2$ and then the nickel mold was peeled off. Accordingly, a diffraction grating made of the UV curable resin film to which the surface profile of the nickel mold was transferred was obtained. For the concavity and convexity pattern of the diffraction grating, the concavity and convexity shape on the surface was measured by using the atomic force microscope used in Example 1. However, the concavity and convexity shape on the surface was not observed. For reference, the analysis image of the concavity and convexity pattern of the surface of the nickel electroforming body was obtained by performing measurement using the atomic force microscope used in Example 1. Analysis conditions of the atomic force microscope were the same as those in Example 1. The obtained analysis image is shown in FIG. 20. It was found out that the periodic concavity and convexity pattern did not appear at all in FIG. 20.

Comparative Example 8

Toluene was added to 120 mg of the block copolymer 2 and 30 mg of Polyethylene Glycol 4000 manufactured by Tokyo Chemical Industry Co., Ltd. so that the total amount thereof was 10 g, followed by dissolving them. Then, it was filtrated or filtered through a membrane filter having a pore diameter of 0.5 µm to obtain a block copolymer solution. Subsequently, 170 mg of methyltrimethoxysilane (MTMS) and 89 mg of 1,2-bis(trimethoxysilyl)ethane (BTMSE) were added to 4.75 g of methylisobutylketone, followed by being stirred to prepare methylisobutylketone/1,2-bis(trimethoxysilyl)ethane solution. This solution was applied on a glass substrate after cleaning having a thickness of 1.1 mm by a spin coating to obtain a glass substrate with a coating film made of methylisobutylketone/1,2-bis(trimethoxysilyl)ethane. The spin coating was performed at a spin speed of 500 rpm for 10 seconds, and then performed at a spin speed of 800 rpm for 30 seconds.

The glass substrate with the coating film was sintered for 6 hours in a nitrogen atmosphere at a temperature of 280 degrees Celsius to obtain an organo silicate processed glass substrate. The prepared block copolymer solution was applied on the organo silicate processed glass substrate by a spin coating to form a thin film. The spin coating was performed at a spin speed of 500 rpm for 10 seconds, and then performed at a spin speed of 800 rpm for 30 seconds. After the spin coating, the thin film was left at a room temperature for 10 minutes.

Subsequently, the glass substrate with the thin film was subjected to an annealing process for 5 hours in an oven of 160 degrees Celsius (first annealing process). In order to selectively remove PMMA from the obtained thin film by an etching, the glass substrate with the thin film was irradiated with ultraviolet rays at an irradiation intensity of 30 J/cm$^2$ by use of a high pressure mercury lamp. Then, the glass substrate with the thin film was immersed in acetone, and was subjected to cleaning with ion-exchanged water, followed by being dried. By removing PMMA as described above, a concavity and convexity thin film which was substantially made of PS was obtained.

The glass substrate with the thin film was subjected to a heating process for 80 hours in an oven of 95 degrees Celsius which was lower than the glass transition temperature of PS. After the heating process, about 10 nm of a thin nickel layer was formed on the surface of the concavity and convexity thin film by a sputtering. Then, the substrate was subjected to an electroforming process under the same condition as Example 1 in a nickel sulfamate bath to precipitate nickel until the thickness of nickel became 250 µm. The glass substrate with the thin film was mechanically peeled off from the obtained nickel electroforming body. The surface of the nickel electroforming body from which the substrate was peeled off was immersed in Chemisol 2303 manufactured by The Japan Cee-Bee Chemical Co., Ltd., followed by being cleaned while being stirred for 2 hours at 50 degrees Celsius. Thereafter, transfer was performed three times using an acrylic-based UV curable resin. The nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold for which a mold-release treatment had been performed was obtained.

Subsequently, a fluorine-based UV curable resin was applied on a PET substrate (COSMOSHINE A-4100 manufactured by Toyobo Co., Ltd.). Then, the fluorine-based UV curable resin was cured by irradiation with ultraviolet rays at 600 mJ/cm$^2$ while pressing the nickel mold against the fluorine-based UV curable resin. Accordingly, a PET substrate with the resin to which the surface profile of the nickel mold was transferred was obtained. For the PET substrate with the resin obtained as described above, the concavity and convexity shape on the resin surface was analyzed by using the atomic force microscope used in Example 1. However, the shape representing the concavity and convexity on the surface was not observed in the analysis image. For reference, the analysis image of the concavity and convexity pattern of the block copolymer from which PMMA was selectively removed by the etching process and the analysis image of the concavity and convexity pattern of the surface of the nickel electroforming body were each obtained by performing measurement using the atomic force microscope used in Example 1. Analysis conditions of the atomic force microscope were the same as those in Example 1. Respective analysis images are shown in FIGS. 21A and 21B.

Figure 21A:
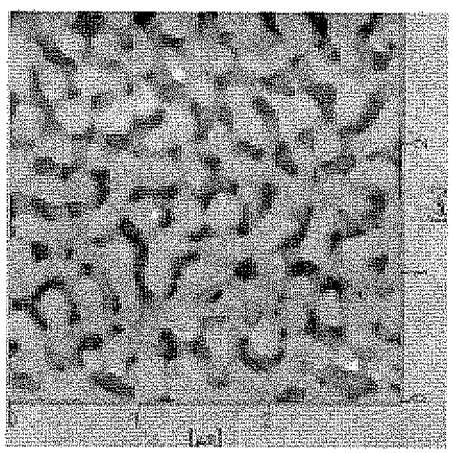
FIG. 21A is a photograph showing an analysis image, in which a result of analysis conducted on a concave and convex surface of a block copolymer from which PMMA has been selectively removed by the etching process in Comparative Example 8 by use of the scanning probe microscope is displayed on a display.
Figure 21B:
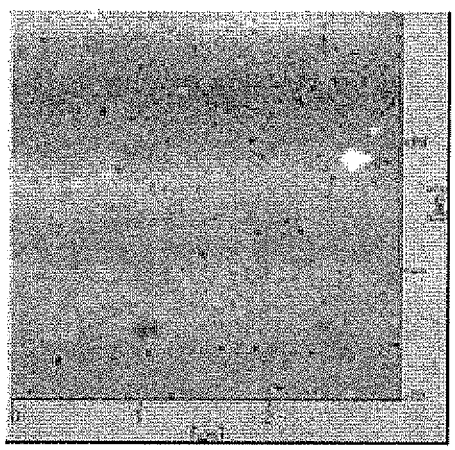
FIG. 21B is a photograph showing an analysis image, in which a result of analysis conducted on a concave and convex surface of a mold formed by the electroforming in Comparative Example 8 by use of the scanning probe microscope is displayed on a display.

It was found out that the periodic concavity and convexity pattern which appeared in FIG. 21A did not appear at all in FIG. 21B. Therefore, it is considered that the concavity and convexity pattern of the block copolymer from which PMMA was selectively removed by the etching process had a cross-section structure which was not suitable for the transfer by the electroforming.

From the results of Examples 1 to 9 and Comparative Examples 1 to 4 and 6 to 8 as described above, it is found out that the concavity and convexity pattern of the thin film in which the micro phase separation was caused was not satisfactorily transferred to the nickel layer, in a case that the nickel layer was deposited by the electroforming without the second annealing process of the thin film for which the etching process was performed. In Comparative Example 5, since the molecular weight of the block copolymer was relatively low (not more than 500,000), the concavity and convexity pattern was transferred to the nickel electroforming body without the second annealing process. However, as understood from Comparative Examples 6 and 7, in a case that the molecular weight of the block copolymer exceeded 500,000, the concavity and convexity pattern could not be transferred to the nickel electroforming body at all without the second annealing process. Therefore, it is found out that, regardless of the molecular weight of the block copolymer, the second annealing process is required to obtain a mold having a desired minute pattern. In particular, in a case that a device such as the diffraction grating to be produced by the mold is used in a wide visible region, a pitch such that diffraction is generated in such a wavelength region is required. Thus, the molecular weight of the block copolymer in which the micro phase separation is caused desirably exceeds 500,000.

As understood from the results of the current efficiency and the power efficiency in Examples 2 and 4, the organic EL element of the present invention has superior light-extraction efficiency. Further, as is apparent from the measurement results of directivity of light emission of the organic EL element in these Examples, the directivity of light emission of the organic EL element of the present invention is sufficiently low.

In the above Example(s), the diffraction grating, of which the average height of the concavities and convexities was within a range from 40 to 110 nm, and the average pitch was within a range from 110 to 480 nm, was obtained. It was confirmed that the satisfactory diffraction was generated, provided that the average height and the average pitch of the concavities and convexities of the diffraction grating were at least within the above ranges. Further, in the above Example(s), the diffraction grating, of which the kurtosis of the concavities and convexities was within a range from −1.2 to 0.729, was obtained. It was found out that, if the kurtosis was at least within the above range, the satisfactory diffracted light was generated and no leak current was generated. Regarding the cross-section shape of the concavity and convexity structure formed in the diffraction grating obtained in the above Example(s), it was found that the average value m and the median M of the depth distribution of the concavities and convexities on the cross-section satisfied the following empiric formula:

$$(1.062m-2.2533)\times 0.95 \leq M \leq (1.062m-2.2533)\times 1.05$$

Example 10

In this example, a nickel mold (nickel substrate), for which a mold-release treatment was performed, was obtained by using a BCP method similar to Example 1. Subsequently, a fluorine-based UV curable resin was applied on a PET substrate (easily-adhesion PET film manufactured by Toyobo Co., Ltd., product name: COSMOSHINE A-4100). Then, the fluorine-based UV curable resin was cured by irradiation with ultraviolet rays at 600 mJ/cm$^2$, with the nickel mold being pressed thereto. After curing of the resin, the nickel mold was peeled off from the cured resin. Accordingly, a diffraction grating mold made of the PET substrate with the resin film to which the surface profile of the nickel mold was transferred was obtained, 2.5 g of tetraethoxysilane (TEOS) and 2.1 g of methyltriethoxysilane (MTES) were added by drops to a mixture of 24.3 g of ethanol, 2.16 g of water, and 0.0094 g of concentrated hydrochloric acid, followed by being stirred for 2 hours at a temperature of 23 degrees Celsius and humidity of 45% to obtain a sol solution. The sol solution was applied on a soda-lime glass plate of 15×15×0.11 cm by a bar coating. Doctor Blade (manufactured by Yoshimitsu Seiki Co., Ltd.) was used as a bar coater. The doctor blade was designed so that the film thickness of the coating film was 5 μm. However, the doctor blade was adjusted so that the film thickness of the coating film was 40 μm by sticking an imide tape having the thickness of 35 μm to the doctor blade. When 60 seconds have elapsed after the application of the sol solution, the diffraction grating mold, made of the PET substrate with the resin film to which the surface profile of the nickel mold was transferred, which was prepared similar to Example 1, was pressed against the coating film on the glass plate by a pressing roll using a method described below.

At first, the surface on which the pattern of the mold has been formed was pressed against the coating film on the glass substrate while rotating the pressing roll of which temperature was 23 degrees Celsius from one end to the other end of the glass substrate. Immediately after completion of the pressing, the substrate was moved on a hot plate and then heated at a temperature of 100 degrees Celsius (pre-sintering). After continuing the heating for 5 minutes, the substrate was removed from the hot plate and the mold was manually peeled off from the substrate from the edge. The mold was peeled off such that an angle (peel angle) of the mold with respect to the substrate was about 30°.

Subsequently, a main sintering was performed by heating the substrate for 60 minutes in an oven of 300 degrees Celsius, and then the pattern transferred to the coating film was evaluated.

For the diffraction grating, the analysis image of the concavity and convexity shape on the resin surface was obtained by using the atomic force microscope used in Example 1. Analysis conditions of the atomic force microscope were the same as those in Example 1.

<Average Height of Concavities and Convexities>

A concavity and convexity analysis image was obtained as described above by performing a measurement in a randomly selected measuring region of 3 μm square (length: 3 μm, width: 3 μm) in the diffraction grating. Distances between randomly selected concave portions and convex portions in the depth direction were measured at 100 points or more in the concavity and convexity analysis image, and the average of the distances was calculated as the average height (depth) of the concavities and convexities. The average height of the concavity and convexity pattern obtained by the analysis image in this example was 56 nm.

<Fourier-Transformed Image>

A concavity and convexity analysis image was obtained by performing a measurement in a randomly selected measuring region of 3 μm square (length: 3 μm, width: 3 μm) in the diffraction grating similar to Example 1. It was confirmed that the Fourier-transformed image showed a circular pattern substantially centered at an origin at which an absolute value of wavenumber was 0 $\mu m^{-1}$, and that the circular pattern was present within a region where the absolute value of wavenumber was within a range of 10 $\mu m^{-1}$ or less.

As a result of the image analysis of the obtained Fourier-transformed image, the wavenumber 2.38 $\mu m^{-1}$ was the most intensive. That is, the average pitch was 420 nm. The average pitch could be obtained as follows. For each of the points of Fourier-transformed image, intensity and distance (unit: $\mu m^{-1}$) from the origin of Fourier-transformed image were obtained. Then, the average value of the intensity was obtained for the points each having the same distance from the origin. As described above, a relation between the distance from the origin of the Fourier-transformed image and the average value of the intensity was plotted, a fitting with a spline function was carried out, and the wavenumber of peak intensity was regarded as the average wavenumber ($\mu m^{-1}$). For the average pitch, it is allowable to make a calculation by another method, for example, a method for obtaining the average pitch of the concavities and convexities as follows. That is, a concavity and convexity analysis image is obtained by performing a measurement in a randomly selected measuring region of 3 μm square (length: 3 μm, width: 3 μm) in the diffraction grating, then the distances between randomly selected adjacent convex portions or between randomly selected adjacent concave portions are measured at 100 points or more in the concavity and convexity analysis image, and then an average of these distances is determined.

<Manufacture of Organic EL Element>

Figure 22:
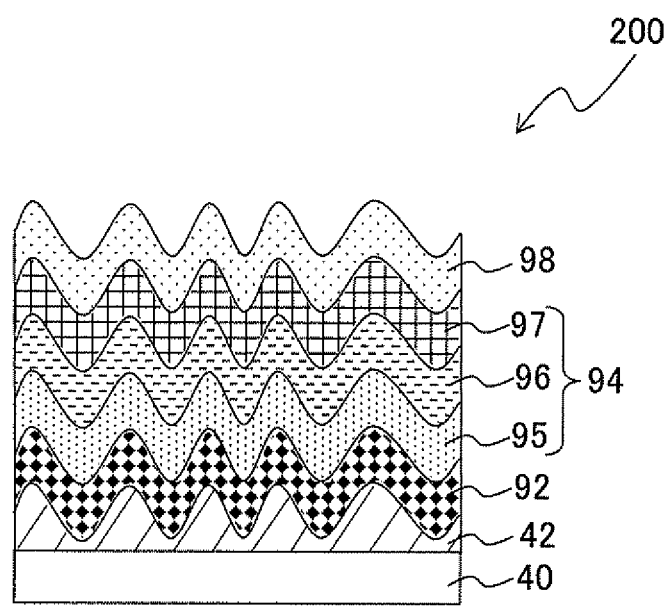
FIG. 22 is a schematic illustration showing a stacked structure of an organic EL element, in which a diffraction grating obtained by the producing method of Example 10 is used.

A glass substrate with a pattern made of a sol-gel material layer as the diffraction grating obtained as described above was cleaned with a brush to remove foreign matter and the like adhered thereto, then organic matter and the like was removed by an alkaline cleaner and an organic solvent. On the substrate cleaned as described above, a film of ITO having the thickness of 120 nm was formed at a temperature of 300 degrees Celsius by a sputtering method. A photoresist was applied and an exposure was performed with an electrode mask pattern, and then an etching was performed by a developer. Accordingly, a transparent electrode having a predetermined pattern was obtained. The obtained transparent electrode was cleaned with a brush, and organic matter and the like was removed by an alkaline cleaner and an organic solvent. Then, transparent electrode was subjected to a UV-ozone process. On the transparent electrode processed as described above, a hole transporting layer (4,4',4" tris(9-carbazole)triphenylamine, thickness: 35 nm), a light emitting layer (tris(2-phenylpyridinato)iridium(III) complex-doped 4,4',4"tris(9-carbazole)triphenylamine, thickness: 15 nm; tris (2-phenylpyridinato)iridium(III) complex-doped 1,3,5-tris (N-phenylbenzimidazole-2-yl)benzene, thickness: 15 nm), an electron transporting layer (1,3,5-tris(N-phenylbenzimidazole-2-yl)benzene, thickness: 65 nm), and a lithium fluoride layer (thickness: 1.5 nm) were each stacked by a vapor deposition method, and further a metal electrode (aluminum, thickness: 50 nm) was formed by the vapor deposition method. Accordingly, as shown in FIG. 22, the organic EL element 200, which has a coating film (sol-gel material layer) 42, a transparent electrode 92, an organic layer 94 (a hole transporting layer 95, a light-emitting layer 96, and an electron transporting layer 97), and a metal electrode 98 on a substrate 40 in this order, was obtained.

In the process as described above, the substrate was formed of the sol-gel material and had the superior mechanical strength. Thus, even when the cleaning with the brush was performed for the substrate and the surface of the concavity and convexity pattern after formation of the transparent electrode as described above, damage, adhesion of the foreign matter, projection on the transparent electrode and the like were less likely to occur, and thereby element failure therefrom could be suppressed. Therefore, the obtained organic EL element was superior, as compared with a case in which a curable resin substrate was used, in terms of the mechanical strength of the substrate having the concavity and convexity pattern. Further, the substrate made of the sol-gel material produced in accordance with the method of this example had satisfactory chemical resistance, and had alkali resistance superior to the substrate formed of a curable resin material. Therefore, the substrate of this example had a certain corrosion resistance to alkaline fluid and the organic solvent used for the cleaning step of the substrate and the transparent electrode, and thus it is possible to use various cleaning liquids. Further, an alkaline developer is used at the time of the patterning of the transparent substrate in some cases. The substrate in this example also has the corrosion resistance to such a developer. In this respect, the substrate in this example has an advantage over the curable resin substrate having generally low resistance in the alkaline fluid. Further, the substrate formed of the sol-gel material has superior UV resistance and superior weather resistance as compared with the curable resin substrate. Therefore, the substrate in this example also has resistance to a UV-ozone cleaning process after the formation of the transparent electrode. Further, in a case that the organic EL element produced by the method of this example is used outside or outdoors, it is possible to suppress deterioration due to sunlight as compared with the case in which the curable resin substrate is used.

<Evaluation of Light Emission Efficiency of Organic EL Element>

A light emission efficiency of the organic EL element obtained in this example was measured by the following method. That is, a voltage was applied to the obtained organic EL element, and then the applied voltage V and a current I flowing through the organic EL element were measured with a source measurement instrument (manufactured by ADC CORPORATION, R6244), and a total luminous flux amount L was measured with a total flux measurement apparatus manufactured by Spectra Co-op. From the thus obtained measured value of the applied voltage V, the current I, and the total luminous flux amount L, a luminance value L' was calculated. Here, for the current efficiency, the following calculation formula (F1) was used:

$$\text{Current efficiency} = (L'/I) \times S \tag{F1}$$

and, for the power efficiency, the following calculation formula (F2) was used:

$$\text{Power efficiency} = (L'/I/V) \times S \tag{F2}$$

Accordingly, the current efficiency and the power efficiency of the organic EL element were calculated. In the above formulae, S is a light-emitting or luminescent area of the element. Noted that the value of the luminance 12 was calculated on the assumption that light distribution characteristic of the organic EL element followed Lambert's law, and the following calculation formula (F3) was used:

$$L' = L/\pi/S \tag{F3}$$

The current efficiency of the organic EL element of this example at a luminance of 1000 ed/m² was about 1.4 times that of the organic EL element having no concavity and convexity on the glass substrate. Further, the current efficiency of the organic EL element of this example at the luminance of 1000 cd/m² was about 1.6 times that of the organic EL element having no concavity and convexity on the glass substrate. Therefore, the organic EL element of the present invention had a sufficient external extraction efficiency.

<Evaluation of Light Emission Directivity of Organic EL Element>

The directivity of light emission of the organic EL element obtained in this example was evaluated by the following method. That is, the organic EL element in a luminescent state was visually observed in all the directions (directions of all around) 360°). Neither particularly bright sites nor particularly dark sites were observed when the organic EL element obtained in Example 3 was observed in any of the directions of all around 360°, and the brightness was uniform in all the directions. In this way, it was shown that the directivity of light emission of the organic EL element of the present invention was sufficiently low.

As described above, a temperature at the time of forming the film of the transparent electrode (ITO) of the organic EL element in this example was 300 degrees Celsius. It is allowable that the temperature at the time of forming the film of the transparent electrode is lower than 300 degrees Celsius, but the transparent electrode is desired to have low resistivity and the film formation is preferably performed at a high temperature to increase crystallinity. In a case that the temperature during the film formation is low (about 100 degrees Celsius), an ITO film formed on the substrate is relatively amorphous, has inferior specific resistance, has inferior adhesion property between the substrate and the ITO thin film. Although the concavity and convexity pattern formed of a general UV curable resin and the like had difficulty in withstanding a film formation step at a high temperature, the concavity and convexity pattern can be applied even in the film formation step at the high temperature by using the sol-gel material which is an example of ceramic. Therefore, the method in this example is also suitable for producing the substrate (diffraction grating) for the organic EL element.

According to the present invention, it is possible to produce a mold for nanoimprint, which is suitable for manufacturing a diffraction grating used for a device such as an organic EL element and has excellent mass producibility, easily and with high accuracy. The diffraction grating obtained by using this mold and the organic EL in which the diffracting grating is used have low light directivity and superior light-extraction efficiency.

What is claimed is:

1. A method for producing a mold for minute pattern transfer, comprising:
    a step of applying a block copolymer solution made of at least a first polymer and a second polymer on a surface of a base member;
    a step of drying a coating film on the base member;
    a first heating step for heating the coating film after the drying at a temperature higher than a glass transition temperature of a block copolymer of the block copolymer solution;
    an etching step for etching the coating film after the first heating step to remove the second polymer so that a concavity and convexity structure is formed on the base member;
    a second heating step for heating the concavity and convexity structure at a temperature higher than a glass transition temperature of the first polymer;
    a step of forming a seed layer on the concavity and convexity structure after the second heating step;
    a step of or stacking a metal layer on the seed layer by an electroforming; and
    a step of peeling off the base member having the concavity and convexity structure from the metal layer and the seed layer.

2. The method for producing the mold according to claim 1, wherein a micro phase separation structure of the block copolymer is generated during the drying step or the first heating step.

3. The method for producing the mold according to claim 2, wherein the micro phase separation structure has a lamellar form.

4. The method for producing the mold according to claim 1, wherein the concavity and convexity structure is heated, for 10 minutes to 100 hours, at a temperature ranging from the glass transition temperature of the first polymer to a temperature higher than the glass transition temperature of the first polymer by 70 degrees Celsius, during the second heating step.

5. The method for producing the mold according to claim 1, wherein the concavity and convexity structure is deformed to have a chevron-shaped structure by the second heating step.

6. The method for producing the mold according to claim 1, wherein a number average molecular weight (Mn) of the block copolymer is 500,000 or more.

7. The method for producing the mold according to claim 1, wherein a molecular weight distribution (Mw/Mn) of the block copolymer is 1.5 or less.

8. The method for producing the mold according to claim 1, wherein a volume ratio between the first polymer and the second polymer in the block copolymer is 3:7 to 7:3, and that a difference between solubility parameters of the first polymer and second polymer is 0.1 to 10 $(cal/cm^3)^{1/2}$.

9. The method for producing the mold according to claim 1, wherein the first polymer forming the block copolymer is polystyrene and the second polymer forming the block copolymer is polymethyl methacrylate.

10. The method for producing the mold according to claim 1, wherein polyalkylene oxide is contained in the block copolymer solution as a different homopolymer.

11. The method for producing the mold according to claim 1, wherein the seed layer is formed by one of a non-electrolytic plating method, a sputtering method, and a vapor deposition method.

12. The method for producing the mold according to claim 1, further comprising cleaning the mold obtained by peeling off the base member having the concavity and convexity structure from the metal layer and the seed layer; and performing a mold-release treatment on a surface of the mold.

13. A method for producing a diffraction grating, comprising:
pressing the mold obtained by the method for producing the mold as defined in claim 1 to a transparent substrate to which a curable resin has been applied;
curing the curable resin; and
detaching the mold from the transparent substrate to obtain a structure having a concavity and convexity structure on the transparent substrate.

14. The method for producing the diffraction grating according to claim 13, wherein the structure is the diffraction grating.

15. The method for producing the diffraction grating according to claim 13, further comprising:
pressing the structure to a substrate to which a sol-gel material has been applied;
curing the sol-gel material; and
detaching the structure from the substrate to obtain the diffraction grating having a concavity and convexity structure made of the sol-gel material.

16. A method for producing an organic EL element, wherein a transparent electrode, an organic layer, a metal electrode are stacked in this order on the concavity and convexity structure of the diffraction grating produced by the method for producing the diffraction grating as defined in claim 13, thereby producing the organic EL element.

17. A method for producing an organic EL element, wherein a transparent electrode, an organic layer, a metal electrode is stacked in this order on the concavity and convexity structure of the diffraction grating produced by the method for producing the diffraction grating as defined in claim 15, thereby producing the organic EL element.

* * * * *